US011367485B2

(12) United States Patent
Alrod et al.

(10) Patent No.: US 11,367,485 B2
(45) Date of Patent: Jun. 21, 2022

(54) CAM STORAGE SCHEMES AND CAM READ OPERATIONS FOR DETECTING MATCHING KEYS WITH BIT ERRORS

(71) Applicant: Western Digital Technologies, Inc., San Jose, CA (US)

(72) Inventors: Idan Alrod, Herzeliya (IL); Eran Sharon, Rishon Lezion (IL); Alon Marcu, Tel-Mond (IL); Yan Li, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/036,889

(22) Filed: Sep. 29, 2020

(65) Prior Publication Data

US 2021/0027838 A1 Jan. 28, 2021

Related U.S. Application Data

(62) Division of application No. 16/390,370, filed on Apr. 22, 2019, now Pat. No. 10,910,057.

(51) Int. Cl.
*G11C 15/04* (2006.01)
*G11C 8/08* (2006.01)
(Continued)

(52) U.S. Cl.
CPC ...... *G11C 15/046* (2013.01); *G06F 16/90339* (2019.01); *G11C 8/08* (2013.01);
(Continued)

(58) Field of Classification Search
CPC ... G11C 15/046; G11C 16/0483; G11C 16/26; G11C 16/3422
See application file for complete search history.

(56) References Cited

U.S. PATENT DOCUMENTS 7,355,890 B1 4/2008 Wen
7,436,715 B2 * 10/2008 Kato .................. G11C 16/0416
365/185.2

(Continued)

FOREIGN PATENT DOCUMENTS

KR 1020130018602 A 2/2013

OTHER PUBLICATIONS

International Search Report and Written Opinion, PCT/US2019/067478, dated Nov. 4, 2021.

*Primary Examiner* — Vanthu T Nguyen
(74) *Attorney, Agent, or Firm* — Dickinson Wright PLLC; Steven C. Hurles

(57) ABSTRACT

A memory array includes strings that are configured to store keywords and inverse keywords corresponding to keys according to content addressable memory (CAM) storages schemes. A read circuit performs a CAM read operation over a plurality of iterations to determine which of the keywords are matching keywords that match a target keyword. During the iterations, a read controller biases word lines according to a plurality of modified word line bias setting that are each modified from an initial word line bias setting corresponding to the target keyword. At the end of the CAM read operation, the read controller detects which of the keywords are matching keywords, even if the strings are storing the keywords or inverse keywords with up a certain number of bit errors.

5 Claims, 19 Drawing Sheets

(51) Int. Cl.
  *G11C 16/08*         (2006.01)
  *G06F 16/903*        (2019.01)
  *G11C 16/04*         (2006.01)
  *G11C 16/34*         (2006.01)
  *G11C 16/26*         (2006.01)

(52) U.S. Cl.
  CPC .......... *G11C 16/0483* (2013.01); *G11C 16/08* (2013.01); *G11C 16/26* (2013.01); *G11C 16/3422* (2013.01)

(56) References Cited

U.S. PATENT DOCUMENTS

| | | |
|---|---|---|
| 8,107,295 B2 | 1/2012 | Lee |
| 8,634,247 B1 | 1/2014 | Sprouse et al. |
| 8,780,634 B2 | 7/2014 | Li et al. |
| 2008/0037358 A1 | 2/2008 | Yabuuchi et al. |
| 2014/0136762 A1 | 5/2014 | Li et al. |
| 2015/0194213 A1 | 7/2015 | Cheriton |
| 2017/0125103 A1 | 5/2017 | Wong |

\* cited by examiner

CAM STORAGE SCHEMES AND CAM READ OPERATIONS FOR DETECTING MATCHING KEYS WITH BIT ERRORS

CROSS-REFERENCE TO RELATED APPLICATION

This Divisional application claims priority to and the benefit of U.S. Non-Provisional application Ser. No. 16/390,370, filed on Apr. 22, 2017, entitled "CAM STORAGE SCHEMES AND CAM READ OPERATIONS FOR DETECTING MATCHING KEYS WITH BIT ERRORS", the contents of which are herein incorporated by reference.

BACKGROUND

Some types of memory systems store data in accordance with content addressable memory (CAM) schemes, in which data is stored as key-record pairs. Such a memory system may include a first part of memory that stores keys and a second part of memory that stores records. A key may identify a plurality of attributes of an associated record, and may also indicate where the associated record is stored in the memory system. In operation, a host device may want to find out which of the records that the memory system is storing has a certain one or more attributes. To find out, the host device sends the memory system a target key that identifies the certain attributes. Upon receipt of the target key, the memory system performs a CAM read operation, in which the memory system searches the first part of the memory storing the keys to determine if any of the keys match the target key. Upon determining which of the keys match, the memory system retrieves the records associated with the matching keys and returns them to the host device.

Due to inherent limitations, memory systems store keys with errors. While error rates are low, errors still do exist. As a consequence of the errors, memory systems may fail to detect matching keys, resulting in a failure of the memory system to return records to the host device that the host device would otherwise want to receive. As such, new CAM storage schemes and associated CAM read operations that enable a memory system to detect matching keys, despite the keys being stored with errors, may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1A:
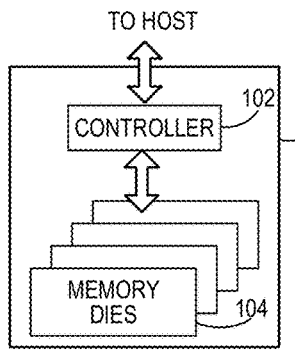
FIG. 1A is a block diagram of an example memory system.

The following embodiments describe apparatuses, devices, systems, circuits, and methods for storing keys as keywords (keys with associated sets of parity bits), and for performing associated content addressable memory (CAM) read operations to determine matching keys, in accordance with CAM storage schemes. By storing the keys as keywords, the memory system may leverage the parity bits of the keywords to determine matching keywords, and in turn matching keys, even though memory cells storing the keywords may be storing them with one or more bit errors. The memory system may leverage the parity bits during the sense or read operations performed on the memory dies to determine the matching keywords, rather than just use the parity bits during post-read error detection and correction processes. Adding the parity bits to the keys to form keywords, in turn, reduces or minimizes the number of no detections or missed detections—i.e., the number of times the memory system fails to detect that a key is a matching key because it is stored with bit errors.

In various embodiments, the memory system may further store inverse keywords along with the keywords, such that the keyword and the inverse keyword each have an associated set of parity bits. Under at least some CAM storage schemes, both a key and an inverted version of the key (i.e., an inverse key) are stored in the memory cells in order to accurately detect matching keys. Accordingly, by storing both keywords and inverted versions of the keywords (i.e., inverse keywords), the memory system can leverage the parity bits of both the keywords and the inverse keywords to determine matching keywords, even if the memory cells are storing the keywords and/or the inverse keywords with one or more bit errors. In contrast, if parity bits are only generated for the key and not the inverse key, such as if the parity bits are only generated for a post-read error detection and correction for the key that is sensed out of the memory die, the memory system may not optimally detect matching keywords during the sense operations in the event that the inverse key is stored with one or more bit errors.

To detect matching keywords that match a target keyword, a read circuit is configured to perform a CAM read operation. The read circuit includes a plurality of sense circuits, coupled to the strings of memory cells by way of bit lines, that perform sense operations to determine whether their associated strings and/or bit lines conduct. During a sense operation, a read controller biases word lines coupled to the strings according to a word line bias setting that indicates the word line voltage levels applied to the word lines. Depending on the bias setting and the states of the memory cells, the bit line may or may not conduct. If a bit line conducts, a sense circuit coupled to the bit line generates a sense result to indicate that a string coupled to the bit line is storing a matching keyword.

The read circuit may perform a CAM read operation by performing a plurality of sense operations for a set memory cells storing a keyword. During the sense operations, the read circuit biases a word line group coupled to at least a portion of the memory cells storing at least a portion of the keyword according to a plurality of modified word line bias settings. In general, a word line bias setting indicates the word line bias levels for biasing a group of word lines. Each bias level may be mapped to one of the word lines of the group. A modified word line bias setting as used herein may be modified from a target word line bias setting that corresponds to a target keyword. In addition, how a modified word line bias setting is modified may be based on or dependent on a bit error amount associated with storage of the keyword, such as a maximum number of bit errors up to which the keyword or a portion of the keyword may be stored and still be detected as a matching keyword without the detection being an error. In particular, the bit error number may indicate a number of word lines that have their voltage levels changed in comparison to the target word line bias setting. For example, if the bit error number is one, then a given modified word line bias setting may change the voltage level for one of the word lines biased according to the modified word line bias setting. The read circuit may determine a plurality of sense results for the plurality of sense operations, and determine whether the keyword is a matching keyword based on the plurality of sense results.

In some embodiments, the read circuit performs a CAM read operation by performing sets of sense operations, with each set performed for memory cells storing at least a portion of a keyword or for memory cells storing at least a portion of an inverse keyword, and/or for word line groups coupled to the first and second sets of memory cells. During a set of sense operations for a particular portion and/or word line group, the read controller biases the word line group according to a plurality of associated modified word line bias settings. For example, the read circuit performs a first set of sense operations for a first portion of the memory cells storing at least a portion of the keyword and a second set of sense operations for a second portion of the memory cells storing at least a portion of the inverse keyword. When performing the first set of sense operations, the read controller biases a first word line group coupled to the first portion according to a first set of modified word line bias settings. When performing the second set of sense operations, the read controller biases a second word line group coupled to the second portion according to a second set of modified word line bias settings. The read circuit determines sense results for the sets of sense operations, and then determines if the keyword matches a target keyword based on these sense results.

The read circuit may iterate through a set of sense operations for an associated word line group and/or associated portion over a plurality of iterations. During each iteration, the read controller biases the word line group according to one of the modified word line bias settings.

The read circuit may perform the CAM read operation with a plurality of sets of sense operations and different word line bias settings in order to detect matching keywords even if memory cells are storing the matching keywords or associated inverse keyword with a certain predetermined number of bit errors. This is because application of the different word line bias settings during multiple sense operations of a set may cause the bit line to conduct during at least one of the multiple sense operations, indicating a matching keyword.

In addition, the keyword and inverse keywords may be generated with a sufficiently high number of parity bits to cause any two different keywords or inverse keywords to be sufficiently different from each other even if both are stored with up to the predetermined number of bit errors. As a result, the parity bits may prevent bit lines coupled to memory cells that are not storing matching keywords from conducting when the different bias settings are applied during a set of sense operations. This, in turn, will prevent the read controller from erroneously detecting that a keyword is a matching keyword when in fact it is not.

Accordingly, in various embodiments described herein, the memory system may employ a CAM storage scheme under which both keywords and inverse keywords with associated sets of parity bits are stored in the memory. The storage of the keywords and inverse keywords with the parity bits, along with performance of the multiple sense operations with modified word line biasing, allow matching keywords to be detected despite those keywords being stored with a certain number of bit errors, while preventing non-matching keys from being erroneously detected as matching.

In addition, the inclusion of the parity bits to form the keywords and inverse keywords may eliminate, or at least reduce, the need to store an additional copy of a key and/or its inverse key. Such additional copies may be stored in extra memory cells coupled to extra bit lines in order to enhance redundancy and guard against bit errors. For these configurations, the extra memory cells and bit lines may be subject to sense operations, the results of which are used to detect which keys are matching. In contrast, inclusion of parity bits to form the keywords and the inverse keywords may allow a keyword and an inverse keyword to be stored in memory cells coupled to a single bit line, while avoiding a need to store an extra copy of a key and/or an inverse key to optimize for redundancy. This in turn may allow for a greater number of keys to be stored in a given storage area.

In addition, the CAM read operations described herein leverage the parallelism according to which keywords can be stored in strings, and according to which sense circuits can concurrently perform sense operations. That is, for at least current memory technology (in particular NAND technology), the number of bit lines coupled to strings that can concurrently conduct during a single sense operation is in the hundreds of thousands, meaning that during a single sense operation, with word lines biased according to a particular word line bias setting, the sense circuits can concurrently determine hundreds of thousands of sense results, each for a string storing a key. Although the CAM read operations described herein increase the number of sense operations from a single sense operation to a plurality of sense operations, the number of sense operations is still substantially lower than the hundreds of thousands of strings and keys that can be concurrently analyzed (i.e., analyzed in parallel). As such, from a performance perspective, the ability to analyze hundreds of thousands of strings for matching keys in parallel while reducing the number of missed detections, outweighs the extra time and power consumption consumed by performing additional sense operations.

In addition, some embodiments of the memory system store keywords and inverse keywords as keyword portions and inverse keyword portions. That is, each keyword includes a plurality of keyword portions, and each inverse keyword includes a plurality of inverse keyword portions. In general, a bit length of a keyword portion is smaller than a bit length of a keyword.

The read circuit may perform CAM read operations in a same or similar way as previously described when storing keyword and inverse keyword portions. However, each word line group and/or set of memory cells may correspond to one of the keyword or inverse keyword portions, rather than to the whole keyword or the whole inverse keyword. In turn, the number of sense operations performed in a CAM read operation may be larger in proportion to the larger number of keyword and inverse keyword portions.

Storing keywords and inverse keywords as portions may be advantageous since doing so may minimize a total number of sense operations performed and/or a number of parity bits generated without increasing the risk of missed detections. This may be because an average number of bit errors per set of memory cells storing a keyword portion is lower than an average number of bit errors per set of memory cells storing a keyword. In other words, it is less likely that a first set of memory cells storing a keyword portion is storing that keyword portion with a t-number of bit errors than it is for a second set of memory cells storing a keyword to be storing that keyword with the t-number of bit errors. Accordingly, by storing keywords and inverse keywords as a plurality of keyword portions and a plurality of inverse keyword portions, a t maximum number of bit errors for which a number of parity bits are generated may be minimized, which in turn may minimize the number of parity bits that are generated and/or the number of sense operations that are performed, without increasing the risk of missed detections.

In one embodiment, a circuit includes a controller configured to: generate a keyword for a key to be stored in a memory array according to a content addressable memory (CAM) storage scheme, the keyword comprising a plurality of information bits of the key and a plurality of parity bits determined from the plurality of information bits; generate an inverse keyword based on the keyword; and program the keyword and the inverse keyword according to the CAM storage scheme.

In some embodiments, the controller is further configured to: bias a plurality of word lines coupled to the memory array according to a plurality of modified word line bias settings, each modified from an initial word line bias setting that corresponds to a target keyword or an inverse target keyword and based on a bit error number associated with storage of the keyword; and determine that the keyword matches the target keyword in response to the bias.

In some embodiments, the controller is configured to bias a word line of the plurality of word lines at a low voltage level according to the initial word line bias setting, and is configured to bias the word line at the high voltage level according to a modified word line bias setting.

In some embodiments, the controller is further configured to: program a plurality of keywords into the memory array, wherein any two different keywords of the plurality of keywords has a minimum distance of 2*t+1, wherein t is a maximum number of bit errors with which the memory array stores each of the two different keywords.

In some embodiments, a sense circuit is configured to determine a plurality of sense results of a plurality of sense operations for a set of memory cells coupled to the plurality of word lines during the bias of the plurality of word lines according to the plurality of modified bias settings; and OR logic circuitry is configured to perform an OR logic operation to generate a combined sense result based on the plurality of sense results, wherein the controller is configured to determine that the keyword matches a target keyword based on the combined sense result.

In some embodiments, the sense circuit is configured to determine a second plurality of sense results of a second plurality of sense operations for a second set of memory cells storing at least a portion of the inverse keyword, the OR logic circuitry is configured generate a second combined sense result based on the second plurality of sense results, AND logic circuitry is configured to perform an AND logic operation on the first combined sense result and the second combined sense result to generate a final sense result, and the controller is configured to determine that the keyword matches the target keyword further based on the final sense result.

In some embodiments, the keyword includes a plurality of keyword portions, and the controller, in order to generate the plurality of keyword portions, is configured to: divide the key into a plurality of key portions; and generate a respective set of parity bits for each of the key portions.

In some embodiments, the controller, in order to generate the inverse keyword, is configured to generate a respective inverse keyword portion for each of the keyword portions.

In some embodiments, the controller is further configured to: program a plurality of keywords into the memory array, wherein each of the plurality of keywords comprises an associated plurality of keyword portions, and wherein any two different keyword portions has a minimum distance of 2*t+1, where t is a maximum number of bit errors with which the memory array stores each of the two different keyword portions.

In another embodiment, a circuit includes a memory array and a read controller. The memory array includes a plurality of strings of memory cells configured to store a plurality of keywords according to a content addressable memory (CAM) storage scheme. The read controller is configured to: bias a word line group coupled to a set of memory cells according to a plurality of modified word line bias settings during a set of sense operations, where the set of memory cells stores at least a portion of a keyword, and each of the plurality of modified word line bias settings is modified from a target word line bias setting corresponding to a target keyword based on a bit error number associated with storage of the keyword. The read controller is further configured to determine that the keyword matches the target keyword based on a set of sense results identified from the set of sense operations.

In some embodiments, the read controller is further configured to: bias a second word line group coupled to a second set of memory cells according to a second plurality of modified word line bias settings during a second set of sense operations, where the second set of memory cells stores at least a portion of an inverse keyword, and each of the second plurality of modified bias settings is modified from an inverse target word line bias setting corresponding to an inverse target keyword based on the bit error number, and determine that the keyword matches the target keyword based further on a second set of sense results identified from the second set of sense operations.

In some embodiments, the read controller, in order to bias the first word line group, is further configured to: increase a different one or more of a plurality of word line voltages from a low voltage level to a high voltage level for the first set of sense operations based on the bit error number, the low voltage level is configured to cause memory cells in an erased state to conduct but not in a program state, and the high voltage level is configured to cause memory cells in both the erased state and the program state to conduct.

In some embodiments, the bit error number is a maximum number of bit errors with which the plurality strings stores each of the plurality of keywords.

In some embodiments, the memory array is configured to store the keyword as a plurality of keyword portions, where the set of memory cells stores one of the keyword portions.

In some embodiments, a keyword portion generation circuit is configured to generate a plurality of keyword portions such that any two different keyword portions of the plurality of keyword portions has a minimum distance of 2*t+1, wherein t is a maximum number of bit errors with which the memory array stores each of the two different keyword portions.

In some embodiments, the read controller is further configured to: increase a low voltage level applied to the word line group during a CAM read operation, and determine that the keyword matches the target keyword based on the increase of the low voltage level.

In some embodiments, a sense circuit is configured to determine a plurality of sense results over a plurality of iterations, and the read controller is configured to: bias the word line group at a plurality of low voltage levels and at a high voltage level over the plurality of iterations, where a first low voltage level of the plurality of low voltage levels is a read pulse level associated with a program state of a single level cell storage scheme, a second low voltage level is a first predetermined amount above the read pulse level, and a third low voltage level is a second predetermined amount below the read pulse level, and where the read controller is further configured to determine that the keyword matches the target keyword based on the plurality of sense results.

In another embodiment, a system includes: a block that includes a plurality of strings of memory cells; a program circuit configured to program a plurality of keywords in the plurality of strings according to a content addressable memory (CAM) storage scheme; and a read circuit configured to: bias a plurality of word lines coupled to the plurality of strings according to an initial word line bias setting that corresponds to a target keyword; in response to the bias according to the initial word line bias setting, determine that a number of matching keywords is below a threshold level; in response to the determination, iterate through a plurality of sense operations for the plurality of strings, wherein for each of the sense operations, the read controller is configured to bias the plurality of word lines according to one of a plurality of modified word line bias settings; and determine one or more matching key words from among the plurality of keywords that match the target keyword in response to the iteration through the plurality of sense operations.

In some embodiments, the program circuit is configured to program the plurality of keywords as a plurality of keyword portions.

In some embodiments, each of the plurality of modified word line bias settings maps a different word line, or a different combination of word lines, to a different voltage level than a voltage level to which the different word line, or the different combination of word lines, is mapped in the initial word line bias setting.

In another embodiment, the data is written in single-level cell (SLC) fashion with parity bits as a codeword (CW) enabling minimum distance of three between two valid values of the key and then the inverse CW is also programmed to a set of 'n' cells corresponding to the same bit line. Then 'n' sense operations are performed while in each sense one cell that was sensed as '1' is sensed as '0' as to overcome a scenario in which a bit was in error and the cell was read as intentionally programmed. Since the minimum distance is three if a single error was observed in the CW (plus the inverse CW) then the bit line will conduct, otherwise it would not.

Other embodiments are possible, and each of the embodiments can be used alone or together in combination. Accordingly, various embodiments will now be described with reference to the attached drawings.

FIG. 1A is a block diagram illustrating a memory system 100. The memory system 100 may include a controller 102 and memory that may include or be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure the it is operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s)s 104, even if a single channel is shown in the drawings.

Figure 1B:
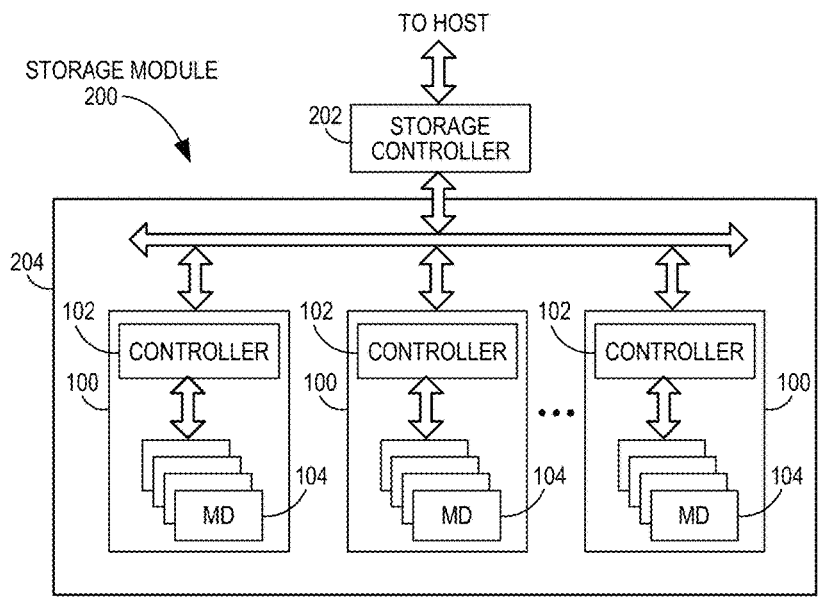
FIG. 1B is a block diagram of an example storage module that includes a plurality of memory systems.

FIG. 1B illustrates a storage module 200 that includes a plurality of non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMedia Card (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
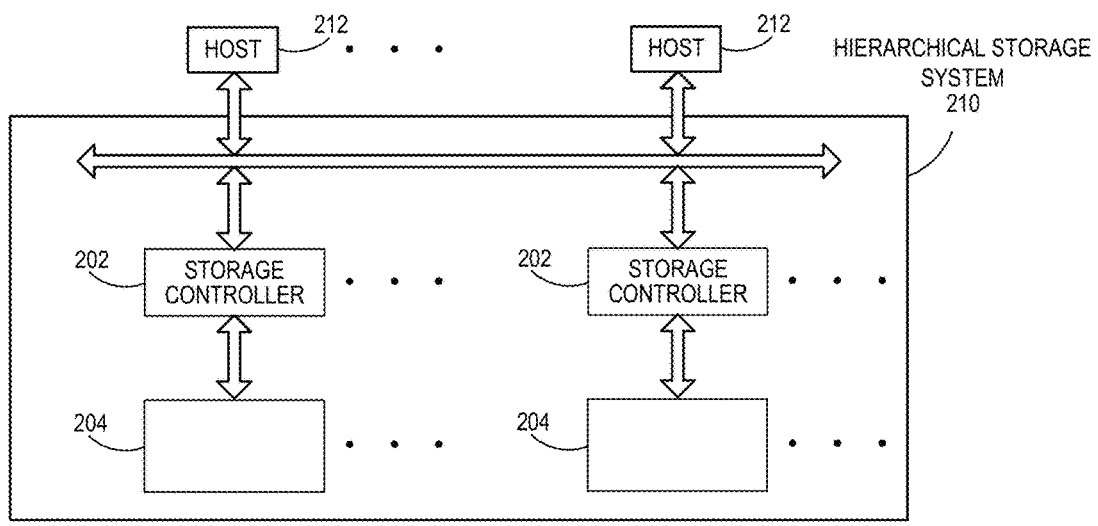
FIG. 1C is a block diagram of an example hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
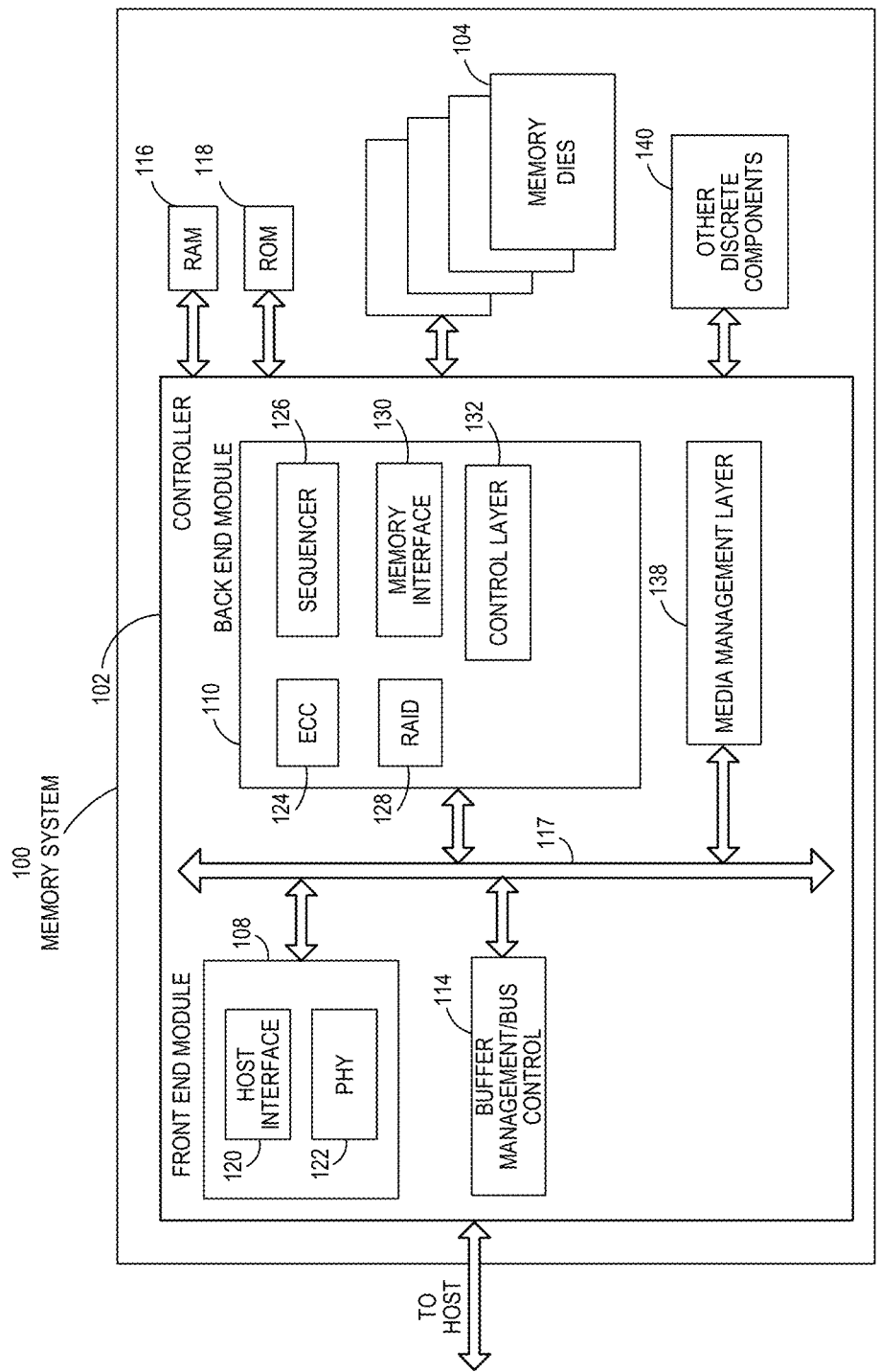
FIG. 2A is a block diagram of an example configuration of components of a controller of the memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138 that performs certain memory management functions such as wear leveling of memory cells of the memory dies 104, address management, and facilitates folding operations. Other memory management functions may be possible. The non-volatile memory system 100 may also include other discrete components 140, such as external electrical interfaces, external RAM, resistors, capacitors, or other components that may interface with the controller 102. In alternative embodiments, one or more of the RAID module 128, media management layer 138 and buffer management/bus controller 114 are optional components that may not be necessary in the controller 102.

Figure 2B:
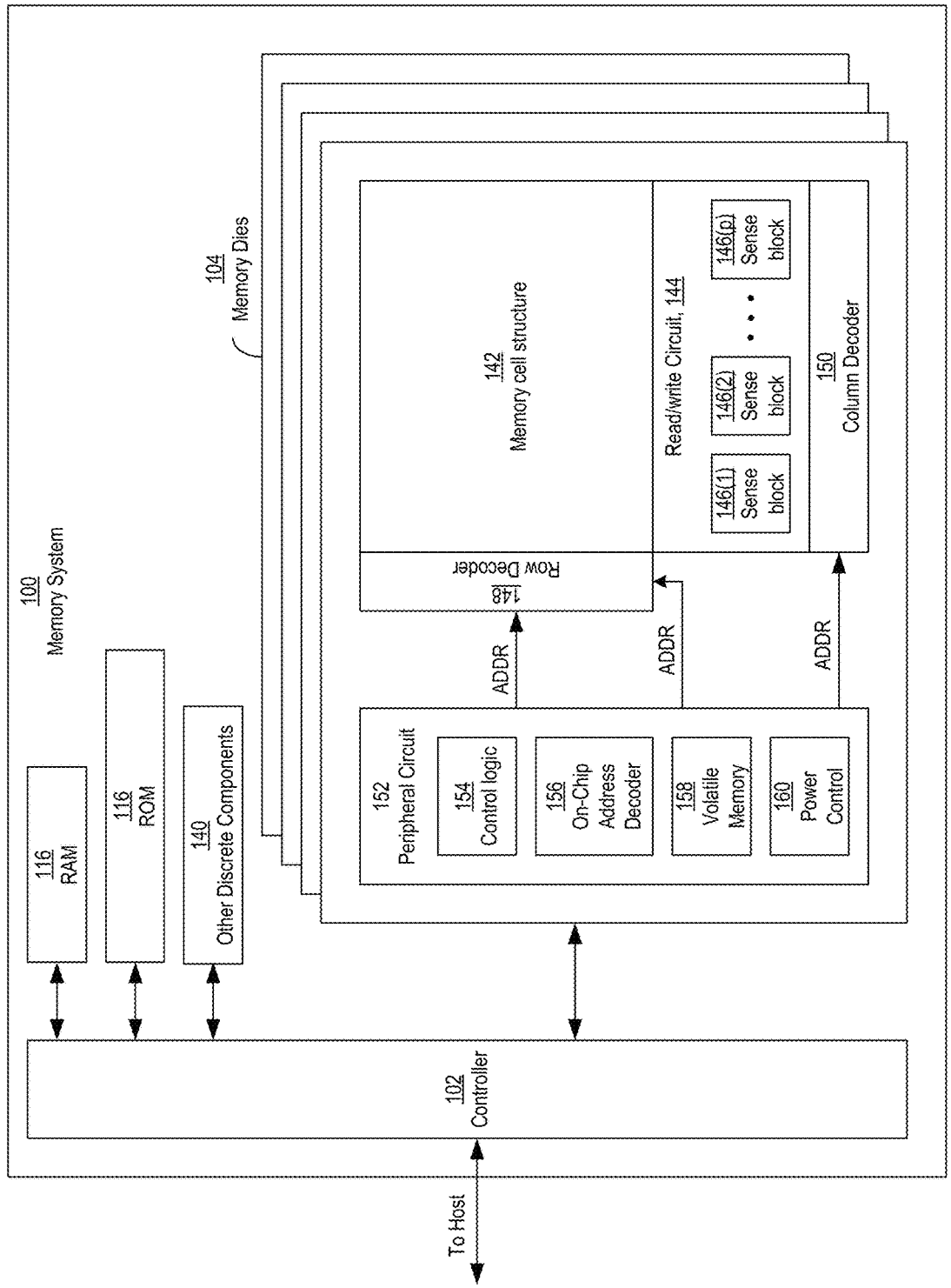
FIG. 2B is a block diagram of an example configuration of components of a memory die of the memory system of FIG. 1A.

FIG. 2B is a block diagram of an example configuration of components of a memory die 104 in more detail. The memory die 104 may include a memory cell structure 142 that includes a plurality of memory cells, otherwise or interchangeably referred to as memory elements. A memory cell is an element or component that stores a unit of data having an n-bit data value, where n is one or more. Any suitable type of memory can be used for the memory cells of the memory cell structure 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 142 of a memory die may be located within and/or over a substrate. The substrate may be a wafer over or in which the layer of the memory cells are formed or it may be a carrier substrate which is attached to the memory cells after they are formed. As a non-limiting example, the substrate may include a semiconductor and/or be made of a semiconductor material, such as silicon.

In addition, a plurality of memory cells that form the entire memory cell structure 142 or at least a portion of the memory cell structure 142, may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two-dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the z direction) with each column having multiple memory cells in each column. The columns may be arranged in a two dimensional configuration, e.g., in an x-y plane, resulting in a three-dimensional arrangement of memory cells, with the memory cells on multiple vertically stacked memory planes. Other configurations of memory cells in three dimensions can also constitute a three dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

Figure 3A:
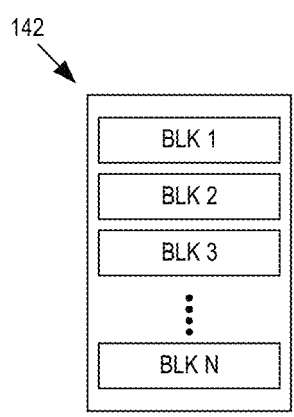
FIG. 3A is a block diagram of a memory cell structure organized into blocks.

Referring to FIG. 3A, the memory cells of a memory cell structure 142 located on a single memory die 104 may be organized into N-number of blocks, extending from a first block BLK 1 to an Nth block BLK N. A block is a minimum unit of erase of a memory die 104. Memory cells that are part of the same block are erased at the same time and/or as part of a same erase operation.

Figure 3B:
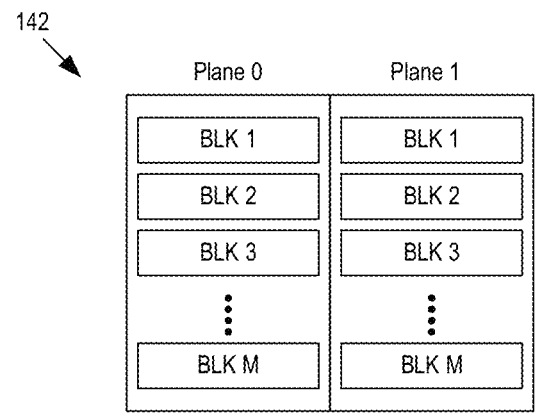
FIG. 3B is a block diagram of a memory cell structure organized into blocks in different memory planes.

Referring to FIG. 3B, for some example configurations, the N-number of blocks located on a single memory die 104 are organized into a plurality of memory planes (or just planes). FIG. 3B shows an example configuration where the blocks are organized into two memory planes, including a first memory plane Plane 0 and a second memory plane Plane 1. Configurations that include more than two memory planes may be possible. In FIG. 3B, each memory plane is shown as including an M-number of blocks, extending from a first block BLK 1 to an Mth block BLK M. In at least some example configurations, blocks that are part of the same plane may be oriented in and/or form a column or a one-dimensional array of blocks, although other configurations of blocks in a single plane may be possible.

The memory cells of a block may be arranged two-dimensionally in a two-dimensional (2-D) memory array or three-dimensionally in a three-dimensional (3-D) memory array. A two-dimensional block is a block that has memory cells arranged two-dimensionally. A three-dimensional block is a block that has memory cells arranged three-dimensionally.

Figure 4A:
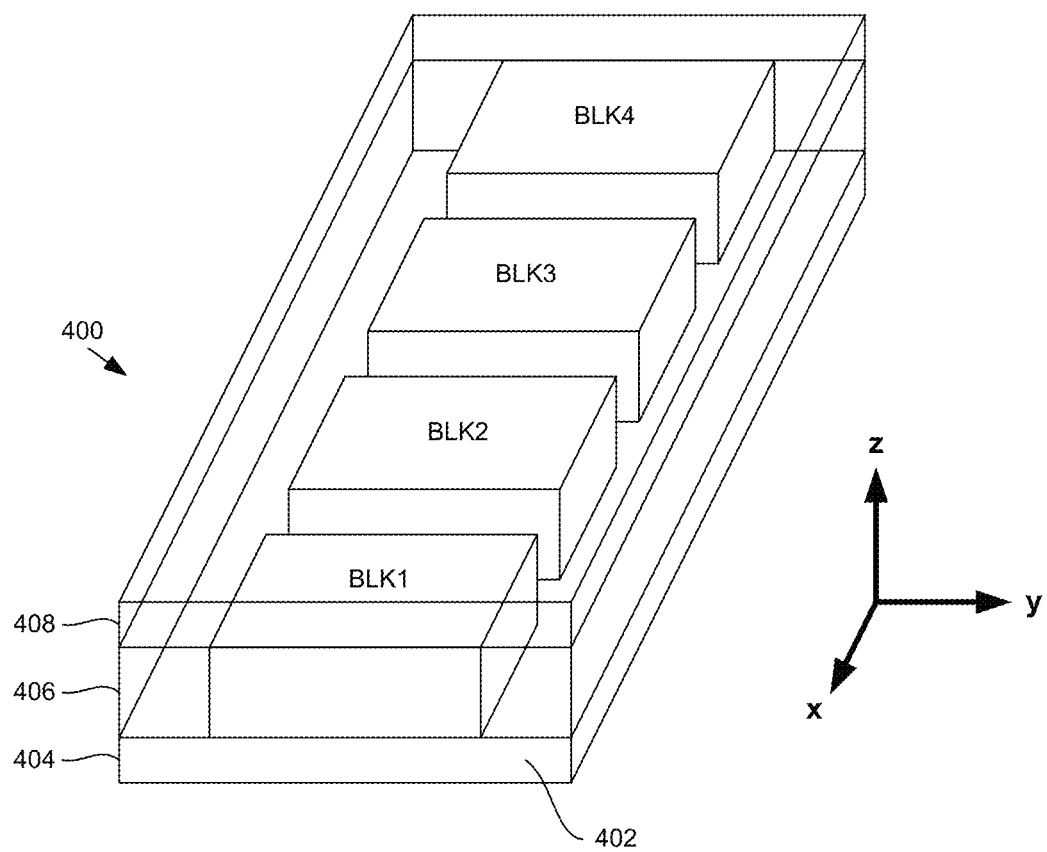
FIG. 4A is a perspective view of at least a portion of the memory die of FIG. 2B that includes a plurality of three-dimensional blocks.

FIG. 4A shows a perspective view of at least a portion of a memory die 104 that includes a set or a plurality of three-dimensional blocks 400, which may represent at least a portion of the memory cell structure 142 of FIG. 2B. For simplicity, the plurality of blocks 400 is shown as including four blocks, BLK1, BLK2, BLK3, and BLK4. In actual implementation, a given memory cell structure 142 of a memory die 104 may include several more blocks than four, such as on the order of hundreds, thousands, or tens of thousands of blocks. In a particular example configuration, one plane of blocks includes 2,000 blocks.

The blocks 400 are located or disposed on a substrate 402 of the memory die 104. The substrate 402 may be part of a lower level or region 404 of the memory die 104 that carries or includes circuitry under the blocks 400, along with one or more lower metal layers patterned to form conductive paths that carry or supply signals or voltages output from the circuitry, such as those used to perform memory operations (read, program, sense, erase, e.g.).

The blocks 400 are disposed in an intermediate level or region 406 (also referred to as a block level or region, or an array level or region) of the memory die 104 in between the lower region 404 and an upper level or region 408 of the memory die 104. The upper region 408 may include one or more upper metal layers patterned in the form of conductive paths that carry or supply signals or voltages output from the circuitry.

The substrate 402 is generally a planar structure having opposing planar surfaces. Herein, the components on a memory die 104 can be physically described with reference to a three-dimensional Cartesian coordinate system having an x-axis, a y-axis, and a z-axis. The z-axis is the axis that extends perpendicular to the planar surfaces of the substrate 402. In general, the components on a memory die 104 are disposed on and/or extend from one of the planar surfaces in a z-direction that is parallel with the z-axis. The terms "above" and "below" as well as other terms such as "top" and "bottom" and "upper" and "lower" are used herein to describe relative positioning of components of the memory die 104 along or with reference to the z-axis. For example, the blocks 400 are "above" the substrate 402, and the substrate 402 is part of the lower region 404 that is "below" the blocks 400. In addition, the upper region 408 is a region of the memory die 104 "above" both the blocks 400 and the substrate 402. Components of the memory die 104 disposed in the upper region 408 are farther away in the z-direction from the substrate 402 than components of the blocks 400. In general, for two components on a given memory die 104, where the first component is "above" the second component, the first component is positioned or disposed farther in the z-direction from the substrate 402 than the second component. In addition, where the first component is "below" the second component, the first component is positioned or disposed closer in the z-direction to the substrate 402 than the second component.

The terms "top" and "bottom" are also used to refer to the relative positioning of components of the memory die 104 in the z-direction and/or along the z-axis. In general, "bottom" components are positioned or disposed closer in the z-direction to the substrate 402 than "top" components, and "top" components are positioned or disposed farther in the z-direction from the substrate 402 than "bottom" components. In this context, a memory die 104 may include one or more top metal layers disposed in the upper region 408 and one or more bottom metal layers disposed in the lower region 404. In general, the bottom metal layers are positioned or disposed closer in the z-direction to the substrate 402 than the top metal layers, and the top metal layers are positioned or disposed farther in the z-direction from the substrate 402 than the bottom metal layers.

Although the terms "upper" and "lower," "above" and "below," and "top" and "bottom" are used to describe the relative position of components on a memory die 104, they should not be construed as limiting the relative positioning of the components since a memory die 104, or the memory system 100 as a whole, can be oriented in any of various positions.

With respect to the components of a block, a block includes a plurality of bias elements and a plurality of control lines. A bias element is a component or unit of a block that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out.

The plurality of bias elements of a block may all be of a single type or may each be one of a plurality of different types. Bias elements of different types may perform different functions in the block and/or may be biased with different biases at different levels during the memory operations.

One type of bias element is a memory cell. Memory cells that are part of the same block are referred to as a block of memory cells. Other types of bias elements may be possible, depending on the memory technology. In NAND technology, other types of bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects. SGD transistors and SGS transistors may be configured to be enabled (turn on) and disabled or inhibited (turn off), or otherwise configured in conductive and non-conductive states, at a certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases.

The control lines of a block may be organized, arranged, characterized, divided, or configured into a plurality of different types of control lines. The control lines may be organized into types by the way that they bias the bias elements. For example, control lines of the same type may bias the bias elements in the same way, such as by biasing the same type of bias elements and/or the same types of terminals of the bias elements.

For NAND technology, the control lines of a block may be organized into three main types, including control gate lines, bit lines, and source lines. A control gate line (at least for NAND technology) is a control line that applies a control gate voltage to one or more control gate terminals (or just control gate) of one or more bias elements, and/or that biases one or more control gate terminals of one or more bias elements with a control gate voltage.

A bit line (at least for NAND technology) is a control line that applies a bit line voltage to one or more drain terminals (or just drain) of one or more bias elements, and/or that biases one or more drain terminals of one or more bias elements with a bit line voltage. In this context, the bit line voltage may alternatively be referred to as a drain voltage, where a bit line is a control line that applies a drain voltage to one or more drain terminals of one or more bias elements.

In particular example configurations, a bit line biases drain terminals by applying its bit line voltage to one or more drain ends or sides of one or more NAND strings and/or associated channels, and/or by biasing one or more drain ends or sides of one or more NAND strings and/or associated channels with a bit line voltage. In this context, a bit line voltage may alternatively be referred to as a drain-side channel voltage (or just drain-side voltage). Herein, the terms bit line voltage, drain-side voltage, and drain-side channel voltage are used interchangeably, at least as those voltages pertain to NAND technology, unless expressly described otherwise. NAND strings, channels, and their drain ends are described in further detail below.

A source line (at least for NAND technology) is a control line that applies a source line voltage to one or more source terminals (or just source) of one or more bias elements, and/or that biases one or more source terminals of one or more bias elements with a source line voltage. In this context, the source line voltage may alternatively be referred to as a source voltage, where a source line is a control line that applies a source voltage to one or more source terminals of one or more bias elements. In particular example configurations, a source line biases source terminals by applying its source line voltage to one or more source ends or sides of one or more NAND strings and/or associated channels, and/or by biasing one or more source ends or sides of one or more NAND strings and/or associated channels with a source line voltage. In this context, a source line voltage may alternatively be referred to as a source-side channel voltage or (or just source-side voltage). Herein, the terms source line voltage, source voltage, source-side voltage, and source-side channel voltage are used interchangeably, at least as those voltages pertain to NAND technology, unless expressly described otherwise. Also, the source line of a block may alternatively be referred to as a cell source line CELSRC. NAND strings, channels, and their source ends are described in further detail below.

In at least some example configurations, control gate lines of a block may be further organized, arranged, characterized, divided, or configured into a plurality of different control gate types (or sub-types). In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate 402, and the other planar surface is a bottom surface that faces in the z-direction toward the substrate 402.

Herein, the terms "line" and "layer," at least as they are used to refer to control lines—except SGD lines as described in further detail below—are used interchangeably or as alternatives to each other. For example, the terms "control gate line" and "control gate layer" are used interchangeably; the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In a block, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, as used herein (at least for 2-D and 3-D NAND technology), a NAND string (also referred to as a memory cell string, a string of memory cells, or just string) is a plurality or a collection of bias elements that are coupled to a same or common bit line. Specifically for 3-D NAND, a NAND string is a plurality or a collection of bias elements that are coupled to a same or common bit line, and that are formed or disposed around or about a same or common channel. Accordingly, for 2-D NAND, a single string is coupled to a bit line, whereas for 3-D NAND, a plurality of different strings are coupled to the same bit line.

Also, as used herein, a given channel and a given NAND string that includes the bias elements disposed or formed around or about the given channel are referred to as being coupled to and/or associated with each other. In addition, bias elements that are part of the same NAND string are referred as being coupled to each other.

For at least some example configurations, the bias elements of a NAND string include a plurality of memory cells, at least one SGD transistor, and at least one SGS transistor. In particular example configurations, a NAND string may further include one or more dummy cells.

Additionally, for 3-D NAND, the NAND strings extend in the z-direction about their associated channels. Similar to the channels, the NAND strings each include respective drain ends (or drain sides) and source ends (or source sides). A channel extends in the z-direction toward the substrate from its drain end to its source end.

Drain ends of NAND strings are electrically coupled to drain ends of their associated channels. Accordingly, the bit lines are electrically connected or coupled to drain ends of channels and associated channel elements groups. A bit line is configured to apply a bit line voltage (or a drain-side voltage or a drain-side channel voltage) to drain ends of channels and associated NAND strings to which the bit line is coupled. Otherwise stated, a bit line voltage (or a drain-side voltage or a drain-side channel voltage) is a voltage that a bit line generates and that it applies to a drain end (or drain side) of a channel and/or a drain end (or drain side) of a NAND string to which it is electrically connected or coupled. During at least some memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more NAND strings to which it the bit line is electrically connected or coupled. Otherwise stated, during memory operations, a bit line biases one or more drain terminals of one or more bias elements with a bit line voltage (or a drain-side voltage or a drain-side voltage) by way of the drain ends of one or more channels and/or the drain ends of one or more NAND strings to which the bit line is coupled.

Similarly, source ends of NAND strings are electrically coupled to source ends of their associated channels. Accordingly, the source line is electrically connected or coupled to source ends of channels and associated channel elements groups. The source line is configured to apply a source line voltage (or a source-side voltage or a source-side channel voltage) to source ends of channels and associated NAND strings to which the source line is coupled. Otherwise stated, a source line voltage (or a source-side voltage or a source-side channel voltage) is a voltage that a source line generates and that it applies to a source end (or source side) of a channel and/or a source end (or source side) of a NAND string to which the source line is electrically connected or coupled. During at least some memory operations, a source line may bias one or more source terminals of one or more bias elements by applying a source line voltage (or a source-side voltage or a source-side channel voltage) to one or more source ends of one or more channels and/or to one or more source ends of one or more NAND strings to which the source line is electrically connected or coupled. Otherwise stated, during memory operations, a source line biases one or more source terminals of one or more bias elements with a source line voltage (or a source-side voltage or a source-side channel voltage) by way of the source ends of one or more channels and/or the source ends of one or more NAND strings to which the source line is coupled.

In addition, bias elements of a NAND string extend in the z-direction around or about the same channel. Each bias element of the NAND string is disposed coplanar with one of the plurality of control gate layers of the block. In this regard, each control gate layer of the block is configured to bias a control gate of a respective one of the plurality of bias elements of the NAND string.

In addition, for at least some example configurations, the NAND strings of a block may have the same number of bias elements, the same combination of bias element types, and the same number of bias elements of each bias element type. Also, a bias element order in which the bias elements of their respective bias element types extend in the z-direction away from the substrate is the same among the NAND strings of a block. At least for some example configurations of 3-D NAND technology, the bias element order of the bias elements of a NAND string, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

Figure 4B:
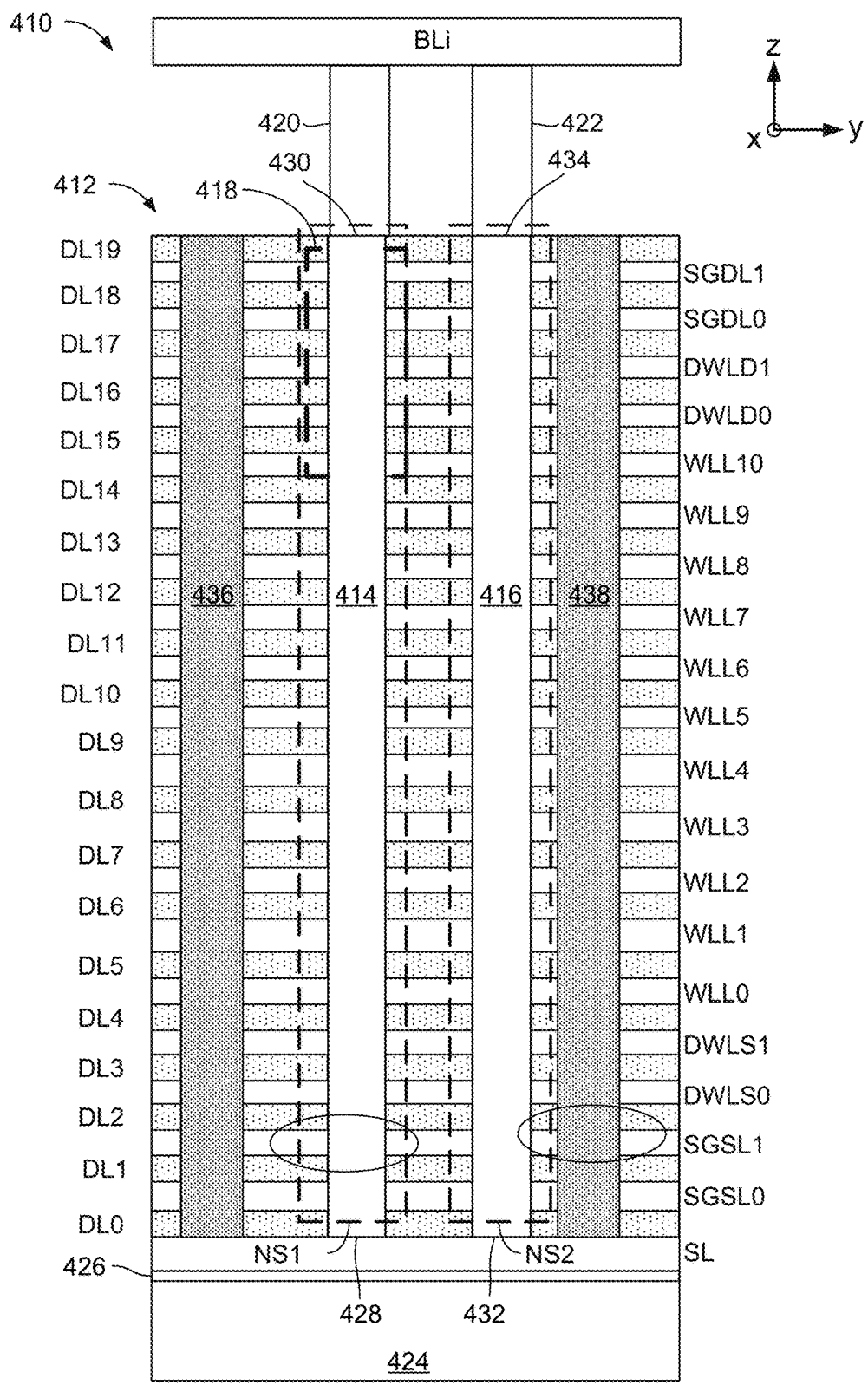
FIG. 4B is a cross-sectional view of a portion of one of the blocks of FIG. 4A.

In further detail, FIG. 4B shows a cross-sectional view of a portion of a block 410, which may be representative of one of the blocks 400 of FIG. 4A. The block 410 includes a stack 412 of alternating control gate layers and dielectric layers (DL). In addition, the portion shown in FIG. 4B includes two channels (or memory holes) extending through the layers, including a first channel 414 and a second channel 416. Bias elements forming two NAND strings around the two channels 414, 416 are identified by dotted boxes in FIG. 4B. In particular, bias elements forming a first NAND string NS1 around the first channel 414 are identified by a dotted box labeled NS1, and bias elements forming a second NAND string NS2 around the second channel 416 are identified by a dotted box labeled NS2. Further details of bias elements and example materials to form the elements and the channels are described in further detail below with respect to FIG. 4C with reference to a particular region 418 of the first NAND string NS1 and associated first channel 414.

For purposes of illustration, in FIG. 4B, the first and second NAND strings NS1, NS2 formed around the first and second channels 414, 416 are both electrically connected to an ith bit line BLi. In actual implementation, a block may include hundreds or thousands of bit lines. An arrangement of channels and associated NAND strings of a block may determine which channels and NAND strings are electrically connected to which bit lines. Among the plurality of channels and NAND strings of a block, certain combinations of channels and associated NAND strings are electrically connected to the same bit line as each other, while certain other combinations of channels and associated NAND strings are electrically connected to different bit lines from each other.

In addition, a given NAND string may be electrically connected to a given bit line by way of its associated channel and a conductive via electrically connecting the associated channel with the bit line. For example, in FIG. 4B, the first NAND string NS1 is electrically connected to the ith bit line BLi by way of the first channel 414 and a conductive via 420 that electrically connects the first channel 414 with the ith bit line BLi. The second NAND string NS2 is electrically connected to the ith bit line BLi by way of the second channel 416 and a conductive via 422 that electrically connects the second channel 416 with the ith bit line BLi. Other ways of electrically connecting bit lines with NAND strings may be possible.

The block 410 may further include or be disposed on a substrate 424. An insulating film 426 may be formed on the substrate 424, and a source line SL may be formed or disposed on a bottom-most layer of the stack 412.

In addition, in the example configuration shown in FIG. 4B, each channel 414, 416 includes a source end connected to the source line SL, and a drain end connected to its associated conductive via. In FIG. 4B, the first channel 414 includes a source end 428 connected to the source line SL, and a drain end 430 connected to the conductive via 420. Similarly, the second channel 416 includes a source end 432 connected to the source line SL, and a drain end 434 connected to the conductive via 422.

In addition, at least some example configurations, the block 410 may further include vertical interconnects (e.g., metal-filled slits) extending through the stack 412 that connect the source line SL to a conductive line above the stack 412, such as a conductive line in one of the metal layers in the upper region 408 (FIG. 4A). For purposes of illustration, FIG. 4B shows two interconnects 436, 438 extending through the stack 412.

In addition, in the example configuration in FIG. 4B, for purposes of illustration, each of the NAND strings include two SGS transistors, two source-side dummy cells, eleven memory cells, two drain-side dummy cells, and two SGD transistors. Accordingly, the control gate layers of the stack 412 include: two SGS layers, including a first SGS layer SGSL0 and a second SGS layer SGSL1; two source-side dummy word line layers, including a first source-side dummy word line layer DWLS0 and a second source-side dummy word line layer DWLS1; eleven word line layers extending from a first word line layer WLL0 to an eleventh word line layer WLL10; two drain-side dummy word line layers, including a first drain-side dummy word line layer DWLD0 and a second drain-side dummy word line layer DWLD1; and two SGD layers, including a first SGD layer SGSL0 and a second SGD layer SGDL1. The stack further includes twenty dielectric layers, extending from a first dielectric layer DL0 to a twentieth dielectric layer DL19, alternatingly disposed between the control gate layers.

The numbers of bias elements and their respective bias element types used for the NAND strings and the number of corresponding control gate layers in the example configuration of the block 410 in FIG. 4B are non-limiting and merely exemplary for purposes of illustration. Other numbers of bias elements for any of the bias element types, or other configurations that do not include bias elements of certain bias elements types or that include one or more bias elements of bias element types other than those shown in FIG. 4B, may be possible.

Figure 4C:
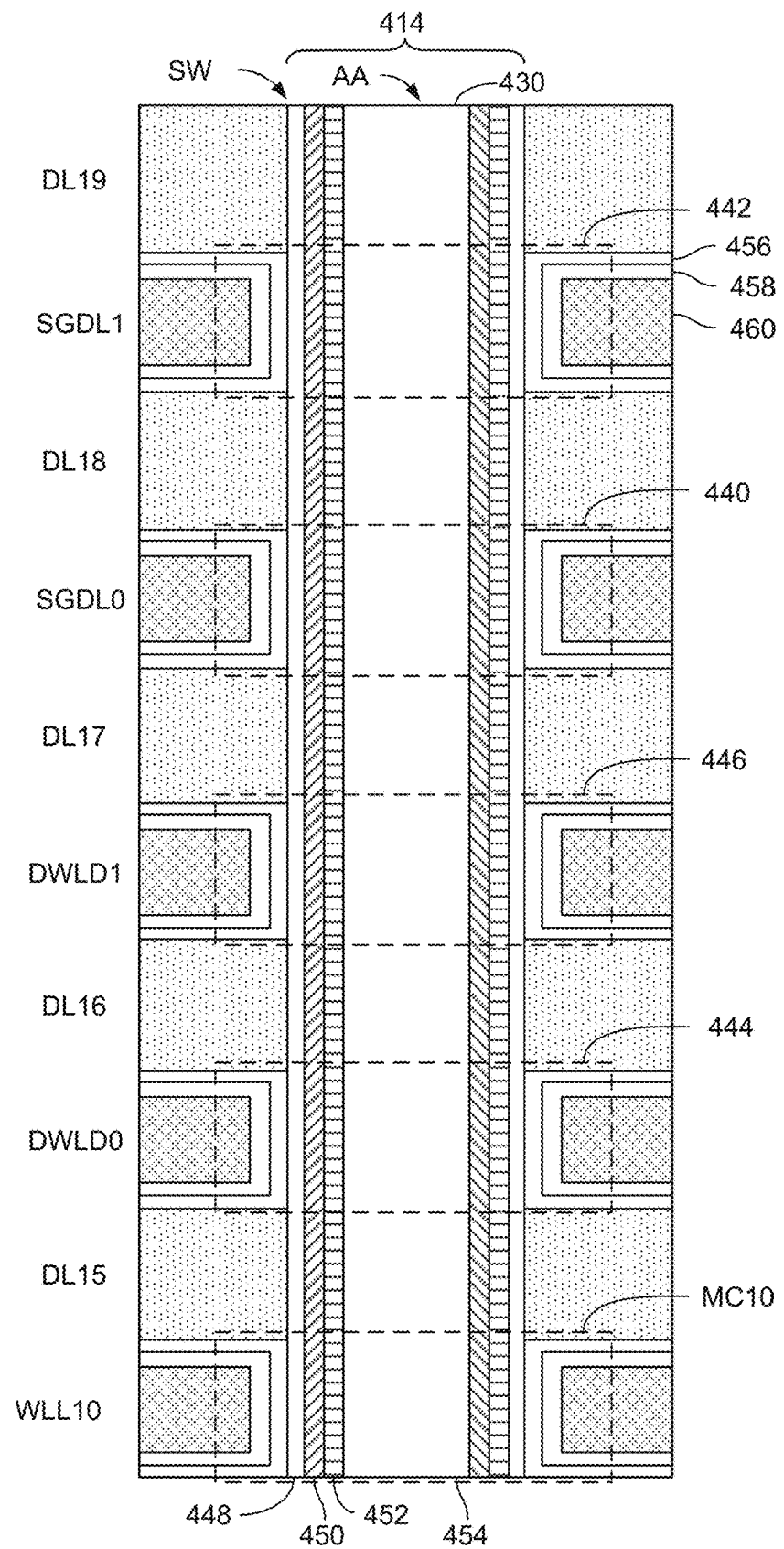
FIG. 4C is a close-up view of a region of the cross-section of FIG. 4B.

FIG. 4C is a close-up view of the region 418 of the block 410 of FIG. 4B. The materials forming the bias elements are formed at different levels of the stack 412 at the intersection of respective control gate layers and respective channels. In the example configuration of the block 410, as depicted in the close-up view of FIG. 4C, a first SGD transistor 440 and a second SGD transistor 442 are disposed below the drain end 430 of the first channel 414, and above first and second drain-side dummy cells 444, 446 and an eleventh memory cell MC10.

Physically or structurally, a channel includes a memory hole extending in the z-direction defines a sidewall (SW). A channel further includes one or more layers of materials disposed in the memory hole and/or on the side wall, such as by using atomic layer deposition as an example. In some example configurations, as described with respect to the first channel 414, the layers of materials of a channel (which may be referred to as a column or a pillar of materials) may include a charge-trapping layer or film 448 such as silicon nitride, a tunneling layer 450, a polysilicon body or channel 452, and a dielectric core 454. In addition, in some example configurations, such as the one shown in FIG. 4C, the materials making up each of the bias elements may include a blocking oxide/block high-k material 456, a barrier metal 458, and a conductive metal 460 (e.g. Tungsten) that forms the control gates of the transistors. The materials forming the bias elements may be disposed in the same level or in the same plane as the respective control gate layers. Other configurations may use materials deposited along the sidewall (SW) and/or for the bias elements other than those shown and described with reference to FIG. 4C.

Figure 4D:
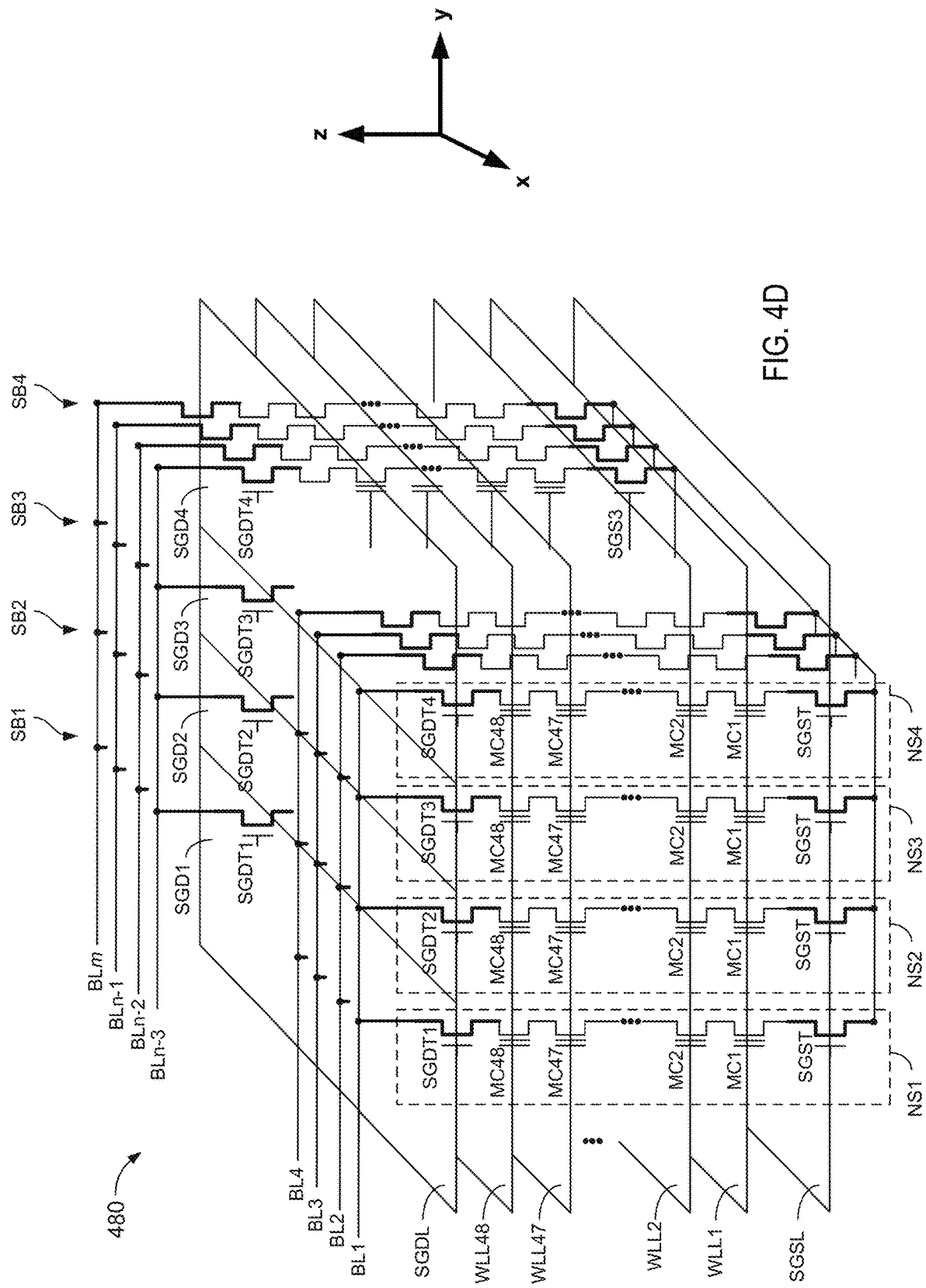
FIG. 4D is a circuit schematic diagram of a block of memory cells three-dimensionally arranged into a plurality of NAND strings.

FIG. 4D shows a circuit schematic diagram of an example configuration of a three-dimensional block 480, which may be representative of at least a portion of one of the blocks 400 of FIG. 4A and/or have the physical construction or structure as depicted in FIGS. 4B, 4C. In FIG. 4D, each bias element is represented or depicted as a transistor. In addition, memory cells are labeled MC, SGD transistors are labeled SGDT, and SGS transistors are labeled SGST. In the example block 480, each NAND string NS includes 50 cells, including 48 memory cells, extending from a first memory cell MC1 to a 48th memory cell MC48, one SGD transistor SGDT, and one SGS transistor SGST. Other NAND string configurations are possible, including those that include one or more source-side dummy cells, one or more drain-side dummy cells, more than one SGD transistor, and/or more than one SGS transistor, as previously described.

In accordance with the NAND string configuration in FIG. 4B, the block 480 includes 50 control gate layers, including 48 word line layers extending from a first word line layer WLL1 to a 48th word line layer WLL48, a SGD layer SGDL, and a SGS layer SGSL. As previously described, the ith memory cells MCi in each NAND string are disposed in and configured to have their respective control gates biased by the ith word line layer WLLi of the control gate layers. As examples, first memory cells MC1 of the NAND strings NS are disposed in and configured to have their control gates biased by the first word line layer WLL1, the second memory cells MC2 are disposed in and configured to have their control gates biased by the second word line layer WLL2, and the 48th memory cells MC48 of the NAND strings NS are disposed in and configured to have their control gates biased by the 48th word line layer WLL48. In addition, the SGD transistors SGDT of the NAND strings NS are disposed in and configured to have their respective control gates biased by the SGD layer SGDL, and the SGS transistors SGST of the NAND strings NS are disposed in and configured to have their respective control gates biased by the SGS layer SGSL.

As depicted in FIG. 4D, the NAND strings NS and their associated channels are two-dimensionally arranged in the x and y directions in the block 480, and electrically connected to an m-number of bit lines. In particular example configurations, the NAND strings NS and their associated channels are two-dimensionally arranged in accordance with a channel arrangement that depends on a P-number of NAND strings and their associated channels that are connected to a single bit line. Otherwise stated, each bit line BL is configured to electrically connect to, apply a respective bit line voltage to, and/or bias with a respective bit line (channel) voltage, a unique set of a P-number of NAND strings and their associated channels.

In the example configuration of FIG. 4D, each bit line BL is configured to electrically connect to four NAND strings (i.e., P=4). Accordingly, FIG. 4D shows the first bit line BL1 electrically connected to each of a first NAND string NS1, a second NAND string NS2, a third NAND string NS3, and a fourth NAND string NS4. Each of the other two through mth bit lines BL2 to BLm are also electrically connected to a respective set of four NAND strings and their respective channels. Numbers for P other than four may be possible for various other configurations.

In some example configurations, an SGD layer may be separated or divided into a plurality of different drain select gate (SGD) sub-layers that are electrically isolated or disconnected from each other. For example, an SGD layer may be etched to remove portions of the metal forming the SGD layer in order to form a plurality of electrically isolated or disconnected SGD sub-layers.

Different SGD sub-layers of the same SGD layer may be independently and/or individually biased and/or supplied with a different one of a plurality of SGD line voltages. In turn, for a given plurality of SGD transistors disposed in the same SGD layer, each SGD sub-layer of the same SGD layer may be configured to bias the control gates of those SGD transistors disposed in its SGD sub-layer, but not the SGD transistors disposed in the other SGD sub-layers. In this way, the plurality of SGD sub-layers may be configured to independently or individually bias the different SGD transistors within their respective SGD sub-layers with a respective one of a plurality of SGD line voltages.

In addition, for example configurations that include multiple SGD layers, each SGD layer may include multiple SGD sub-layers. The number of SGD sub-layers in each SGD layer may be the same. In addition, certain combinations of SGD-sub-layers in different SGD layers may be electrically coupled together and/or supplied with the same SGD line voltage such that SGD transistors of the same NAND string have their control gates biased with the same SGD line voltage. SGD sub-layers that bias SGD transistors with the same SGD line voltage form part of the same SGD line.

As used herein, an SGD line is a conductive structure of a block that biases control gates of SGD transistors with a common or the same SGD line voltage. Accordingly, as used specifically herein for SGD layers and SGD lines, the terms "line" and "layer" are not used interchangeably. Instead, an SGD line is a single SGD sub-layer, or a collection of SGD sub-layers that are each part of a different SGD layer. In particular, for 3-D block configurations that include a single SGD layer, each SGD sub-layer of the SGD layer forms an entire SGD line. For 3-D block configurations that include multiple SGD layers, each SGD sub-layer forms a part of an SGD line with one or more other SGD sub-layers from one or more other SGD layers.

In addition, different SGD lines are configured to independently or separately bias different sets or groups of SGD transistors of a block with different SGD line voltages. An SGD line is configured to bias the control gates of those SGD transistors to which it is coupled or electrically connected, and not bias the control gates of those SGD transistors from which it is uncoupled or electrically disconnected. Accordingly, the SGD transistors SGDT of a block are arranged or formed into a plurality of SGDT groups. SGD transistors that are part of the same SGDT group are coupled to the same SGD line and configured to be biased by the same SGD line voltage. SGD transistors that are part of different SGDT groups are coupled to different SGD lines and configured to be biased by different SGD line voltages.

With respect to FIG. 4D, the SGD transistors that are part of the same SGDT group are labeled with the same name. In particular, SGD transistors that are part of a same, first SGDT group are each labeled SGDT1, SGD transistors that are part of a same, second SGDT group are each labeled SGDT2, SGD transistors that are part of a same, third SGDT group are each labeled SGDT3, and SGD transistors that are part of a same, fourth SGDT group are each labeled SGDT4.

In addition, for at least some example configurations of a 3-D block, the number of SGD lines is equal to the P-number of NAND strings and associated channels that are connected to the same bit line. For example, with reference to FIG. 4D, the block 480 includes four SGD lines corresponding to the four NAND strings connected to a single bit line, including a first SGD line SGD1, a second SGD line SGD2, a third SGD line SGD3, and a fourth SGD line SGD4. Otherwise stated, the SGD layer SGDL includes four SGD lines SGD1, SGD2, SGD3, and SGD4.

In addition, the NAND strings may be arranged so that for a given set of NAND strings connected to the same bit line, each NAND string of the set has its SGD transistor SGDT coupled to a different one of the SGD lines. For example, in the block 480 of FIG. 4D, the set of four NAND strings NS1, NS2, NS3, NS4 connected to the first bit line BL1 have their respective SGD transistors SGDT connected to a different one the SGD lines SGD1, SGD2, SGD3, SGD4. In particular, the first NAND string NS1 includes a first SGD transistor SGDT1 coupled to and configured to have its control gate biased by the first SGD line SGD1, the second NAND string NS2 includes a second SGD transistor SGDT2 coupled to and configured to have its control gate biased by the second SGD line SGD2, the third NAND string NS3 includes a third SGD transistor SGDT3 coupled to and configured to have its control gate biased by the third SGD line SGD3, and the fourth NAND string NS4 includes a fourth SGD transistor SGDT4 coupled to and configured to have its control gate biased by the fourth SGD line SGD4.

Additionally, a 3-D block may be arranged, organized, or divided into sub-blocks (e.g., items SB1-SB4 in FIG. 4D) across the m-number of bit lines BL1 to BLm based on the different SGD lines. As used herein, a sub-block is a portion of a block that has NAND strings with SGD transistors configured to be biased by the same SGD line and/or with the same SGD line voltage. A sub-block may span, such as in the x-direction, across the m-number of bit lines of a block. In addition, NAND strings with SGD transistors configured to be biased by different SGD lines and/or with different SGD line voltages are part of different sub-blocks.

The number of sub-blocks of a block may be equal to the number of SGD lines. For example, the example block 480 of FIG. 4D includes four sub-blocks (SB) equal to the number of SGD lines, including a first sub-block SB1, a second sub-block SB2, a third sub-block SB3, and a fourth sub-block SB4. The first sub-block SB1 includes those NAND strings with SGD transistors SGD1 coupled to the first SGD line SGD1 and configured to be biased with a first SGD line voltage, the second sub-block SB2 includes those NAND strings with SGD cells SGD2 coupled to the second SGD line and configured to be biased with a second SGD line voltage, the third sub-block SB3 includes those NAND strings with SGD cells SGD3 coupled to the third SGD line and configured to be biased with a third SGD line voltage, and the fourth sub-block SB4 includes those NAND strings with SGD cells SGD4 coupled to the fourth SGD line and configured to be biased with a fourth SGD line voltage.

In addition, a block of memory cells (i.e., memory cells that are part of the same block), may be arranged, organized, separated, and/or labeled on a sub-block level, or on both a sub-block level and a word line level. A plurality of memory cells MC that are part of the same sub-block is referred to as a sub-block of memory cells. Otherwise stated, a sub-block of memory cells are memory cells of NAND strings having SGD cells coupled to the same SGD line and/or configured to be biased with the same SGD line voltage.

In addition, a plurality of memory cells that are part of the same sub-block, and that are also disposed in the same word line layer and/or that are configured to have their control gates biased by the same word line and/or with the same word line voltage are referred to as a word line cell group of memory cells. Otherwise stated, a word line cell group of memory cells is a plurality or a collection of memory cells coupled to the same word line layer, and that are part of NAND strings configured to be biased with the same SGD line voltage.

A single word line layer may include a plurality of word line cell groups, such that the memory cells disposed in a single word line layer are organized, arranged, or disposed into a plurality of word line cell groups. Memory cells coupled to the same word line layer but that are part of NAND strings having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

In addition, the memory cells of a block, or of the memory cell structure 142 generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include 2, 3, or 4, although MLC cells that store more than 4 bits may be possible.

In general, certain collections of memory cells are configured to store the same number of bits. For example, memory cells that are part of the same word line cell group, part of the same block, or part of the same memory cell structure 142, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure 142, including blocks and word line cell groups of the memory cell structure 142, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data; and a word line cell group of MLC cells configured to store three-bits-per-cell is configured to store three pages of data.

In addition, a memory cell structure 142 may store data according to one or more storage schemes. As used herein, a storage scheme is a general plan including a predefined set of actions and a predefined set of parameters that a memory system implements to store data. Two general types of storage schemes are described herein, including a bits-per-cell storage scheme and a content addressable memory (CAM) storage scheme. Each general type further includes specific types of storage schemes, as described in further detail below.

A bits-per-cell storage scheme identifies or defines the number of bits-per-cell that memory cells of a particular collection are configured to store. The components of the memory system 100, including the circuit components on a given memory die, are configured to perform memory operations on the particular collection in accordance with a given bits-per-cell storage scheme in order to program data into and/or read data from the particular collection of memory cells.

Memory cells of different memory technologies may store data in accordance with different storage schemes. In addition, memory cells of the same memory technology may store data in accordance with different storage schemes. For example, memory cells of the same memory technology but located in different memory systems, or in the same memory system but in different memory dies, or in different blocks or planes of the same memory die, or even different word line layers or different word line cell groups of the same block, may store data in accordance with different bits-per-cell storage schemes, at least with respect to the number of bits-per-cell the different memory cells are configured to store.

At least for NAND memory technology, the NAND memory cells may be configured to store data in accordance with one of multiple bits-per-cell different storage schemes, with each bits-per-cell storage scheme associated or identifying a different number of bits-per-cell. In at least some example configurations, some NAND memory cells may store data according to one bits-per-cell storage scheme while other NAND memory cells store data according to a different bits-per-cell storage scheme. Accordingly, two different collections of NAND memory cells located in different memory systems, or in the same memory system but in different dies, planes, blocks, word line layers, or word line cell groups, may store different numbers of bits-per-cell according to different bits-per-cell storage schemes. To illustrate, one collection of NAND memory cells may be configured as SLC cells and another collection of NAND memory cells may be configured as MLC cells.

In addition, the same memory cell (or the same collection of memory cells) may be configured to store different numbers of bits-per-cell according to different bits-per-cell storage schemes at different times. To illustrate, in one example, a memory cell may be configured as an SLC cell at one point in time, and then reconfigured as an MLC cell at a later point in time. As another example, a memory cell may be configured as an MLC cell at one point in time, and then reconfigured as an SLC cell at a later point in time. As another example, a memory cell may be configured as an MLC cell storing a first number of bits-per-cell at one point in time, and then reconfigured as an MLC cell storing a second number of bits-per-cell at a later point in time, where the first and second numbers are different from each other, with the first number being either less than or greater than the second number.

In addition, a bits-per-cell storage scheme identifying a particular number of bits-per-cell may identify a plurality of possible data values that a memory cell can store according to the bits-per-cell storage scheme. A bits-per-cell storage scheme may further define levels, values, magnitudes, or states, or predetermined ranges of levels, values, magnitudes, or states, of storage parameters that storage parameters of memory cells can have or be set to in order for the memory cells to store the possible data values defined under the bits-per-cell storage scheme.

In general, a memory cell stores data by having an associated storage parameter (alternatively or otherwise referred to as a characteristic, property, or feature) set to a level, value, magnitude, or state. The associated parameter is adjustable or variable, and can be controlled by biasing the control lines coupled to the memory cells at certain levels, at certain times, during certain memory operations, and according to certain storage schemes. Within one bits-per-cell storage scheme defining a set of data values, a memory cell can store data at a certain one of the data values by having its storage parameter set to a level, value, magnitude, or state, or within a predetermined range of levels, values, magnitudes, or states. The level, value, magnitude, or state that the memory cell is at or is set to corresponds to the data value of the set that the memory cell is storing. A memory cell can be configured to store a different value, or to change the data value of the data it is storing from one data value to another data value, by changing or adjusting the storage parameter to a different level, value, magnitude, or state.

The storage parameter that a memory cell has to store data depends on the memory technology, and can vary across different memory technologies. For NAND technology, the storage parameter is threshold voltage. At least with respect to NAND memory cells, a threshold voltage of a memory cell is a voltage applied to a control gate of the memory cell at which the memory cell becomes conductive. The level (otherwise referred to as the value or magnitude) of the threshold voltage depends on or is proportional to the amount of electrical charge that the memory cell is storing or trapping. The more charge that a memory cell is storing, the higher its threshold voltage, and the less charge that a memory cell is storing, the lower its threshold voltage. Accordingly, the data value that the memory cell is storing is set by setting the threshold voltage of the memory cell to a certain level, and the data value is adjusted or changed by changing the threshold voltage to a different level or within a different range of levels.

In addition, for NAND technology, the memory cells store data by being configured in memory states. As used herein, a memory state is an identifier that identifies a data value of data that a memory cell is storing, can store, or is intended to store. A bits-per-cell storage scheme identifies or defines an associated plurality or set of memory states at which a memory cell can be configured. Each memory state identifies, corresponds to, and/or is associated with one of the plurality of data values identified or defined by the bits-per-cell storage scheme. Accordingly, a memory cell configured in a given memory state is storing a data value that corresponds to the given memory state. A memory cell can store a different data value by being configured into a different memory state.

For a given bits-per-cell storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in after being subjected to a program operation. At a given point in time, a memory cell may be in the erased state or one of the program states.

In addition, for a given bits-per-cell storage scheme, each memory state has, corresponds to, or is associated with an associated range of threshold voltage levels, with each range being bounded by an upper threshold voltage level and a lower threshold voltage level. Otherwise stated, a given bits-per-cell storage scheme may define a plurality of non-overlapping threshold voltage ranges, with each range being associated with or corresponding to a respective one of the plurality of memory states defined or identified by the given bits-per-cell storage scheme. In turn, each range has, corresponds to, or is associated with a respective one of the data values. In this way, a bits-per-cell storage scheme establishes a one-to-one correspondence between the threshold voltage ranges, the memory states, and the data values. Memory cells are programmed and read according to the one-to-one correspondence. That is, a memory cell configured with a threshold voltage level within a given threshold voltage range is configured in the memory state associated with the given threshold voltage range, and in turn is storing data having a data value that is associated with the given threshold voltage range and the corresponding memory state.

For particular embodiments, the erased state is associated with the lowest threshold voltage range. The program states are associated with consecutively or sequentially higher threshold voltage ranges from the range associated with the erased state.

In addition, the storage schemes may label or name the memory states in any of various ways, including alphabetically, numerically, or alphanumerically, as non-limiting examples. In particular example configurations, the erased state is called the erased state, and the program states are named with letters, numbers, or a combination thereof by associating higher letters in the alphabet or higher numbers with higher threshold voltage ranges. As illustrations, a memory state C is associated with a higher threshold voltage range than a memory state A, and a memory state 8 is associated with a higher threshold voltage range than a memory state 1. Various ways of labeling or naming memory states are possible.

In addition, memory states may be referred to as being higher memory states and lower memory states relative to each other. A first memory state is a higher memory state than a second memory state where the first memory state is associated with a higher threshold voltage range than the threshold voltage range with which the second memory state is associated. In addition, a first memory state is a lower memory state than a second memory state where the first memory state is associated with a lower threshold voltage range than the threshold voltage range with which the second memory state is associated.

In addition, the way in which the data values correspond to the memory states and/or the threshold voltage ranges may vary, and in particular embodiments, how the data values correspond to or are assigned to the memory states and/or threshold voltage ranges may depend on a particular code scheme, such as the Gray code scheme, for example.

In implementation, a collection of memory cells programmed into the same memory state may have an associated collection of threshold voltage as a result of the programming. The threshold voltages may be represented as a threshold voltage probability distribution, or just threshold distribution of the number of memory cell in the collection as a function of threshold voltage.

A given bits-per-cell storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state to have. The lower and upper tails of the model threshold voltage distributions may align or correspond to the upper and lower threshold voltage levels of the ranges with which each of the model threshold voltage distributions is associated.

Figure 5A:
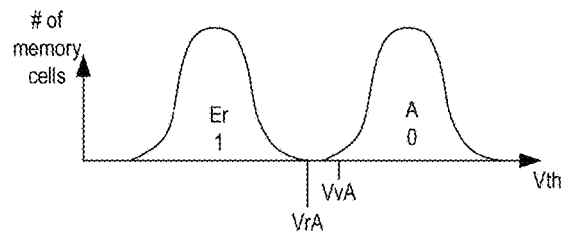
FIG. 5A is a plot of threshold voltage distribution curves for memory cells storing one bit of data per cell.
Figure 5B:
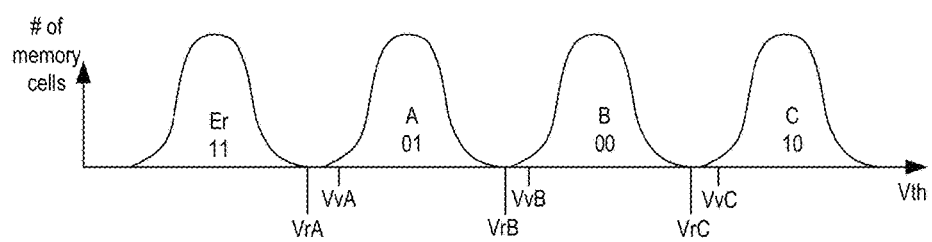
FIG. 5B is a plot of threshold voltage distribution curves for memory cells storing two bits of data per cell.
Figure 5C:
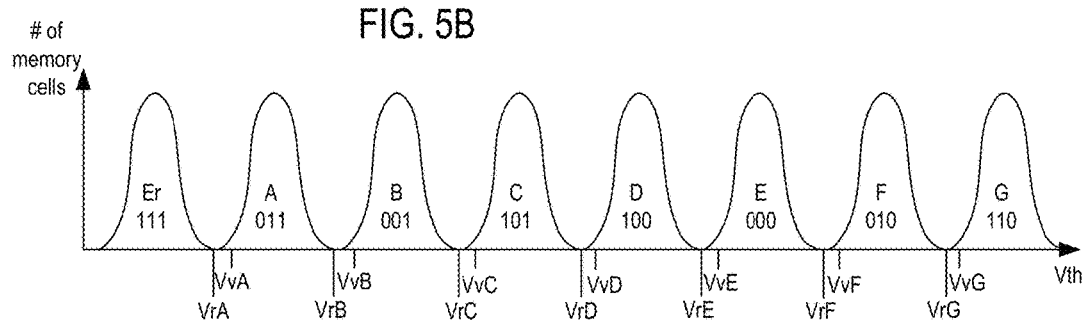
FIG. 5C is a plot of threshold voltage distribution curves for memory cells storing three bits of data per cell.
Figure 5D:
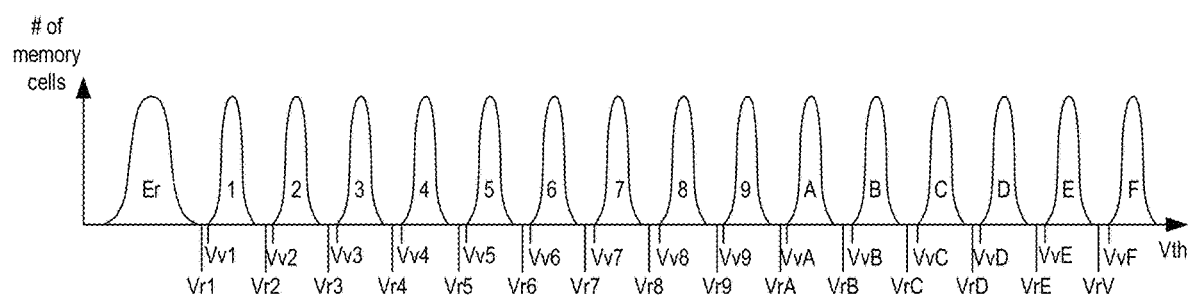
FIG. 5D is a plot of threshold voltage distribution curves for memory cells storing four bits of data per cell.

FIGS. 5A-5D are plots of threshold voltage distribution curves for different bits-per-cell storage schemes for storing different numbers of bits into memory cells. The threshold voltage distribution curves are plotted for numbers of memory cells as a function of threshold voltage Vth. In addition, FIGS. 5A-5D show the memory state, the data value, and the threshold voltage range with which each threshold voltage distribution curve is associated. FIG. 5A shows threshold voltage distribution curves for an SLC storage scheme for storing one bit of data per memory cell. FIGS. 5B-5D show threshold voltage distribution curves for MLC storage schemes. In particular, FIG. 5B shows threshold voltage distribution curves for an MLC storage scheme for storing two bits of data per memory cell; FIG. 5C shows threshold voltage distribution curves for an MLC storage scheme for storing three bits of data per memory cell; and FIG. 5D shows voltage distribution curves for an MLC storage scheme for storing four bits of data per memory cell. Similar threshold voltage distribution curves may be defined or generated for other storage schemes used for storing numbers of bits other than (such as more than) two, three, or four bits-per-cell.

With reference to FIG. 5A, for memory cells configured to store one bit of data, each of the memory cells may be configured in an erase state Er or a program state A. With reference to FIG. 5B, for memory cells configured to store two bits of data, each of the memory cells may be configured in an erase state Er or one of three program states A, B, C. With reference to FIG. 5C, for memory cells configured to store three bits, each of the memory cells may be configured in an erase state Er or one of seven program states A, B, C, D, E, F, G. With reference to FIG. 5D, for memory cells configured to store four bits, each of the memory cells may be configured in an erase state Er or one of fifteen program states 1, 2, 3, 4, 5, 6, 7, 8, 9, A, B, C, D, E, F. As shown in FIGS. 5A-5D, each voltage distribution curve is associated with the erase state or one of the program states. Also, herein, the terms "memory state" and "program state" are used interchangeably. For example, the terms "memory state A" and "program state A" are used interchangeably to refer to the same memory state.

In addition, in FIGS. 5A-5D, the associated memory state and data value is included within or under each of the threshold voltage distribution curves. For example, FIG. 5A shows the left threshold voltage distribution curve as being associated with the erased state Er and a logic 1 value, and the right threshold voltage distribution curve as being associated with memory state A and a logic 0 value. For some SLC storage schemes, the memory state A is also referred to as "the program state" since SLC storage schemes have only one program state.

For the example MLC storage schemes depicted in FIGS. 5B-5D, the data values sequentially change with increasing memory states and threshold voltage ranges according to a Gray code scheme. For example, with reference to FIG. 5B, memory cells configured in the erase state Er store data value "11"; memory cells configured in memory state A store data value "01"; memory cells configured in memory state B store data value "00"; and memory cells configured in memory state B store data value "10." Similar relationships or correspondences between data values, memory states, and threshold voltage ranges can be made for memory cells programmed to store three bits (FIG. 5C), four bits (FIG. 5D), or more than four numbers of bits-per-cell.

In addition, as illustrated in FIGS. 5A-5D, each program state is associated with a respective verify voltage pulse level (or just verify pulse level) Vv and a read voltage pulse level (or just read pulse level) Vr. For example, with respect to the storage schemes of FIGS. 5A-5D, a verify pulse level VvA and a read pulse level VrA are associated with memory state A, verify pulse level VvB and read pulse level VrB are associated with memory state B, and verify pulse level VvC and read pulse level VrC are associated with memory state C. Similar verify and read pulse levels Vv, Vr are associated with other memory states, such as memory states D-G and memory states 1-9, as depicted in FIGS. 5C and 5D.

As shown in FIGS. 5A-5D, the verify and read pulse levels Vv, Vr specify or are positioned relative to lower bounds or tails of the threshold voltage distribution curves. As described in further detail below, the verify pulse levels Vv may be used to set levels of selected word line voltages during program operations in order to verify program statuses of the memory cells, and the read pulse levels Vr may be used to set levels of selected word line voltages during read operations in order to read data from the memory cells.

As mentioned, another type of storage scheme that the memory system 100 may be configured to implement or under which the memory system 100 stores and retrieves data is a content addressable memory (CAM) storage scheme. Under a CAM storage scheme, data is stored in the memory dies 104 as key-record pairs (also referred to as key-value pairs or key-data pairs). Each key-record pair includes a pair of data sets, including a first data set referred to as a key, and a second data set referred to as a record. Identification of a key of a given key-record pair indicates where the record of the given pair is stored in the memory dies 104. Various ways of implementing a CAM storage scheme so that a key indicates where an associated record is stored may be possible. In some example implementations, an address of where a key is stored corresponds to an address of where the record is stored. As such, by knowing the key address, the associated record can be retrieved. In some example configurations as described in further detail below, keys are stored in strings coupled to bit lines. A column or bit line address, which may be considered an address offset, of a bit line coupled to a string storing a key may identify an address where the associated record is stored.

CAM storage schemes may be useful or suitable for database applications, where the memory dies 104 store a plurality of records. Each record may have a unique identifier—such as a name of a place, person, or thing—and one or more attributes. A record may organize its attributes into fields. The memory system 100 may store the attributes, or a combination of attributes, as keys in the memory dies 104. Each data value of a key may represent a value (or values) of one or more attributes. The CAM memory may be searched via one or more keys. In some embodiments, the memory system 100 stores the fields of keys separately from the records, and the key is relatively short (in the number of bits) compared to the full record. In such embodiments, the memory system 100 stores the keys in a bit line arrangement and stores the rest of the records in a page arrangement.

An electronic device external to the memory system 100, such as a host device, may want to search a records database including the records to determine which of the records have a certain attribute value or a certain combination of attribute values. The certain attribute value(s) may be considered search criteria. To perform the search, the electronic device may issue or send a target key to the memory system 100 that identifies the search criteria (i.e., the attribute value(s)). Upon receipt of the target key, the memory system 100 may search the plurality of keys it is storing to see which keys include the attribute value(s) identified in the target key. The memory system 100 may search the plurality of keys by performing a CAM read operation. Various embodiments of a CAM read operation are described in further detail below. A key that includes the attributes value(s) identified in the target key matches the target key. Accordingly, a key that includes the attribute value(s) identified in the target key is called a matching key, and an instance of a key matching the target key is called a key match or a record match. A number of key matches is the number of keys that match the target keys or the value(s) associated with subset of keys.

Upon identifying the matching keys, the memory system 100 knows where the records associated with the matching keys are stored. Accordingly, in response to identifying or determining the matching keys, the memory system 100 reads the associated records from the memory dies and returns the associated records to the electronic device.

Various ways of retrieving the associated records may be possible. For example, the controller 102 may receive a target key from a host, and in response send the target key to a memory die 104 storing keys. In response, the memory die 104 searches for matching keys by performing a CAM read operation. Upon identifying a matching key, the memory die 104 may provide the matching key, or an address indicated by the matching key, back to the controller 102. The controller 102 may then use that matching key, or the address indicated by the matching key, to issue another read command to the memory dies 104, which in turn prompts the memory dies 104 to retrieve a record associated with the matching key, and send the record back the controller 102. The controller 102 may then send the retrieved record to the host. In other example configurations, when a memory die 104 identifies a matching key as a result of a CAM read operation, it is able to use the address indicated by the matching key to read the associated record from the memory dies 104 and return the record to the controller 102, without first having to send the matching key and/or its associated address to the controller 102.

As an example illustration, the memory dies 104 may store a records database that includes a plurality of records identifying automobiles, with each record belong to a specific automobile. Each record includes a plurality of attribute values associated with a plurality of attributes pertaining to a specific automobile. Example attributes include any of various attributes or properties of an automobile, such as manufacturer, model, type (sedan, truck, crossover, SUV, etc.), price, year manufactured, mileage, exterior color, etc. In addition, each record may have a plurality of attribute values associated with the plurality of attributes of the automobile record.

In furtherance of the example, an electronic device may want to find a collection of records identifying automobiles that are trucks with a blue exterior that have under 100,000 miles. Each of these terms—truck, blue exterior, and 100,000—represents an attribute value of the attributes automobile type, exterior color, and mileage. To find these records, the electronic device issues a target key that includes attribute values for truck, blue exterior, and 100,000. In response to receipt of the target key, the memory system 100 identifies which keys have the attribute value(s) truck, blue exterior, and 100,000. Upon identifying the matching keys, the memory system 100 knows where in the memory dies 104 the corresponding records are being stored, reads those records from the memory dies 104, and returns the records to the electronic device. Note that in this particular example, the memory system 100 would not have the ability to quickly search the CAM memory special structure for above or below certain values, only a match. Hence, in this example, the memory system 100 would look for a blue exterior truck and out of all the records matching that description, the mileage would be a second search task to be done by the host and not by the memory. Nevertheless, the ability to reduce all records only to those matching type ("truck") and color ("blue") only a very small subset would be sent to host for mileage search. Yet another option to still enable a search for mileage would be to divide mileage to groups for example group-1 would be mileage from 0 to 25K, a second group from 25K+1 to 50K, a third group from 50K+1 to 75K, etc. In this case, each group would get a key combination, and since it is shown how to search for Boolean expressions with multiple keys or a same key, then the memory system 100 would be able to search for records satisfying a logic OR operation on the first four groups.

Referring to FIG. 2B, the memory die 104 may further include a read/write circuit 144 that includes a plurality or a p-number of sense blocks (also referred to as sense modules or sense systems) 146. As described in further detail below, the sense blocks 146 are configured to participate in reading data from or programming data into word line cell groups of memory cells in parallel.

The memory die 104 may also include a row address decoder (or just row decoder) 148 and a column address decoder (or just column decoder) 150. The row decoder 148, which may also be referred to as a word line decoder, an x decoder, or an x-wire decoder, may decode a row address (also referred to as a word line address or an x address), and select a particular word line in the memory cell structure 142 corresponding to and/or identified by the decoded row address when reading data from or programming/writing data into to the memory cell structure 142. The column decoder 150, which may also be referred to as a bit line decoder, a y decoder, or a y-wire decoder, may decode a column address (also referred to as a bit line address or a y address), and select a particular bit line or group of bit lines in the memory cell structure 142 corresponding to and/or identified by the column address, when reading data from or programming data to the memory cell structure 142.

In addition, the non-volatile memory die 104 may include a peripheral circuit 152. The peripheral circuit 152 may include a control logic circuit (also referred to as a control logic, an on-chip controller, or an on-die controller) 154, which, at least in some example embodiments, may be implemented as a state machine, that is configured to control on-chip memory operations as well as send status information to the controller 102. The peripheral circuit 152 may also include an on-chip address decoder 156 that provides an address interface between addressing used by the controller 102 and/or a host and the addressing used by the row and column decoders 148, 150. In addition, the peripheral circuit 152 may include volatile memory 158. An example configuration of the volatile memory 158 may include latches, although other configurations are possible.

In addition, the peripheral circuit 152 may include a power control circuit 160 that is configured to generate and supply control line voltages (including voltage pulses) to control lines of the memory cell structure 142. The control line voltages include control gate line voltages supplied to control gate layers, bit line voltages supplied to bit lines, and source line voltages supplied to source lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit 160 may also be configured to generate and/or supply voltages other than the control line voltages, including other voltages that may be supplied to the memory cell structure 142, the read/write circuits 144, the sense blocks 146, and/or other circuit components on the memory die 104.

The power control circuit 160 may include any of various circuit topologies or circuit configurations to generate and/or supply the voltages at appropriate levels to perform memory operations, (including read, program/write, sense, and erase operations), such as driver circuits, current sources, charge pumps, reference voltage generators, regulators, and pulse generation circuits, or any of various combinations thereof. Other types of circuits to generate the voltages may be possible. In addition, the power control circuit 160 may communicate with and/or be controlled by the control logic circuit 154, the read/write circuits 144, and/or the sense blocks 146 in order to supply the voltages at appropriate levels and at appropriate times to carry out the memory operations.

Figure 6:
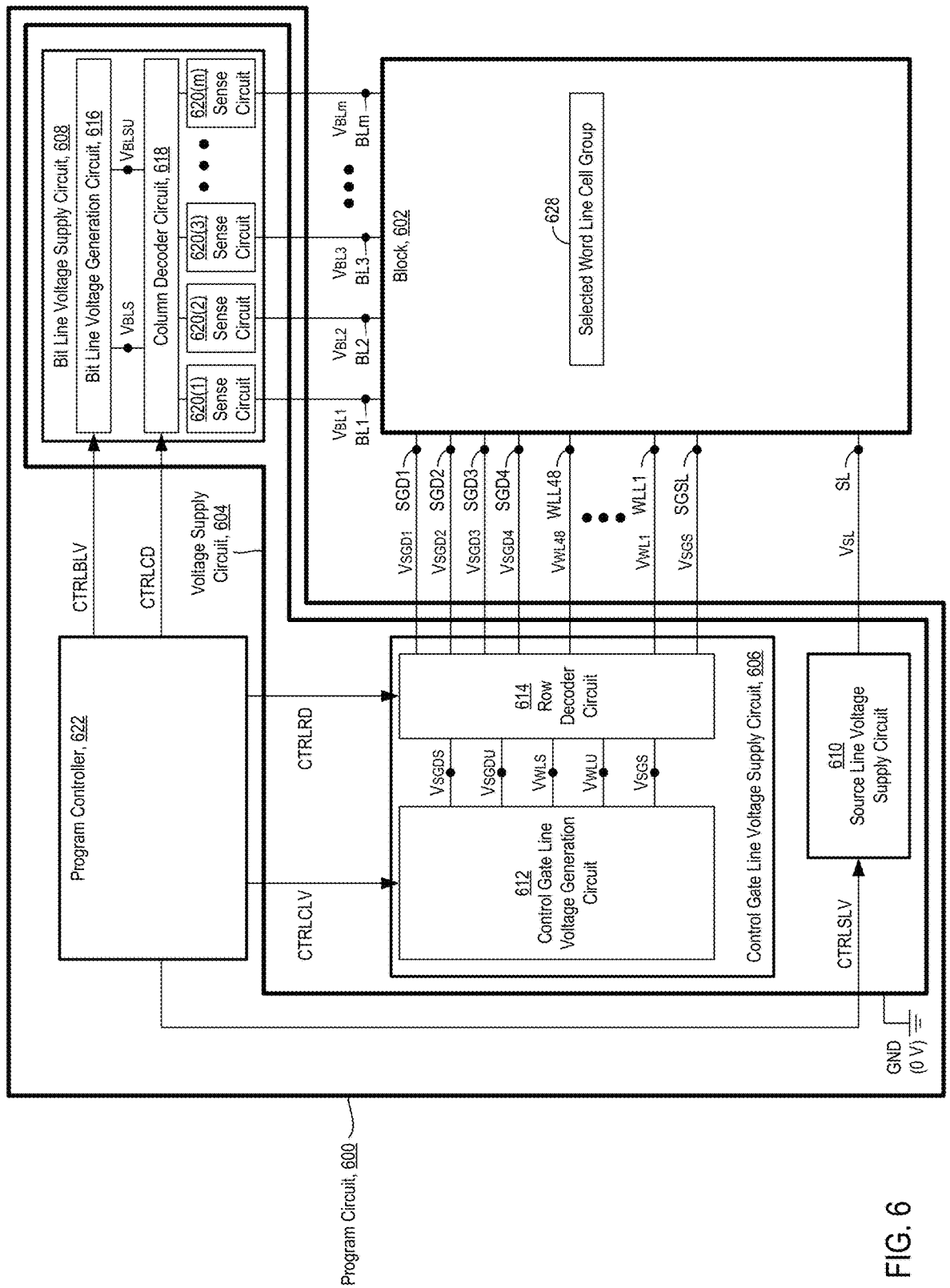
FIG. 6 is a block diagram of an example program circuit of the memory die of FIG. 2B, configured to program data into blocks.

FIG. 6 is a block diagram of an example program circuit 600 configured to perform program operations to program (write) data into a block 602. As used herein, a program circuit is a circuit, or a collection of circuits or circuit components, that programs or writes data into memory cells. In addition, for at least some example embodiments, a program circuit can verify the program status of memory cells that it programs. In particular example embodiments, a program circuit is located on the same memory die as the memory cells that it programs and/or verifies. Also, as used herein, a program operation (otherwise referred to as a write operation) is a sequence of steps that a program circuit performs to change an electrical and/or magnetic characteristic of memory cells such that the changed electrical and/or magnetic characteristic of one or more memory cells represents a data value.

The block 602 may be a block of the memory cell structure 142 of FIG. 2B, one of the blocks BLK in FIG. 3A, 3B, or 4A, have the physical construction or structure of the block 410 in FIGS. 4B, 4C, and/or have the circuit configuration of the block 480 in FIG. 4D. The block 602 includes a plurality of control lines, including a plurality of control gate line layers (or just control gate lines), a plurality of bit lines BL, and a source line SL. Corresponding to the block 480 of FIG. 4D, the block 602 includes an m-number of bit lines BL1 to BLm, and the control gate layers include four SGD lines SGD1, SGD2, SGD3, SGD4; forty-eight word line layers (or just word lines) WLL1 to WLL48; and an SGS line/layer SGSL.

The bit lines BL are configured to generate bit line voltages $V_{BL}$ (also or alternatively referred to as drain-side voltages or drain-side channel voltages) and apply the bit line voltages $V_{BL}$ to channels and associated NAND strings of the block 602. Each bit line BL is configured to generate a respective bit line voltage and apply the respective bit line voltage to an associated set of channels and associated NAND strings. As examples, a first bit line BL1 is configured to generate a first bit line voltage $V_{BL1}$ and apply the first bit line voltage $V_{BL1}$ to a first set of channels and associated NAND strings; a second bit line BL2 is configured to generate a second bit line voltage $V_{BL2}$ and apply the second bit line voltage $V_{BL2}$ to a second set of channels and associated NAND strings; a third bit line BL3 is configured to generate a third bit line voltage $V_{BL3}$ and apply the third bit line voltage $V_{BL3}$ to a third set of channels and associated NAND strings; and an mth bit line BLm is configured to generate an mth bit line voltage $V_{BLm}$ and apply the mth bit line voltage $V_{BLm}$ to an mth set of channels and associated NAND strings. The other bit lines BL4 to BL(m-1) not shown in FIG. 6 are similarly configured to generate respective bit line voltages and apply their respective bit line voltages to associated sets of channels and NAND strings.

In addition, the control gate lines are configured to generate control gate voltages and apply the control gate voltages to control gates of the bias elements to which the control gate lines are respectively coupled. As examples, a first SGD line SGD1 is configured to generate a first SGD line voltage $V_{SGD1}$ and apply the first SGD line voltage $V_{SGD1}$ to control gates of SGD transistors coupled to the first SGD line SGD1; a second SGD line SGD2 is configured to generate a second SGD line voltage $V_{SGD2}$ and apply the second SGD line voltage $V_{SGD2}$ to control gates of SGD transistors coupled to the second SGD line SGD2; a third SGD line SGD3 is configured to generate a third SGD line voltage $V_{SGD3}$ and apply the third SGD line voltage $V_{SGD3}$ to control gates of SGD transistors coupled to the third SGD line SGD3; and a fourth SGD line SGD4 is configured to generate a fourth SGD line voltage $V_{SGD4}$ and apply the fourth SGD line voltage $V_{SGD4}$ to control gates of SGD transistors coupled to the fourth SGD line SGD4. In addition, a first word line WLL1 is configured to generate a first word line voltage $V_{WL1}$ and apply the first word line voltage $V_{WL1}$ to control gates of memory cells coupled to the first word line WLL1; and a forty-eighth word line WLL48 is configured to generate a forty-eighth word line voltage $V_{WL48}$ and apply the forty-eighth word line voltage $V_{WL48}$ to control gates of memory cells coupled to the forty-eighth word line WLL48. The other word lines WLL2 to WLL47 not shown in FIG. 6 are similarly configured to generate respective word line voltages and apply their respective word line voltages to memory cells to which the word lines are coupled. In addition, the SGS line SGSL is configured to generate an SGS line voltage $V_{SGS}$ and apply the SGS line voltage $V_{SGS}$ to SGS transistors coupled to the SGS line SGSL. Also, as shown in FIG. 6, the source line SL is configured to generate a source line voltage $V_{SL}$ and apply the source line voltage $V_{SL}$ to source ends of channels and associated NAND strings to which the source line SL is coupled.

The program circuit 600 performs program operations to program data into selected memory cells. As used herein, a selected memory cell of a program operation is a memory cell that is programmed during the program operation. In addition or alternatively, a selected memory cell of a program operation is a memory cell that changes its memory state from an initial memory state to a target memory state during the program operation. An initial memory state of a selected memory cell is the memory state of the memory cell at the start of the program operation. A target memory state is the memory state that the memory cell is to be in at the end of the program operation in order for data to be correctly stored in the memory cell. For at least some program operations, the initial memory state for a selected memory cell is the erase state. For such program operations, a selected memory cell is a memory cell that changes its memory state from the erase state to a program state. In addition or alternatively, a selected memory cell of a program operation is a memory cell that changes a level, value, or state of a storage parameter in order to change its memory state from an initial memory state to a target memory state.

At least for NAND technology, a selected memory cell of a program operation is a memory cell that changes a level of its threshold voltage from an initial threshold voltage level to a target threshold voltage level in order to change its memory state from an initial memory state to a target memory state during the program operation. An initial threshold voltage level of a selected memory cell is the threshold voltage level of the target memory cell at the start of a program operation, and is a threshold voltage level that is within a range of threshold voltage levels that corresponds to the initial memory state of the selected memory cell. A target threshold voltage level of a selected memory cell is a threshold voltage level that is within a range of threshold voltage levels that corresponds to the target memory state of the selected memory cell. In addition, at least for NAND technology, a selected memory cell of a program operation is a memory cell that changes its threshold voltage level from an initial threshold voltage level to a target threshold voltage level in response to at least one program voltage pulse (or just program pulse) during the program operation.

In addition, memory cells that are not the subject of a program operation are referred to as unselected memory cells. Otherwise stated, an unselected memory cell of a program operation is a memory cell that is not programmed during a program operation. An unselected memory cell may be a memory cell that stays or remains in its initial memory state throughout the duration of the program operation.

In particular example embodiments, the program circuit 600 confines a program operation to a particular region or portion of the memory cell structure 142. For such embodiments, the selected memory cells include a first portion or first group of the particular region, and the unselected memory cells include a second portion or second group of the particular region.

At least for NAND technology, the program circuit 600 confines a program operation to a block. The selected memory cells of a program operation are part of a first set or group of the memory cells of the block, and the unselected memory cells are part of a second set or group of the memory cells of the block, namely those memory cells that are not the selected memory cells. In particular example embodiments, the selected memory cells of a program operation are disposed in the same word line (or word line layer) and/or are configured to be biased by the same word line (or word line layer). In further particular embodiments, the selected memory cells of a program operation include only those memory cells that are part of the same or a single word line cell group.

The program circuit 600 may perform a program operation over one or more program loops. A program loop, also referred to as a program cycle or a program iteration, is at least a portion of a program operation during which a program circuit performs a discrete set of program actions to move the memory states of selected memory cells into their respective target memory states (the target states represent/ encode data values). In certain embodiments, a program loop includes a verify stage configured to determine which cells have reached one or more target states. As described in further detail below, the discrete set of program actions may include applying a discrete set of biases, such voltages or current levels, to control lines of the block 602 in order to change the levels, magnitudes, values, or states of the storage parameters of at least some of the selected memory cells. One of the discrete set of program actions includes applying a program pulse to a selected word line.

In the event that the program circuit 600 is unable to program all of the selected memory cells in a single program loop with a single discrete set of program actions, the program circuit 600 may perform a plurality of program loops, such as sequentially or consecutively, until the selected memory cells are programmed in their respective target memory states. Where the program circuit 600 performs a plurality of program loops to program the selected memory cells into their target memory states, the program circuit 600 may perform a plurality of sets of discrete program actions, each in a different one of the plurality of program loops.

At any given moment in time during a program operation, a selected memory cell can have an associated program status, which can be one of three different program statuses, including a sufficiently programmed status, an insufficiently programmed status, and an over-programmed status. A selected memory cell that has a sufficiently programmed status is a sufficiently programmed memory cell, which is a memory cell that is in or has reached its target memory state. A selected memory cell that has an insufficiently programmed status is an insufficiently programmed memory cell, which is a memory cell that has not yet reached its target memory state. A selected memory cell that has an over-programmed status is an over-programmed memory cell, which is a memory cell that is not in its target memory state, and that cannot be moved into its target memory state through further performance of one or more discrete sets of program actions.

After the program circuit 600 performs a program loop, the program circuit 600 determines whether all of the selected memory cells are sufficiently programmed. If all of the selected memory cells are sufficiently programmed, then the program circuit 600 ends the program operation. Alternatively, if at least one of the selected memory cells is insufficiently programmed, then the program circuit 600 performs a next program loop. The program circuit 600 may iterate through the program loops until the program circuit 600 determines that all of the selected memory cells are sufficiently programmed, or the program circuit 600 identifies that a timeout event has occurred, which causes the program circuit 600 to end the program operation. In one example configuration, the timeout event is a number of program loops reaching a predetermined maximum number of program loops. Other timeout events may be possible.

In addition, the program circuit 600 may perform discrete sets of program actions during program stages in the program loops. At least for NAND technology, a set of program actions that the program circuit 600 performs during a given program stage includes biasing the control gates and channels of a block with a set of program voltages. Each program voltage may be at one of a plurality of program levels associated with the given program stage.

In a program stage, the set of program voltages with which the program circuit 600 biases the control gates and channels includes a program selected memory cell gate voltage, a program unselected memory cell gate voltage, a program selected SGD gate voltage, a program unselected SGD gate voltage, a program SGS gate voltage, a program selected drain-side voltage, a program unselected drain-side voltage, and a program source-side voltage. The program circuit 600 biases control gates of selected memory cells with a program selected memory cell gate voltage during a program stage to move selected memory cells into or toward their target memory states, such as by increasing their respective threshold voltages. The program circuit 600 biases, with the program unselected memory cell gate voltage, control gates of unselected memory cells during a program stage. The program circuit 600 biases, with the program selected SGD gate voltage, control gates of SGD transistors coupled to selected memory cells during a program stage. The program circuit 600 biases, with the program unselected SGD gate voltage, control gates of SGD transistors coupled to unselected memory cells during a program stage. The program circuit 600 biases, with the program SGS gate voltage, control gates of SGS transistors during a program stage. The program circuit 600 biases, with the program selected drain-side voltage, drain ends of channels coupled to program-enabled memory cells during a program stage. The program circuit 600 biases, with the program unselected drain-side voltage, drain ends of channels coupled to program-inhibited memory cells during a program stage. The program circuit 600 biases, with the program source-side voltage, the source ends of channels during a program stage.

The program circuit 600 is configured to bias the control gates and channels with the program voltages during the program stages by way of the control lines of the block 602, including the control gate lines SGD, WLL, SGSL, the bit lines BL, and the source line SL. In particular, the program circuit 600 is configured to bias the control gates of the memory cells, the SGD transistors, and the SGS transistors with the program voltages by way of the word lines WLL, the SGD lines, and the SGS line, respectively. The program circuit 600 is configured to bias the drain ends of the channels with the program drain-side voltages. The program circuit 600 is configured to bias the source ends of the channels with the program source-side voltages.

In this context, the program voltages are also or alternatively referenced or labeled with respect to the control lines biasing the control gates and channels. In particular, the program selected memory cell gate voltages are referred to as program selected word line voltages, the program unselected memory cell gate voltage are referred to as program unselected word line voltages, the program selected drain-side voltages are referred to as program selected bit line voltages, the program unselected drain-side voltages are referred to as program unselected bit line voltages, the program unselected source-side voltages are referred to as program source line voltages, the program SGS gate voltages are referred to as program SGS line voltages, the program selected SGD gate voltages are referred to as program selected SGD line voltages, and the program unselected SGD gate voltages are referred to as program unselected SGD line voltages.

In order to bias the control lines of the block, and in turn the control gates and the channels with the program voltages, the program circuit 600 may include a voltage supply circuit 604 that supplies the program voltages to the control lines. Through supply of the program and verify voltages to the control lines, the voltage supply circuit 604 applies the program voltages to the control lines, biases the control lines with the program voltages, and/or generates the program voltages on the control lines. From the perspective of the control lines, a control line receives, is supplied with, or is biased with a program voltage from the voltage supply circuit 604, biases respective control gates or channels with the program voltage it receives, applies the program voltage it receives to respective control gates or channels, generates a program voltage in response to receipt of the program voltage it receives from the voltage supply circuit 604, generates the program voltage at a level of the program voltage it receives, applies the program voltage it generates to a respective control gate or channel, or biases a respective control gate or channel with the program voltage it generates in response to the program voltage it receives. These terms and phrases to describe how the program circuit 600 biases the control gates and channels of the block 602 with the program voltages through supply of the program voltages to the control lines of the block 602 are generally used interchangeably herein, unless expressly described otherwise.

As indicated in FIG. 6, the voltage supply circuit 604 may be configured to generate the program voltages, and/or cause the control lines to generate their respective voltages at levels relative to a ground reference GND having a ground reference voltage level of 0 V. However, some voltages during some of the program stages may be generated at levels referenced to a different reference point other than the ground reference GND, such as the source line SL for example. Herein, voltage levels may be presumed to be indicated with reference to the ground reference voltage level of 0 V, unless expressly described otherwise.

In the example configuration in FIG. 6, the voltage supply circuit 604 includes three voltage supply circuits that supply the program voltages to the control lines, including a control gate line voltage supply circuit 606, a bit line voltage supply circuit 608, and a source line voltage supply circuit 610. The control gate line voltage supply circuit 606 is configured to supply or apply the program voltages to the control gate lines of the block 602. In particular, the control gate line voltage supply circuit 606 is configured to supply the program selected and unselected word line voltages to the word lines WLL, the program selected and unselected SGD line voltages to the SGD lines, and the program SGS line voltages to the SGS line. The bit line voltage supply circuit 608 is configured to supply or apply the program selected and unselected bit line voltages to the bit lines BL of the block 602. The source line voltage supply circuit 610 is configured to supply or apply the program source line voltages to the source line SL of the block 602. Other ways of configuring the voltage supply circuit 604 may be possible.

In addition, in the example configuration in FIG. 6, the control gate line voltage supply circuit 606 and the bit line voltage supply circuit 608 each include two circuit components, a voltage generation circuit and a decoder circuit. In general, a voltage generation circuit generates voltages supplied to control lines, and a decoder circuit selectively routes the generated voltages to the control lines.

In further detail, the control gate line voltage supply circuit 606 includes a control gate line voltage generation circuit 612 and a row decoder circuit 614. The control gate voltage generation circuit 612 may represent at least a portion of the power control circuit 160 of FIG. 2B. The row decoder circuit 614 may represent at least a portion of the row decoder 148 of FIG. 2B.

The control gate voltage generation circuit 612 is configured to generate a plurality or a set of control gate line voltages, including a selected word line voltage $V_{WLS}$, an unselected word line voltage $V_{WLU}$, a selected SGD line voltage $V_{SGDS}$, an unselected SGD line voltage $V_{SGDU}$, and a SGS line voltage $V_{SGS}$. In addition, the control gate line voltage generation circuit 612 may be configured to adjust the levels of the control gate line voltages as the program circuit 600 transitions from one memory operation to another, or between stages within a single memory operation. The control gate line voltage generation circuit 612 generates program control gate line voltages or control gate line voltages at program levels during program operations. In general, as used herein, phrases or terms such as "generating a program voltage" and "generating a voltage at a program level"—as well as other similar phrases or terms such as "supplying a program voltage" and "supplying a voltage at a program level"; "applying a program voltage" and "applying a voltage at a program level"; or "biasing a control line with program voltage" and "biasing a control line with a voltage at a program level"—are generally used interchangeably, unless expressly described otherwise.

In addition, the control gate line voltage generation circuit 612 may be configured to generate the control gate line voltages at different program levels for different program stages. For example, for at least some program operations, the control gate line generation circuit 612 may be configured to generate the selected word line voltage $V_{WLS}$ in the form of program gate voltage pulses (or just program voltage pulses or program pulses) at different program pulse levels in or during different program stages.

The row decoder circuit 614 is a circuit that selectively routes or supplies the control gate line voltages to the control gate lines. The row decoder circuit 614 may include a set of input terminals that receives the control gate line voltages from the control gate line voltage generation circuit 612. In addition, the row decoder circuit 614 may include a set of output terminals coupled to the control gate lines. The row decoder 614 may selectively route or supply the control gate line voltages it receives at its input terminals from the control gate voltage generation circuit 612 to its output terminals for supply or application to the control gate lines.

The row decoder circuit 614 is configured to selectively route or supply the control gate line voltages in that the row decoder 614 may route the control gate line voltages to different control gate lines at different times within the same program operation or during different program operations, depending on the memory cells of the block 602 that are selected, unselected for different program operations or for different program stages within the same program operation. As an example, the row decoder circuit 614 may supply the selected word line voltage $V_{WLS}$, such as in the form of one or more program pulses, to a first word line during a first program operation, and may supply the selected word line voltage $V_{WLS}$, such as in the form of one or more program pulses, to a second, different word line during a second program operation.

The row decoder circuit 614 may have any of various circuit configurations to selectively route or supply the control gate line voltages to the control gate lines. For at least some example configurations, the row decoder circuit 614 may include a plurality of switches (e.g., transistors) that turn on and off to selectively connect the input terminals to the output terminals. The on and off states of the switches may form conductive paths between the input and output terminals of the row decoder 614 that selectively supply or route the control gate line voltages. The switches may have any of various configurations, such as single-tier or multi-tier (or tree) configurations. For a given program operation or a given program stage, a given overall state of the control gate switches configured in on and off states may determine how the row decoder circuit 614 routes the control gate line voltages to the various control gate lines of the block 602.

In addition, the bit line voltage supply circuit 606 includes a bit line voltage generation circuit 616 and a column decoder circuit 618. The bit line voltage generation circuit 616 may represent at least a portion of the power control circuit 160 of FIG. 2B. The column decoder circuit 618 may represent at least a portion of the column decoder 148 of FIG. 2B.

The bit line voltage generation circuit 616 is configured to generate a plurality or a set of bit line voltages, including a selected bit line voltage $V_{BLS}$ and an unselected bit line voltage $V_{BLU}$. During program operations, the bit line voltage generation circuit 616 may be configured to set the bit line voltages to program levels for program stages. Accordingly, during program operations, the bit line voltage generation circuit 616 generates program bit line voltages or bit line voltages at program levels. In addition, the control gate voltage generation circuit 616 may be configured to adjust the levels of the bit line voltages as the program circuit 600 transitions from one program operation to another, or between stages of a single program operation.

The column decoder circuit 618 is a circuit that selectively routes or supplies the bit line voltages to the bit lines. The column decoder circuit 618 may include a set of input terminals that receives the bit line voltages from the bit line voltage generation circuit 616. In addition, the column decoder circuit 618 may include a set of output terminals coupled to the bit lines. The column decoder 618 may selectively route or supply the selected and unselected bit line voltages it receives at its input terminals from the bit line voltage generation circuit 616 to its output terminals for supply or application to the bit lines.

The column decoder circuit 618 is configured to selectively route or supply the bit line voltages in that the column decoder 618 may route the bit line voltages to different bit lines at different times within the same program operation or during different program operations. As an example, during a first program stage, the column decoder circuit 618 may supply the selected bit line voltage $V_{BLS}$ at an associated program level to a first set of the bit lines BL, and supply the unselected bit line voltage $V_{BLU}$ at an associated program level to a second set of the bit lines BL. Then, during a second program stage, the column decoder circuit 618 may supply the selected bit line voltage $V_{BLS}$ at an associated program level to a third set of the bit lines BL, and supply the unselected bit line voltage $V_{BLU}$ at an associated program level to a fourth set of the bit lines BL. The first and third bit line sets receiving the selected bit line voltage $V_{BLS}$ may include bit lines that are the same or different from each other, or have some bit lines that are the same and some that are different. Similarly, the second and fourth bit line sets receiving the unselected bit line voltage $V_{BLU}$ may include bit lines that are the same or different from each other, or have some bit lines that are the same and some that are different.

The column decoder circuit 618 may have any of various circuit configurations to selectively route or supply the bit line voltages to the bit lines BL. For at least some example configurations, the column decoder circuit 618 may include a plurality of switches (e.g., transistors) that turn on and off to selectively connect the input terminals to the output terminals. The on and off states of the switches may form conductive paths between the input and output terminals of the column decoder 618 that selectively supply or route the bit line voltages. The switches may have any of various configurations, such as single-tier or multi-tier (or tree) configurations. For a given program operation or a given program stage of the program operation, a given overall state of the switches configured in on and off states may determine how the column decoder circuit 618 routes the bit line voltages to the various bit lines of the block 602.

For some example configurations, such as the one shown in FIG. 6, the output terminals of the column decoder circuit 618 are coupled to the bit lines BL by way of a plurality of sense circuits 620 configured to perform sense operations to sense program statuses of selected memory cells during verify stages, including verify sub-stages, of program operations. Details of the sense circuits 620 and sense operations are described in further detail below.

In the example configuration in FIG. 6, the plurality of sense circuits 620 includes an m-number of sense circuits 620(1) to 620(m), with each sense circuit 620 coupled to a respective one of the m-number of bit lines BL1 to BLm. Other sense circuit configurations may be possible. For example, the number of sense circuits 620 may be less than the number of bit lines BL of a block. In addition or alternatively, one sense circuit 620 may be coupled to different bit lines of different blocks. For example, the first sense circuit 620(1) may be coupled to the first bit line BL1 of the block 602, and may be coupled to a different first bit line BL1 of a different block of the memory cell structure 142. Other sense circuit configurations are possible, as described in further detail below.

For some example configurations, the bit line voltages output from the column decoder 618 may directly pass through the sense circuits 620 such that the levels of the bit line voltages as they are received by the bit lines BL are the same or substantially the same as their levels at the output terminals of the column decoder circuit 618. In other example configurations, the sense circuits 620 may each include any of various circuit components, such as resistors, capacitors, and/or semiconductor devices (e.g., transistors) as non-limiting examples, that alter the voltage levels of the bit line voltages they receive, such as by reducing the levels. In particular example configurations, the sense circuits 620 each include a respective semiconductor device, such as a transistor, that receives a bit line voltage from the column decoder 618. The semiconductor devices may include respective first terminals, such as gate terminals, that receive the bit line voltages from the column decoder circuit 618. The semiconductor devices may further include respective second terminals, such as source terminals, that output the bit line voltages onto the bit lines BL by lowering the bit line voltages by a threshold voltage level from the level at which the bit line voltages were received at their first (gate) terminals. Various ways of supplying bit line voltages to bit lines by way of sense circuits may be possible.

The program circuit 600 may further include a program controller 622. A program controller is a component, or module, designed, and built, to control program operations. In certain embodiments, a program controller may comprise hardware, firmware (or software), or a combination of hardware and firmware (or software). For example, a program controller may include or be a component of an integrated circuit (IC), such as an application specific integrated circuit (ASIC) or a field programmable gate array (FPGA), a circuit, a digital logic circuit, an analog circuit, a combination of discrete circuits, gates, or any other type of hardware or combination thereof. In addition, or alternatively, a program controller may include memory hardware that comprises instructions executable with a processor or processor circuitry to implement one or more of the features of the program controller. A program controller, which may be an on-die NAND program controller in certain embodiments, can take the form of processing circuitry, a microprocessor or processor, and a computer-readable medium (e.g., a non-transitory computer readable storage medium) that stores computer-readable program code (e.g., software or firmware) executable by the (micro)processor, logic gates, switches, an application specific integrated circuit (ASIC), a programmable logic controller, and an embedded microcontroller.

Additionally, a program controller controls when program operations begin and when they end. In addition, a program controller controls when program stages within a program operation begin and end. A program controller controls the transitions of stages from one stage to a next stage, and controls the transitions of program loops from one program loop to a next program loop.

In addition, a program controller sets the voltages at program levels on the control lines of a block, applies or supplies voltages at program levels to the control lines of a block, and/or biases control lines of a block with voltages at program levels. A program controller may do so by controlling the voltage levels of the voltages that a voltage supply circuit generates and supplies, and when the voltage supply circuit generates and supplies the voltages at their particular levels. For example, a program controller controls whether and/or when selected and unselected voltages are generated at associated program levels. In addition, a program controller sets the voltages on the control lines, applies or supplies the voltages to the control lines, and/or biases control lines with the voltages by controlling how voltages are routed to control lines of a block, and can change which voltages are routed to which control lines. Accordingly, as used herein unless expressly described otherwise, reference to or description of the program controller 622 setting a voltage on a control line is used interchangeably with the program controller 622 controlling the voltage supply circuit 604 (or one of its components) to set a voltage on a control line; the program controller 622 applying or supplying a voltage to a control line is used interchangeably with the program controller 622 controlling the voltage supply circuit 604 (or one of its components) to supply or apply a voltage on a control line; and the program controller 622 biasing a control line with a voltage is used interchangeably with the program controller 622 controlling the voltage supply circuit 604 (or one of its components) to bias a control line with a voltage.

In addition, a program controller may also determine where to store data. For example, a program controller may determine that data is to be stored, and identify a collection of memory cells into which to store or program the data, such as by identifying a plane, a block, a word line, and/or a word line cell group that includes the collection of memory cells. The program controller may identify that collection of memory cells as the selected memory cells of a program operation.

A program controller may determine where to store data in response to receipt of address information from the controller 102 (FIG. 2A) or otherwise identify a unique physical address (e.g., one that includes a particular plane, a particular block, a particular word line, and/or a particular word line cell group) that identifies a physical location of the selected memory cells into which to program the data.

In addition, a program controller may know or determine a storage scheme under which data is be stored in selected memory cells. By knowing the storage scheme, a program controller may know whether to program the selected memory cells as SLC cells or MLC cells, as defined by the storage scheme. In addition, where the selected memory cells are to be programmed as MLC cells, the program controller may know the number of bits-per-cell each of the MLC cells are configured to store, as defined by the storage scheme. A program controller may control the biasing on the control lines in order program the selected memory cells as SLC cells or MLC cells, in accordance with the storage scheme.

A program controller may also identify the data values of the data to be programmed into the selected memory cells. A program controller may know which data values are to be stored in which memory cells of the selected memory cells. Based on this knowledge, the program controller may know the target memory states of each of the selected memory cells of a program operation. In turn, the program controller may determine, during the course of the program operation, which selected memory cells are sufficiently programmed and which selected memory cells are insufficiently programmed.

In further detail with respect to example configuration FIG. 6, the program controller 622 may be configured to set the voltages on the control lines at certain levels and during certain program stages in order to perform program operations. To do so, the program controller 622 is configured to control the voltage supply circuit 604 to supply, apply, or output the program voltages to the control lines during program stages of program operations.

With respect to the control gate line voltage supply circuit 606, the program controller 622 is configured to control the control gate line voltage supply circuit 606 to supply, apply, or output the control gate line voltages $V_{SGDS}$, $V_{SGDU}$, $V_{WLS}$, $V_{WLU}$, $V_{SGS}$ to the control gate lines at program levels during program stages. The program controller 622 may control the control gate line voltage generation circuit 612 to generate the control gate line voltages $V_{SGDS}$, $V_{SGDU}$, $V_{WLS}$, $V_{WLU}$, $V_{SGS}$ at associated program levels during program stages. In some example configurations, as shown in FIG. 6, the program controller 622 may output a control gate line voltage control signal CTRLCLV to control the control gate line voltage generation circuit 612 to generate the control gate line voltages $V_{SGDS}$, $V_{SGDU}$, $V_{WLS}$, $V_{WLU}$, $V_{SGS}$ at the associated program levels, or otherwise output the control gate line voltages $V_{SGDS}$, $V_{SGDU}$, $V_{WLS}$, $V_{WLU}$, $V_{SGS}$ as program voltages to the row decoder circuit 614.

In addition, the program controller 622 is configured to control the row decoder circuit 614 by configuring the row decoder 614 in any of various states to route the control gate line voltages $V_{SGDS}$, $V_{SGDU}$, $V_{WLS}$, $V_{WLU}$, $V_{SGS}$ to the control gate lines in order to program the selected memory cells. As shown in FIG. 6, the program controller 622 may control the row decoder circuit 614 by outputting a row decoder control signal CTRLRD to the row decoder circuit 614. The row decoder circuit 614 may respond to the row decoder control signal CTRLRD by being configured in a state corresponding to a level or value of the row decoder control signal CTRLRD, such as by turning on an off various switches. The program controller 622 may output the row decoder control signal CTRLRD based on physical address information identifying the selected memory cells.

With respect to the bit line voltage supply circuit 608, the program controller 622 is configured to control the bit line voltage supply circuit 606 to supply, apply, or output the bit line voltages $V_{BLS}$, $V_{BLU}$ to the bit lines at program levels during program stages. The program controller 622 may control the bit line voltage generation circuit 616 to generate the bit line voltages $V_{BLS}$, $V_{BLU}$ at associated program levels during program stages. In some example configurations, as shown in FIG. 6, the program controller 622 may output a bit line voltage control signal CTRLBLV to control the bit line voltage generation circuit 616 to generate the bit line voltages $V_{BLS}$, $V_{BLU}$ at the associated program levels, or otherwise output the bit line voltages $V_{BLS}$, $V_{BLU}$ as program voltages to the column decoder circuit 618.

In addition, the program controller 622 is configured to control the column decoder circuit 618 by configuring the column decoder 618 in any of various states to route the bit line voltages $V_{BLS}$, $V_{BLU}$ to the bit lines in order to program the selected memory cells. As shown in FIG. 6, the program controller 622 may control the column decoder circuit 618 by outputting a column decoder control signal CTRLCD to the column decoder circuit 618. The column decoder circuit 618 may respond to the column decoder control signal CTRLCD by being configured in a state corresponding to a level or value of the column decoder control signal CTRLCD, such as by turning on and off various switches.

The program controller 622 may output the column decoder control signal CTRLCD based on physical address information identifying the selected memory cells. In addition, the program controller 622 may output the column decoder control signal CTRLCD based on the program statuses of the selected memory cells. Based on the program statuses, the program controller 622 may output the column decoder control signal CTRLCD so that the column decoder 618 routes or supplies the selected bit line voltage $V_{BLS}$ to bit lines coupled to insufficiently programmed selected memory cells, and routes or supplies the unselected bit line voltage $V_{BLU}$ to bit lines coupled to sufficiently programmed selected memory cells during program stages.

With respect to the source line voltage supply circuit 610, the program controller 622 is configured to control the source line voltage supply circuit 610 to supply, apply, or output the source line voltage $V_{SL}$ to the source line SL at program levels during program stages. In some example configurations, as shown in FIG. 6, the program controller 622 may output a source line voltage control signal CTRLSLV to control the source line voltage supply circuit 610 to generate the source line voltage $V_{SL}$ at the associated program level.

During a program operation, the program controller 622 configures the word lines, the bit lines, and the SGD lines of the block 602 in selected states and unselected states in order to program selected memory cells into their target memory states while keeping the unselected memory cells in their initial memory states. A word line in a selected state is referred to as being selected and/or as a selected word line. A word line in an unselected state is referred to as being unselected and/or as an unselected word line. A bit line in a selected state is referred to as being selected and/or as a selected bit line. A bit line in an unselected state is referred to as being unselected and/or as an unselected bit line. An SGD line in a selected state is referred to as being selected and/or as a selected SGD line. An SGD line in an unselected state is referred to being unselected and/or as an unselected SGD line.

A selected word line (or selected word line layer) of a program operation is a word line (or word line layer) that is coupled to selected memory cells during a program operation. A selected word line may perform different roles or different functions during program stages of a program operation. At least for NAND technology, during a program stage, a selected word line applies a selected word line voltage at an associated program level, referred to as a program gate voltage pulse (or just program voltage pulse or program pulse), to selected memory cells and/or biases selected memory cells with a program pulse, such as by applying a program pulse to control gates of selected memory cells, and/or by biasing the control gates of selected memory cells with a program pulse during the program stage.

An unselected word line (or unselected word line layer) of a program operation is a word line (or word line layer) that is not coupled to any selected memory cells during a program operation. In addition or alternatively, an unselected word line of a program operation is a word line that does not apply at least one program pulse to at least one selected memory cell to at least one selected memory cell during the program operation. For program operations that are confined to a particular region of the memory cell structure 142, the unselected word lines are those word lines in the particular region that are not the selected word line. For example, for a program operation where the selected memory cells are coupled to the same word line (or disposed in the same word line layer), the unselected word lines are the word lines of the block that are not the selected word line.

A selected bit line of a program operation is a bit line that enables or allows a selected memory cell coupled to the selected bit line to be programmed. An unselected bit line of a program operation is a bit line that inhibits, prevents, or locks out a selected memory cell coupled to the unselected bit line from being programmed or verified. During a program stage of a program operation, an unselected bit line is a bit line that configures a selected memory cell in a program-inhibit state to inhibit, prevent, or lock out the selected memory cell from being programmed during the program stage.

In addition, a selected SGD line of a program operation is a SGD line that enables or allows selected memory cells coupled to the SGD line to be programmed or verified. During a program stage of a program operation, a selected SGD line is a SGD line that configures a selected memory cell in a program-enable state to allow or enable the selected memory cell to be programmed during the program stage. An unselected SGD line of a program operation is an SGD line that inhibits, prevents, or locks out unselected memory cells coupled to the SGD line from being programmed or verified. The SGD line may inhibit, prevent, or lock out these unselected memory cells from being programmed or verified even though they may be coupled to selected bit lines and/or selected word lines. During a program stage of a program operation, an unselected memory cell disposed in the same word line layer as a selected memory cell may be coupled to a selected bit line during the program stage. The unselected SGD line coupled to that unselected memory cell is an SGD line that configures the unselected memory cell in the program-inhibit state so that the unselected memory cell is not programmed during the program stage despite being coupled to the selected bit line.

At any given point in time during a program operation, the word lines, the bit lines, and the SGD lines have respective selected statuses. A selected status of a control line is a status identifier that identifies whether the control line is a selected control line or an unselected control line. During the course or duration of a program operation, the selected status of a control line may stay the same or may change. For a selected status of a control line that changes, the change may be from the selected state to the unselected state, or from the unselected state to the selected state. In addition, for a selected status of a control line that changes, the change may occur within a single program loop or across multiple program loops.

The program controller 622 may identify each of the word lines WLL, the bit lines BL, and the SGD lines as selected or unselected, and configure each of the word lines WLL, the bit lines BL, and the SGD lines in selected and unselected states according to the identifications. In particular, according to the identifications, the program controller 622 configures each of the word lines WLL as a selected word line or an unselected word line, configures each of the bit lines BL as a selected bit line or an unselected bit line, and configures each of the SGD lines as a selected SGD line or an unselected SGD line.

The program controller 622 configures each of the word lines WLL, the bit lines BL, and the SGD lines in selected and unselected states by supplying or biasing them with respective selected and unselected voltages. In particular, the program controller 622 configures a word line as a selected word line by supplying or applying the selected word line voltage $V_{WLS}$ to that word line and/or by biasing the word line with the selected word line voltage $V_{WLS}$. The word line receiving or biased with the selected word line voltage $V_{WLS}$ becomes or is configured as a selected word line and generates a selected word line voltage by generating its voltage at a selected word line level. Similarly, the program controller 622 configures a word line as an unselected word line by supplying or applying the unselected word line voltage $V_{WLU}$ to that word line and/or by biasing the word line with the unselected word line voltage $V_{WLU}$. The word line receiving or biased with the unselected word line voltage $V_{WLU}$ becomes or is configured as an unselected word line and generates an unselected word line voltage by generating its voltage at an unselected word line level.

In a similar manner, the program controller 622 configures a SGD line as a selected SGD line by supplying or applying the selected SGD line voltage $V_{SGDS}$ to that SGD line and/or by biasing the SGD line with the selected SGD line voltage $V_{SGDS}$. The SGD line receiving or biased with the selected SGD line voltage $V_{SGDS}$ becomes or is configured as a selected SGD line and generates a selected SGD line voltage by generating its voltage at a selected SGD level. Similarly, the program controller 622 configures a SGD line as an unselected SGD line by supplying or applying the unselected SGD line voltage $V_{SGDU}$ to that SGD line and/or by biasing the SGD line with the unselected SGD line voltage $V_{SGDU}$. The SGD line receiving or biased with the unselected SGD line voltage $V_{SGDU}$ becomes or is configured as an unselected SGD line and generates an unselected SGD line voltage by generating its voltage at an unselected SGD level.

The selected and unselected levels at which the word lines and SGD lines generate their respective voltages may be the same as or different than the voltage levels of the selected and unselected word line and SGD line voltages $V_{WLS}$, $V_{WLU}$, $V_{SGDS}$, $V_{SGDU}$. For example, the row decoder circuit 614 may provide a voltage drop such that the selected and unselected word lines and SGD lines are biased with or generate their respective selected and unselected voltages at levels that are lower than the levels at which the control gate line voltage generation circuit 612 generates the selected and unselected word line and SGD line voltages $V_{WLS}$, $V_{WLU}$, $V_{SGDS}$, $V_{SGDU}$. For such example configurations, the control gate line voltage generation circuit 612 is configured to generate the selected and unselected word line and SGD line voltages $V_{WLS}$, $V_{WLU}$, $V_{SGDS}$, $V_{SGDU}$, as well as the SGS line voltage $V_{SGS}$ at sufficiently high levels to achieve appropriate biasing of the control gate lines SGD, WLL, SGSL.

For some example configurations, the selected and unselected word line and SGD line voltages $V_{WLS}$, $V_{WLU}$, $V_{SGDS}$, $V_{SGDU}$ are be referred to as global selected and unselected voltages, and the selected and unselected voltages that the word lines and SGD lines generate and/or are biased with are referred to as local selected and unselected voltages. Similarly, the control gate line voltage generation circuit 612 generates a global SGS line voltage $V_{SGS}$, and the SGS line SGSL generates and/or is biased with a local SGS line voltage $V_{SGS}$. In this context, the control gate line voltage supply circuit 606 generates global control gate line voltages, including global selected and unselected control gate line voltages, and supplies or routes the global control gate line voltages to the control gate lines of the block 602. In response, the control gate lines of the block 602 generate respective local control gate line voltages. Selected control gate lines generate local selected control gate line voltages or voltages at local selected levels, and unselected control gate lines generate local unselected control gate line voltages or voltages at local selected levels. Herein, for simplicity, no express distinction is made between the levels, including the selected and unselected levels, of the control gate line voltages that the control gate line voltage generation circuit 612 generates, and the levels, including the selected and unselected levels, of the control gate line voltages that the control gate lines generate.

In addition, the program controller 622 configures a bit line as a selected bit line by supplying or applying the selected bit line voltage $V_{BLS}$ to that bit line and/or by biasing the bit line with the selected bit voltage $V_{BLS}$. The bit line receiving or biased with the selected bit line voltage $V_{BLS}$ becomes or is configured as a selected bit line and generates a selected bit line voltage by generating its voltage at a selected bit line level. Similarly, the program controller 622 configures a bit line as an unselected bit line by supplying or applying the unselected bit line voltage $V_{BLU}$ to that bit line and/or by biasing the bit line with the unselected bit line voltage $V_{BLU}$. The bit line receiving or biased with the unselected bit line voltage $V_{BLU}$ becomes or is configured as an unselected bit line and generates an unselected bit line voltage by generating its voltage at an unselected bit line level.

The selected and unselected levels at which the bit lines generate their respective voltages may be the same as or different than the voltage levels of the selected and unselected bit line voltages $V_{BLS}$, $V_{BLU}$. For example, the column decoder circuit 618 and/or the sense circuits 620 may provide one or more voltage drops such that the selected and unselected bit lines are biased with or generate their respective selected and unselected bit line voltages at levels that are lower than the levels at which the bit line voltage generation circuit 616 generates the selected and unselected bit line voltages $V_{BLS}$, $V_{BLU}$. For such example configurations, the bit line voltage generation circuit 616 is configured to generate the selected and unselected bit line voltages $V_{BLS}$, $V_{BLU}$ at sufficiently high levels to achieve appropriate biasing of the bit lines.

For some example configurations, the selected and unselected bit line voltages $V_{BLS}$, $V_{BLU}$ are be referred to as global selected and unselected bit line voltages, and the selected and unselected voltages that the bit lines generate and/or are biased with are referred to as local selected and unselected bit line voltages. In this context, the bit line voltage supply circuit 608 generates global bit line voltages, including global selected and unselected bit line voltages, and supplies or routes the global bit line voltages to the bit lines of the block 602. In response, the bit lines generate respective local bit line voltages. Selected bit lines generate local selected bit line voltages or voltages at local selected levels, and unselected bit lines generate local unselected bit line voltages or voltages at local selected levels. Herein, for simplicity, no express distinction is made between the levels, including the selected and unselected levels, of the bit line voltages that the bit line voltage generation circuit 616 generates, and the levels, including the selected and unselected levels, of the bit line voltages that the bit lines generate.

As previously described, the program controller 622 may identify or assign each of the word lines, bit lines, and SGD lines as selected or unselected during a program operation. The determinations or identifications that the program controller 622 makes to assign each of the word lines, SGD lines, and bit lines as selected or unselected may depend on the physical location of the selected memory cells being programmed, the target memory states of the selected memory cells, the program statuses of the selected memory cells, and the particular program stage being performed at a given point in time of the program operation.

In an example program operation, the program circuit 600 may perform a program operation to program data (such as one or more pages of data) into a selected word line cell group 628 of the block 602. In general, a selected word line cell group is a word line cell group that includes the selected memory cells that are programmed during the program operation. Those word line cell groups that do not include selected memory cells—i.e., that include unselected memory cells—are unselected word line cell groups of the program operation.

Figure 7:
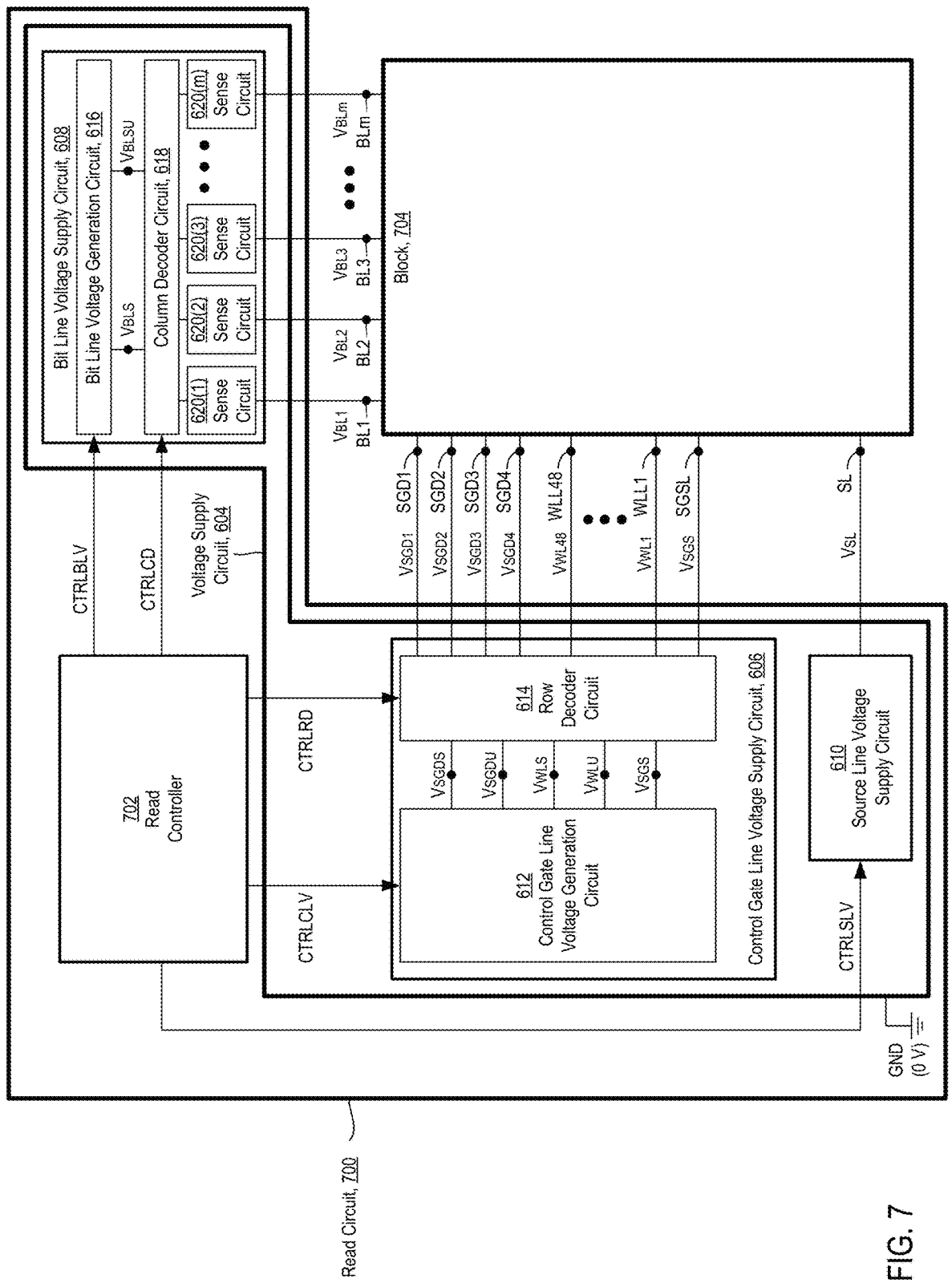
FIG. 7 is a block diagram of an example read circuit of the memory die of FIG. 2B, configured to perform normal read operations and/or content addressable read operations.

FIG. 7 is a block diagram of an example read circuit 700 configured to perform read operations to read data from a block 704. The block 704 may be the same or a similar block as the block 602 of FIG. 6. FIG. 7 shows the block 704 as including the same configuration of control lines as the block 602 of FIG. 6. In addition or alternatively, the block 704 may be a block of the memory cell structure 142, one of the blocks BLK in FIG. 3A, 3B, or 4A, have the physical construction or structure of the block 410 if FIGS. 4B, 4C, and/or have the circuit configuration of the block 480 in FIG. 4D.

A read circuit is a circuit, or a collection of circuits or circuit components, that performs read operations. A read operation is a memory operation performed to read or sense statuses of selected memory cells. Accordingly, selected memory cells are those memory cells from which statuses are read or sensed during read operations. Also, unselected memory cells of a read operation are those memory cells from which statuses are not read or sensed during the read operation.

A status of a selected memory cell, or of a plurality of memory cells, is a condition or state of the selected memory cell(s). The status may be one of a plurality of possible predetermined conditions or states in which the selected memory cell(s) can be. Additionally, a status of a selected memory cell, or a plurality of selected memory cells, may be any of various types of statuses. A status type may pertain or be specific to a memory operation. One type of status is a read status, which is the memory state of a selected memory cell and/or a status of whether a selected memory cell has a threshold voltage above or below a read pulse level of a read pulse applied to a selected word line. Another type of status is a key status, which is a status of whether a collection, such as a string, of selected memory cells is storing a key that matches a target key and/or a status of whether the NAND string conducts electrical current in response to being biased according to a predetermined bias condition.

The read circuit 700 is configured to perform read operations by performing sense operations in order to read or sense statuses from selected memory cells. A sense operation is a memory operation performed to determine a response of one or more selected memory cells in response to a bias at a predetermined bias setting. The bias may be any of various types of biases, including any number of biases or any type of bias, such as a voltage, a current, or any of various signals, such as direct current (DC) signals or alternating current (AC) wired or wireless signals, that can affect a behavior or trigger a response of the subject memory cell(s). The predetermined bias setting includes the characteristics or properties of the bias, such as the magnitude, frequency, duty cycle, waveform, or any other characteristics or properties that can define a bias. The read circuit 700 applies the bias according to the bias conditions to a plurality of memory cells in order to determine the response of the selected memory cell(s). The response of the selected memory cell(s), when subjected to the bias, conveys or communicates the status of the selected memory cell(s).

A response of the memory cell produced during a sense operation may be any of various measurable properties of an electrical signal, such as a DC or AC voltage or current, or an electromagnetic wave, that the selected memory cell(s) can generate, conduct, induce, emit, radiate, or otherwise cause to be created in response to being biased during the sense operation. Example measurable properties may include a magnitude, an amount, a level, a frequency, a slope, a duty cycle, a pulse width, a waveform type (sinusoidal, square, sawtooth, e.g.,), a rate of change (e.g., a rate of decay or a rate of increase), a modulation, or a signal-to-noise ratio, as non-limiting examples. The type of the response and the value of the response that is measured or sensed may depend on a storage parameter of the selected memory cell(s) and the level, value, or state of the storage parameter, which in turn indicates the status of the selected memory cell(s).

At least for NAND technology, a response of the selected memory cell(s) is a current that the selected memory cell(s) draw(s) or cause(s) to be drawn through a bit line. During a sense operation, the selected memory cell(s) is/are biased with a bias at predetermined setting to induce the selected memory cell(s) to draw a current through a bit line. An amount of current that the selected memory cell(s) draw(s) or cause(s) to draw depends on a threshold voltage level (or levels) of the selected memory cell(s), and in turn, indicates a status, such as a read status or a key status, of the selected memory cell(s).

In addition, at least for NAND technology, the bias applied during a sense operation includes a plurality of voltages applied to the control lines of a block including the selected memory cells. The read circuit 700 may include a voltage supply circuit that is configured to generate the voltages and apply the voltages to the control lines, which in turn bias the memory cells. For at least some example configurations, such as the one shown in FIG. 7, the read circuit 700 may include the same voltage supply circuit 604 as the program circuit 600 in FIG. 6, and so the voltage supply circuit 604 and its components are labeled or numbered the same way as they are in FIG. 6.

For read operations, the voltage supply circuit 604 is configured to generate and supply read voltages, or voltages at read levels, to the control lines rather than program voltages. In particular example configurations, the voltage supply circuit 604 may include separate circuit components to generate separate read voltages for the read operations, and supply those read voltages, rather than the program voltages, to the control lines during read operations. For other example configurations, the voltage supply circuit 604 may include the same circuit components to generate the program and read voltages, and may be configured to change or adjust the levels of the voltages as necessary in order to perform program and read operations.

During read operations, the bit line voltage supply circuit 608 of the voltage supply circuit 604 is configured to supply or apply read selected and unselected bit lines voltages $V_{BLS}$, $V_{BLU}$ (or selected and unselected bit line voltages $V_{BLS}$, $V_{BLU}$ at read levels to the selected and unselected bit lines of the block, and the control gate line voltage supply circuit 606 is configured to supply or apply read control gate line voltages (or control gate line voltages at read levels) to the control gate lines of the block. In particular, the control gate line voltage supply circuit is configured to supply or apply a read selected SGD line voltage $V_{SGDS}$ (or a selected SGD line voltage at a read level) to a selected SGD line of the block 704, a read unselected SGD line voltage $V_{SGDU}$ (or an unselected SGD line voltage at a read level) to unselected SGD lines of the block 704, a read selected word line voltage $V_{WLS}$, such as in the form of a read gate voltage pulse (or just read voltage pulse or read pulse), to a selected word line of the block 704, a read unselected word line voltage $V_{WLU}$ (or an unselected word line voltage at a read level) to unselected word lines of the block 704, and a read SGS line voltage $V_{SGS}$ (or a SGS line voltage at a read level) to the SGS line of the block 704. The source line voltage supply circuit 610 is configured to supply or apply a read source line voltage $V_{SL}$ or a source line voltage at a read level) to the source line of the block.

In particular example configurations, such as shown in FIG. 7, the bit line voltage generation circuit 616 may generate the selected and unselected bit line voltages $V_{BLS}$, $V_{BLU}$ at read levels, and the column decoder 618 may supply the selected and unselected bit line voltages $V_{BLS}$, $V_{BLU}$ to the bit lines of the block 704. In addition, the control gate line voltage generation circuit 606 may generate the control gate line voltages at read levels, and the row decoder circuit 614 may supply the selected and unselected control gate line voltages to the control gate lines of the block 704.

While the voltage supply circuit 604 is biasing the control gate lines with read voltages, the read circuit 700 may perform sense operations using the sense circuits 620. A sense circuit is a circuit that senses a response of a selected memory cell or a plurality of selected memory cells. The sense circuit may sense a response while control lines are biased at a predetermined bias setting. A sense circuit can sense the response by sensing or detecting a presence or absence of the response, and/or by measuring an amount, level, value, or magnitude of the response. The sense circuits 620 in FIGS. 6 and 7 have circuit structures that connect to the bit lines BL coupled to the memory cells to enable or form current paths that allow currents to flow through them to the bit lines BL. Other structural configurations for performing the function of current sensing may be possible. For example, other example sense circuits may connect to word lines instead of bit lines, and determine the statuses of the memory cells based on current flow drawn through the word lines. Other example sense circuits may sense a voltage on a word line or a bit line without necessarily having that voltage be dependent on current drawn through the selected memory cells. For such configurations, the sense circuit performs voltage sensing rather than current sensing to determine statuses of the selected memory cells.

In addition, the read circuit 700 may include a read controller 702 that controls read operations. The read controller 702 controls when read operations begin and when they end. In addition, a read controller controls when read stages within a normal read operation begin and end. A read controller controls the transitions of stages from one stage to a next stage. In addition, the read controller 702 sets the voltages on the control lines of a block during read operations. The read controller 702 may do so by controlling the voltage levels of the voltages that the voltage supply circuit 604 generates and supplies, and when the voltage supply circuit 604 generates and supplies the voltages at their particular levels. For example, the read controller 702 controls whether and/or when selected and unselected voltages are generated at associated read levels. In addition, the read controller 702 sets the voltages on the control lines by controlling how voltages are routed to control lines of a block, and can change which voltages are routed to which control lines.

In addition, the read controller 702 may determine where, such as which memory cells, to perform read operations. For example, the read controller 702 may determine that data is to be read, and identify a collection of memory cells from which to read the data, such as by identifying a plane, a block, a word line, and/or a word line cell group that includes the collection of memory cells. The read controller 702 may identify that collection of memory cells as the selected memory cells of a read operation.

In some embodiments, the read controller 702 may determine from where to read data in response to receipt of address information from the controller 102 (FIG. 2A) or otherwise identify a unique physical address (e.g., one that includes a particular plane, a particular block, a particular word line, and/or a particular word line cell group) that identifies a physical location of the selected memory cells from which to read the data.

In addition, the read controller 702 may know or determine a bits-per-cell storage scheme under which data is being stored in selected memory cells. By knowing the storage scheme, the read controller 702 may know whether the memory cells are programmed as SLC cells or MLC cells, as defined by the bits-per-cell storage scheme. In addition, where the selected memory cells are programmed as MLC cells, the read controller 702 may know the number of bits-per-cell each of the MLC cells are storing, as defined by the bits-per-cell storage scheme. The read controller 702 may control the biasing on the control lines in order read the data values of the selected memory cells as SLC cells or MLC cells, in accordance with the storage scheme. In addition, the read controller 702 may control the biasing on the control lines in order to configure the various bit lines, word lines, and SGD lines as each selected or unselected.

The read circuit 700 is configured to perform two types of read operations, including content addressable memory (CAM) read operations and normal (or non-CAM) read operations. The read circuit 700 performs CAM read operations to find matching keys in accordance with a CAM storage scheme. The read circuit 700 performs normal read operations to determine data values of data that selected memory cells are storing. CAM read operations are described in further detail below.

With respect to normal read operations, the read circuit 700 confines a normal read operation to a particular region or portion of the memory cell structure 142. For such embodiments, the selected memory cells include a first portion or first group of the particular region, and the unselected memory cells include a second portion or second group of the particular region.

At least for NAND technology, the read circuit 700 confines a normal read operation to a block. The selected memory cells of a normal read operation are part of a first set or group of the memory cells of the block, and the unselected memory cells are part of a second set or group of the memory cells of the block, namely those memory cells that are not the selected memory cells. In particular example embodiments, the selected memory cells of a normal read operation are disposed in or coupled to the same word line (or word line layer) and/or are configured to be biased by the same word line (or word line layer). In further particular embodiments, the selected memory cells of a normal read operation include only those memory cells that are part of the same or single word line cell group (or string).

Additionally, with respect to normal read operations to read data from MLC cells, the read circuit 700 may separate or divide a normal read operation into discrete read stages. A read stage is at least a portion of a normal read operation during which the read circuit 700 performs a discrete set of read actions to read at least portions of the data values that the selected memory cells are storing. As described in further detail below, the discrete set of read actions may include applying a discrete set of biases, such as voltages, to the control lines of the block in order to read at least portions of data values from the selected memory cells. The discrete set of read actions may also include performing sense operations to sense read statuses of the selected memory cells.

By dividing or separating a normal read operation into different read stages, the read circuit 700 associates each read stage with a different one of the plurality of memory states in which each of the selected memory cells can be configured. The memory state associated with a given read stage is referred to as the associated memory state of the given read stage.

At least for NAND technology, for a given read stage with an associated memory state, the read circuit 700 performs the read stage to determine or find out which of the selected memory cells are programmed in memory states at or above the associated memory state, and which of the selected memory cells are programmed in memory states below the associated memory state. By determining which memory cells are at or above the associated memory state and which are below may allow the read circuit 700 to determine a portion, such as a bit value, of each of the data values that the selected memory cells are storing. For some example configurations, portions of a data value may be referred to by page designators (e.g., upper page, lower page, and middle page), with each page designator corresponding to one of a plurality of bit positions of a data value, such as the least significant bit, the most significant bit, or one or more bits in between the least and most significant bits. When performing a read stage, the read circuit 700 may identify bit values of bits of particular bit positions of the data values that the selected memory cells are storing.

In addition, to perform a normal read operation on MLC cells, the read circuit 700 performs or executes a plurality of read stages sequentially in a predetermined read order. The read order may be an order of memory states. Where a given memory state is positioned in the read order determines when the read circuit 700 performs a given read stage associated with the given memory state relative to when the read circuit 700 performs the other read stages.

In addition, to perform a normal read operation that includes a plurality of read stages, the read circuit 700 sequentially performs or executes the normal read operation by sequentially transitioning from one read stage to another read stage according to the read order. When the read circuit 700 ends a current read stage, the read circuit 700 identifies a next read stage in the read order as the current read stage, and begins performing the new current read stage. The read circuit 700 sequentially performs the read stages in this manner until a last read stage in the read order is performed. After performing the last read stage, the read circuit 700 may identify the data values of all of the selected memory cells.

During a normal read operation, the read circuit 700 may configure the selected memory cells in one of two read bias states, including a read-enable state and a read-inhibit state. A read-enable state is a bias state that enables or allows a selected memory cell to be read—i.e., enables or allows read status of the selected memory cell to be determined. When the read circuit 700 configures a selected memory cell in the read-enable state, the read-enabled selected memory cell (which can just be referred to as a read-enabled memory cell) is able or allowed to be read, meaning that at least a portion of the data value that the read-enabled memory cell is storing can be determined. If the read circuit 700 configures a selected memory cell is the read-enabled state during a read stage, the read circuit 700 may determine whether the read-enabled memory cell is programmed in a memory state at or higher or lower than the associated memory state of the read stage.

In addition, a read-inhibit state is a bias state that prevents or inhibits a selected memory cell from being read—i.e., prevents or inhibits a read status of the selected memory cell from being determined. When the read circuit 700 configures a selected memory cell in the read-inhibit state, the read-inhibited selected memory cell (which can just be referred to as a read-inhibited memory cell) is prevented or inhibited from being read, meaning that at least a portion of the data value that the read-inhibited memory cell is storing cannot be determined. If the read circuit 700 configures a selected memory cell in the read-inhibit state during a read stage, the read circuit 700 may not determine whether the read-inhibited memory cell is programmed in a memory state at or higher or lower than the associated memory state of the read stage.

The read circuit 700 applies different biases, such as in the form of voltages having different levels, to bit lines and SGD lines in order to configure each of the selected memory cells in the read-enable state or the read-inhibit state. In addition or alternatively to being referred to as a read-inhibited memory cell, a selected memory cell configured in the read-inhibit state may be referred to as a locked-out memory cell in that it is locked out from being read during a normal read operation or a particular stage of the normal read operation.

In general, during a normal read operation, the read circuit 700 configures each of the selected memory cells as read-enabled memory cells in order to determine the data values that they are storing. However, for some example normal read operations, the read circuit 700 may be able to ascertain a complete data value of a selected memory cell before the read circuit completes all of the read stages. In that situation, the read circuit may configure the selected memory cell as a read-inhibited memory cell for a remainder of the normal read operation, which may prevent current draw through the bit line coupled in the read-inhibited memory cell and reduce power consumption.

Additionally, during a normal read operation, the bit line voltage supply circuit 608 may supply or apply the selected bit line voltage $V_{BLS}$ to selected bit lines to configure selected memory cells coupled to the selected bit lines as read-enabled memory cells, and may supply or apply the unselected bit line voltage $V_{BLU}$ to unselected bit lines to configure unselected memory cells coupled to the unselected bit lines as read-inhibited memory cells. In this context, a selected bit line of a normal read operation is a bit line that is biased with a selected bit line voltage, configures a selected memory cell as a read-enabled memory cell, and/or allows a selected memory cell to be read. An unselected bit line of a normal read operation is a bit line that is biased with an unselected bit line voltage, configures a selected memory cell as a read-enabled memory cell, and/or prevents, inhibits, or locks out a selected memory cell from being read.

In addition, during normal read operations, the control gate line voltage supply circuit 606 supplies or applies the selected SGD line voltage $V_{SGDS}$ to a selected SGD line to enable SGD transistors, and in turn allow selected memory cells to be read-enabled during read operations, and supplies or applies the unselected SGD line voltage $V_{SGDU}$ to unselected SGD lines to inhibit SGD transistors, and in turn inhibit certain unselected memory cells from being read during normal read operations.

To perform a normal read operation, the read controller 702 may determine a read order, and perform a plurality of read stages according to the read order. Also, the bit line voltage supply circuit 608 may supply or apply selected and unselected bit line voltages at sense selected and unselected bit line levels in order to read-enable and read-inhibit selected memory cells during various read stages of a normal read operation.

In addition, to perform a normal read operation, the control gate line supply circuit 606, through control by the read controller 702, may supply read pulses at read pulse levels Vr. Example read pulse levels are shown in the threshold voltage distribution plots in FIGS. 5A-5D. The read pulse levels Vr may each be associated with a respective memory state. During a read operation, when the read circuit 600 performs a read stage associated with a particular memory state, control gate line voltage supply circuit 608 may supply the read pulse at the read pulse level associated with the particular memory state during the read stage. The read circuit 700, such as through control by the read controller 702, may sequentially perform, execute, or transition through the read stages at least by sequentially applying read pulses to a selected word line at the various read pulse levels Vr according to a read order of the normal read operation. The control gate line voltage supply circuit 608 may transition through the read pulses by directly transitioning to the next read pulse level according to the read order.

During a given read stage associated with a given memory state of a normal read operation, the control gate line voltage supply circuit 606 supplies or applies a read voltage pulse at a read pulse level Vr associated with the given memory state to a selected word line. Those selected memory cells with threshold voltages lower than the read pulse level Vr may conduct in response to application of the read pulse at the read pulse level Vr to the selected word line, and those selected memory cells with threshold voltages higher than the read pulse level Vr may not conduct in response to application of the read pulse at the read pulse level Vr to the selected word line. Additionally, during the given read stage, the control gate line voltage supply circuit 606 supplies or applies an unselected word line voltage (or a word line voltage at an unselected word line level) to unselected word lines. The unselected word line voltage is at a sufficiently high level to cause the unselected memory cells to conduct, regardless of their respective memory states. This way, whether a string and a bit line coupled to the string conduct may depend on the threshold voltage level of a selected memory cell of the string relative to the read pulse level Vr—i.e., whether the threshold voltage level of the selected memory cell is higher or lower than the read pulse level. If the threshold voltage level of the selected memory cell is higher, then the string and the bit line do not conduct; and if the threshold voltage level of the selected memory cell is lower, then the string and the bit line conduct. In turn, whether the string and the bit line conducts indicates whether the selected memory cell is at or above the associated memory state, which in turn allows the read controller 702 to determine at least a portion, such as a bit value, of each of the data values that the selected memory cells are storing.

As an example illustration, for an SLC storage scheme (e.g. FIG. 5A), during a given read stage, the control gate line voltage supply circuit 606 may supply a read pulse at read pulse level VrA associated with memory state A (which for SLC may just be referred to as the program state) to a selected word line, and may supply an unselected word line voltage to unselected word lines. For a given string including a selected memory cell in memory state A (the program state), the given string and bit line coupled to the string may not conduct. In addition, for a given string including a selected memory cell in the erased state, the given string and bit line may conduct. Based on whether or not the given string and bit line conduct, the read controller 702 may determine whether the selected memory cell is in the erased state and storing a logic 1 value, or in memory state A (the program state) and storing a logic 0 value.

As another example illustration, for a two-bits per cell MLC storage scheme (e.g., FIG. 5B), during a given read stage associated with memory state B, the control gate line voltage supply circuit 606 may supply a read pulse at read pulse level VrB associated with memory state B to a selected word line, and may supply an unselected word line voltage to unselected word lines. For a given string including a selected memory cell in memory state B or memory state C, the given string and bit line coupled to the string may not conduct. In addition, for a given string including a selected memory cell in the erased state Er or memory state A, the given string and bit line coupled to the string may conduct. Based on whether or not the given string and bit line conduct, the read controller 702 may determine whether the lower page or least significant bit value of the two-bit data value that the selected memory cell is storing is a logic 1 value (for the erased state or memory state A) or a logic 0 value (for memory state B or memory state C).

Additionally, during a read stage while the control gate line voltage supply circuit 606 supplies the read pulse to the selected word line and the unselected word line voltage to the unselected word lines, the sense circuits 620 may perform respective sense operations to determine or sense whether the bit lines BL to which they are coupled conducts current. Each sense circuit 620 performing a sense operation during a read stage may store a sense result of the sense operation in a designated area or location of a memory, such as a non-volatile memory or a latch. In particular example configurations, a sense circuit 620 stores the sense result as a single bit value, such as a logic 1 value to indicate that a bit line conducted and a logic 0 value to indicate that the bit line did not conduct during the sense operation.

Also, during a read stage, the plurality of sense circuits coupled to the selected memory cells, by way of the bit lines, perform their respective sense operations concurrently or in parallel such that by the end of the read stage, each of the sense circuits will have performed its respective sense operation and generated a sense result for the bit line and associated selected memory cell. In this context, a plurality of sense circuits that concurrently perform respective sense operations during a read stage may be considered to collectively perform a single sense operation during the read stage.

As mentioned, in addition or alternatively to performing normal read operations, the read circuit 700 is configured to perform CAM read operations in accordance with CAM storage schemes. In general, a CAM read operation is a memory operation performed to detect or identify which of a plurality of keys are matching keys that match a target key. The plurality of keys that are read or analyzed during a CAM read operation may be stored in blocks of the memory cell structures 142 in accordance with a CAM storage scheme. Under a CAM storage scheme, at least some of the memory cell structures 142 of the memory dies 104 are configured to store data as key-record pairs, as previously described. A first portion of the memory cell structures 142 is configured to store keys of the key-record pairs, and a second portion of the memory cell structures 142 is configured to store records of the key-record pairs.

Additionally, under a CAM storage scheme, the keys are stored in strings of memory cells. That is, at least with NAND technology, rather than store data of a key in a word line cell group or a page of memory cells coupled to the same word line, the data of the key is stored in a string across several word lines.

How a plurality of keys are stored in strings and how the read circuit 700 performs CAM read operations to detect which of the plurality of keys are matching keys may depend on a type of CAM storage scheme under which the keys are stored. Four types of CAM storage schemes are described herein. Under a first type of CAM storage scheme, described with reference to FIGS. 8 and 9, the strings store keys. Under a second type of CAM storage scheme, described with reference to FIG. 10, the strings store keys and inverse keys. Under a third type of CAM storage scheme, described with reference to FIGS. 11-13, the strings store keywords and inverse keywords. Under a fourth type of CAM storage scheme, described with reference to FIGS. 14-16, the strings store keyword portions and inverse keyword portions. Various CAM read operations are described with reference to the four different types of CAM storage schemes, and further with reference to the read circuit 700 in FIG. 7.

Figure 8:
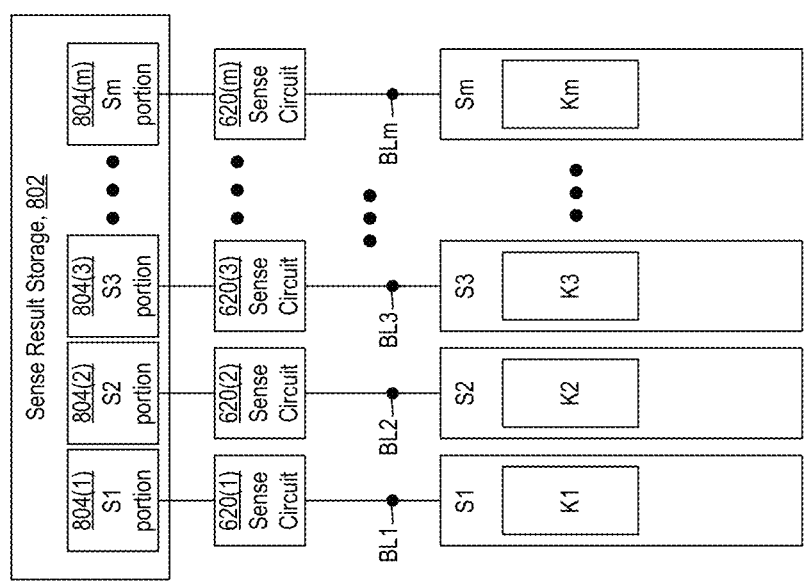
FIG. 8 is a block diagram of a least a portion of a block that includes a plurality of strings storing a plurality of keys according to a first type of CAM storage scheme.

In further detail, FIG. 8 shows a block diagram of at least a portion of a block, illustrating an example configuration of a plurality of strings S storing a plurality of keys K according to a first type of CAM storage scheme. In the example configuration in FIG. 8, an m-number of strings S1 to Sm, equal to the m-number of bits lines BL1 to BLm of the blocks 602, 704 in FIGS. 6 and 7 respectively, are storing an m-number of keys K1 to Km, such that each of the m-number of strings S is storing a different one of the m-number of keys K. For 3-D NAND technology, the m-number of strings S1 to Sm may be part of the same sub-block, although other configurations may be possible. Additionally, in some embodiments, the keys K belong to a same field.

Each of the keys K may have an associated bit pattern that identifies the attribute values that each key has. A bit pattern of a key is a binary value that includes an n-number of binary digits or bits, each having a logic 1 value or a logic 0 value. The binary value and/or the binary digits may also be referred to as a bit sequence of the key. In addition, the n-number of binary digits is referred to as a key length of the key.

The program circuit 600 is configured to program the memory cells to store the keys K. For a given ith key Ki stored in a given ith string Si, the program circuit 600 may program the bits in the key Ki in memory cells of the string Si according to any of various encoding, ordering, or formatting schemes that indicate or otherwise determine which bits of the ith key Ki are stored in which memory cells of a string S. Accordingly, the program controller 622 may be configured to identify the bit pattern of the ith key Ki, and based on the bit values of the bit pattern and the scheme it is using, determine how to program (or encode) the ith key Ki into the string Si, including how to bias the word lines coupled to the string Si and which threshold voltage levels each of the memory cells of the string Si should be at after programming the key Ki into the string Si, As the program circuit 600 receives keys for storage, it programs (or encodes) the strings coupled to columns by identifying the bit patterns of the keys and performing programming operations according the bit values of the bit pattern and the scheme it is using.

For some example configurations, based on the scheme being used, the program circuit 600 programs an ith key Ki into a string such that adjacent or sequentially-positioned bits in a bit pattern of the ith key Ki are stored in adjacent memory cells of a string, where adjacent memory cells of a string are memory cells that are part of the same string and that are coupled to adjacent word lines of a block. For other example configurations, adjacent or sequentially-positioned bits in a bit pattern of the ith key Ki are stored in non-adjacent memory cells of the string, where non-adjacent cells of a string are memory cells that are part of the same string but coupled to non-adjacent word lines of a block.

Figure 9:
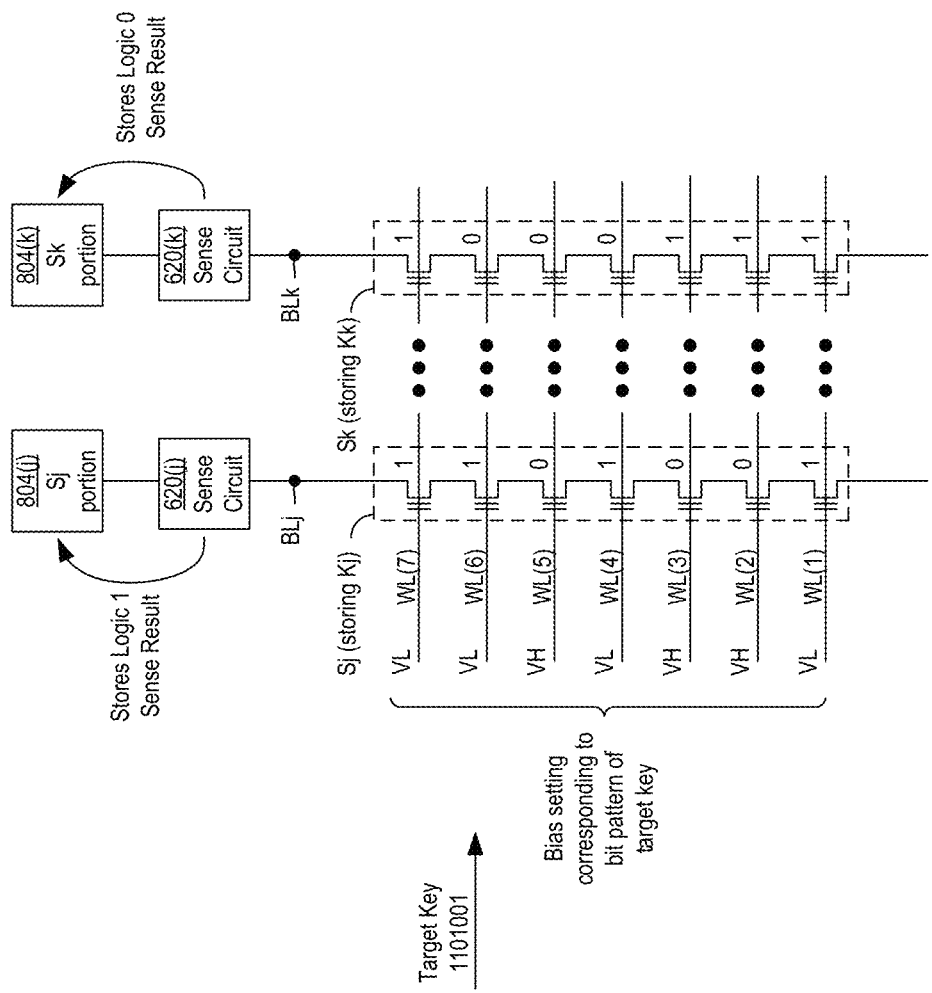
FIG. 9 is a partial circuit schematic diagram of two strings storing two keys according to the first type of CAM storage scheme.

To further illustrate strings storing keys according to the first type of CAM storage scheme, FIG. 9 shows a partial circuit schematic diagram of an example configuration of two strings, including a jth string Sj and a kth string Sk, respectively storing a jth key Kj and a kth key Kk. The two strings Sj, Sk may be representative of any two of the strings S1 to Sm in FIG. 8. Similarly, the two keys Kj, Kk may be representative of any two of the keys K1 to Km in FIG. 8. FIG. 8 also shows the jth string Sj coupled to a jth bit line BLj and the kth string Sk coupled to a kth bit line BLk. The jth and kth bit lines BLj, BLk may be representative of any of the m-number of bit lines BL1 to BLm in FIG. 8.

In the example configuration in FIG. 9, each of the keys Kj, Kk includes seven bits—i.e., they each have a key length of seven. In addition, as an example illustration, the jth key Kj has a bit pattern 1101001, and the kth key Kk has a bit pattern 1000111. Also, in the example configuration in FIG. 9, the bits of the keys Kj, Kk are stored in the memory cells according to an SLC storage scheme. Correspondingly, each string Sj, Sk includes seven memory cells, each configured to store one of the seven bits. FIG. 9 further shows the seven memory cells of each string Sj, Sk coupled to seven word lines, extending from a first word line WL(1) to a seventh word line WL(7). Additionally, FIG. 9 shows that the bits of the bit patterns of the keys Kj, Kk are stored in the memory cells of the respective strings Sj, Sk such that increasingly higher significant bits are stored in memory cells coupled to higher-numbered word lines. For example, the least significant bits of the bits patterns are stored in memory cells coupled to a first word line WL(1), and the most significant bits of the bit patterns are stored in memory cells coupled to a seventh word line WL(7). Other ways of storing keys in strings under an SLC storage scheme may be possible. In addition or alternatively, in other example configurations, the bit patterns of keys may be stored according to MLC storage schemes, rather than an SLC storage scheme as illustrated in FIG. 9.

Referring back to FIG. 8, the sense circuits 620 may be coupled to respective strings S, and may be further coupled to a sense result storage 802. The sense result storage 802, including its portions and sub-portions as described in further detail below, may be configured in accordance with any type, or any combination of types, of volatile or non-volatile memory technology, non-limiting examples of which include latches, flip flops, registers, or buffers.

In general, the sense circuits 620 are configured to store results of the sense operations in the sense result storage 802. As shown in FIG. 8, the sense result storage 802 includes a plurality of string portions 804. Each sense circuit 620 is configured to store sense results of sense operations in an associated one of the string portions 804. Additionally, as previously described, each sense circuit 620 performs sense operations and determines sense results of the sense operations for the bit line BL and associated string S to which it is coupled. In addition, at least for NAND technology, each sense circuit 620 generates a sense result of a sense operation to indicate whether or not the sense circuit 620 sensed that the bit line BL to which it is coupled conducted during the sense operation. So, for example, the first sense circuit 620(1) is configured to store sense results of sense operations in a first string (S1) portion 804(2) that indicates whether the first bit line BL1 conducted during the sense operations, the second sense circuit 620(2) is configured to store sense results of sense operations in a second string (S2) portion 804(2) that indicates whether the second bit line BL2 conducted during the sense operations, the third sense circuit 620(3) is configured to store sense results of sense operations in a third string (S3) portion 804(3) that indicates whether the third bit line BL3 conducted during the sense operations, and the mth sense circuit 620(*m*) is configured to store sense results of sense operations in an mth string (Sm) portion 804(*m*) that indicates whether the mth bit line BLm conducted during the sense operations.

Also, for at least some example configurations, including those described herein, the sense circuits 620 may store the sense results as one-bit binary values. For a sense operation, a given ith sense circuit 620(*i*) may store a sense result as a single bit having a logic 1 value if the sense circuit 620(*i*) detects that the ith bit line BL(*i*) to which it is coupled conducted, and as a single bit having a logic 0 value if the sense circuit 620(*i*) detects that the ith bit line BL(*i*) did not conduct. Additionally, each of the sense circuit 620 may be configured to store a sense result for each sense operation it performs.

An example CAM read operation performed according to the first type of CAM storage scheme is now described with respect to FIGS. 8 and 9, and further with respect to the read circuit 700 of FIG. 7. In general, the read circuit 700 may perform a CAM read operation to detect which of a plurality of keys K are matching keys that match a target key. Accordingly, the read circuit 700 may perform a CAM read operation in response to the memory system 100 receiving a target key identifying a target bit pattern. In response to performing the CAM read operation, the read circuit 700 may identify which of a plurality of keys K stored in a plurality of strings S, such as which of the keys K1 to Km stored in strings S1 to Sm in FIG. 8, matches the target key.

To perform the example CAM read operation according to the first type of CAM storage scheme, the read controller 702 biases the word lines of a block (e.g., word lines WL(1) to WL(7) in FIG. 9) with a word line bias according to a word line bias setting that corresponds to the target key, such that bit lines coupled to strings storing matching keys conduct, and bit lines coupled to strings that are not storing matching keys do not conduct. When the read controller 702 biases the word lines according to the word line bias setting that corresponds to the target key, the plurality of sense circuits 620 perform a sense operation, and in response to the sense operation, those sense circuits 620 coupled to strings storing matching keys store sense result bits having logic 1 values in their respective string portions 804, and those sense circuits 620 coupled to strings storing keys that do not match the target key store sense result bits having logic 0 values in their respective string portions 804.

In general, a word line bias is a plurality of word line voltages concurrently applied to a plurality of word lines, where each of the word line voltages is applied to a respective or different one of the plurality of word lines. During a CAM read operation performed according to the first type of CAM storage scheme, the read controller 702, through control of the control gate line voltage supply circuit 606, concurrently biases a plurality of word lines coupled to memory cells storing the keys with a word line bias, such that the read controller 702 control applies each word line voltage to a respective one of the word lines. So, for example with respect to FIG. 9, the word line bias includes seven word line voltages applied to the seven word lines WL(1) to WL(7). The read controller 702, such as through the control gate line voltage supply circuit 606, applies the seven word line voltages, each to a respective one of the seven word lines WL(1) to WL(7).

Additionally, in general, a word line bias setting is a mapping that maps each of a plurality of word lines to one of a plurality of word line voltage levels. For a plurality of word lines biased according to a word line voltage setting, the plurality of word lines are each biased with their respective word line voltage at a respective word line voltage level identified by the word line voltage setting.

For CAM read operations, the word line bias setting identifies a plurality of read word line voltage levels at which to bias a plurality of word lines, and maps each word line, and/or each word line voltage generated at a respective word line, to one of the plurality of read word line voltage levels. The read word line voltage levels include a high voltage level VH and a low voltage level VL. In general, the high voltage level VH has a magnitude level that is higher than a magnitude level of the low voltage level VL. Additionally, the high voltage level VH is a level that causes memory cells in more memory states to conduct than the low voltage level VL. In particular example configurations, the high voltage level VH is a level that causes a memory cell to conduct regardless of the memory state (or threshold level) of the memory cell, and the low voltage level VL is a level that may or may not cause a memory cell to conduct, depending on the memory state (or threshold level) of the memory cell. In addition or alternatively, the high voltage level VH may correspond or be equal to the magnitude level of the unselected word line voltage applied to unselected word lines during normal read operations, and the low voltage level VL may correspond or be equal to a read pulse level of a read pulse (or selected word line voltage) applied to selected word lines during normal read operations. For SLC storage schemes, the low voltage level VL may be the read pulse level VrA associated with memory state A (FIG. 5A). For MLC storage schemes, the low voltage level VL may be any of a plurality of read pulse levels Vr, depending on the number of bits-per-cell of the MLC storage scheme and a particular page (e.g., upper, middle, lower) for which the sense operation is being performed.

During a CAM read operation, the read controller 702 may determine a word line bias setting, and control the control gate line voltage generation circuit 612 to generate voltages at or corresponding to the voltage levels identified in the word line bias setting. For example, the read controller 702 may control the control gate line voltage generation circuit 612 to generate the unselected word line voltage $V_{WLU}$ at the high voltage level VH and the selected word line voltage level $V_{WLS}$ at the low voltage level. Additionally, the read controller 702 may control the row decoder circuit 614 to supply the selected word line voltage $V_{WLS}$ at the low voltage level VL to the word lines that are to be biased at the low voltage level VL according to the word line bias setting, and to supply the unselected word line voltage $V_{WLU}$ at the high voltage level VH to the word lines that are to be biased at the high voltage level VH according to the word line bias setting.

Additionally, in general, a word line bias setting may correspond to a data set that includes an associated bit pattern. For such a word line bias setting, each voltage level identified in the word line bias setting corresponds to a respective one of a plurality of n-bit bit groups of the associated bit pattern, where n is one or more and is the number of bits-per-cell of the data stored in memory cells coupled to word lines that are biased according the word line bias setting. For example, in an SLC storage scheme where each memory cell stores a single bit of data, a word line bias setting corresponding to a data set includes a plurality of voltage levels, each corresponding to a respective one of the bits of the bit pattern of the data set, and where each voltage level corresponds to and/or is dependent on whether the bit to which it corresponds is at a logic 0 value or at a logic 1 value.

For CAM read operations performed according to the first type of CAM storage scheme, a word line bias setting according to which word lines are biased may correspond to a target key. For such a word line bias setting, each voltage level identified in the word line bias setting corresponds to one of a plurality of n-bit bit groups of a bit pattern of the target key. For CAM read operations to detect matching keys stored according to an SLC storage scheme, each voltage level of a word line bias setting corresponds to a bit value of a respective one of the bits of the bit pattern of the target key.

As mentioned, in a CAM read operation, the read controller 702 biases the word lines so that those strings storing a matching key conduct. Accordingly, a word line bias setting corresponding to a target key identifies a read word line voltage level for each word line voltage that causes each memory cell of a string to conduct if that string is storing a matching key. Further, so that all of the bit lines do not conduct, the word line bias setting identifies different read word line voltage levels for word line voltages corresponding to bits of the bit pattern having different bit values. For example, a word line bias setting may identify the high voltage level VH for a word line voltage corresponding to a bit of a target key having a logic 0 value, and may identify the low voltage level for a word line voltage corresponding to a bit of a target key having a logic 1 value. This way, memory cells in the erased state storing a logic 1 value or in the program state storing a logic 0 value conduct when biased with a word line voltage at the high level VH, and memory cells in the erased state storing a logic 1 value, but not memory cells in the program state storing a logic 0 value, conduct when biased with a word line voltage at the low level VL.

When performing a CAM read operation according to the first type of CAM storage scheme, the read controller 702 may determine the bit pattern of the target key, and in response determine a word line bias setting corresponding to the target key at which to bias the word lines coupled to the strings storing the keys. The read controller 702 may then bias the word lines according to the word line bias setting, and control the sense circuits 620 to perform a sense operation and store the sense results of the sense operation in the sense result storage 802. The read controller 702 may analyze the sense result storage 802 to determine which of the bit lines and/or strings conducted during the sense operation, such as by determining which of the string portions 804 are storing a logic 1 value and which are storing a logic 0 value. In response to the analysis, the read controller 702 may determine which strings are storing matching keys, and either send column addresses of those strings back to the controller 102, or based on the column address of those strings, retrieve records associated with those matching keys without having to first communicate with the controller 102. The memory dies 104 may send the retrieved records to the controller 102, which in turn may send the retrieved records to the host device that sent the target key. In some example CAM read operations, the ECC module/engine 124 may first perform error correction to detect and correct any bit errors in the retrieved records before sending them a back to the host.

In the example illustrated in FIG. 9, suppose that the target key has a bit pattern that matches the bit pattern of the jth key Kj, i.e., 1101001. Accordingly, moving from the least significant (or right-most) bit to the most significant (or left-most) bit of the bit pattern, the read controller 702 may bias the first word line WL(1) with a word line voltage at the low level VL corresponding to the logic 1 value, the second word line WL(2) with a word line voltage at the high level VH corresponding to the logic 0 value, the third word line WL(3) with a word line voltage at the high level VH corresponding to the logic 0 value, the fourth word line WL(4) with a word line voltage at the low level VL corresponding to the logic 1 value, the fifth word line WL(5) with a word line voltage at the high level VH corresponding to the logic 0 value, the sixth word line WL(6) with a word line voltage at the low level VL corresponding to the logic 1 value, and the seventh word line WL(7) with a word line voltage at the low level VL corresponding to the logic 1 value.

When the read controller 702 biases the word lines WL(1) to WL(7) according to the word line bias setting corresponding to the target key's bit pattern 1101001, the jth string Sj and bit line BLj conduct. In response, the jth sense circuit 620(*j*) stores a sense result bit having a logic 1 value in the jth string portion 804(*j*) of the sense result storage 802. However, the kth string Sk and bit line BLk will not conduct because the memory cells of the kth string Sk storing logic 0 values will not conduct in response to being biased with word line voltages at the low level VL. In turn, the kth sense circuit 620(*k*) stores a sense result bit having a logic 0 value in the kth string portion 804(*k*) of the sense result storage 802. In turn, in response to performing the sense operation with the word lines WL(1) to WL(7) biased according to the word line bias setting corresponding to the target key, the read controller 702 determines that the jth string is storing a matching key and the kth string is not storing a matching key.

In some example configurations, merely storing keys in strings will undesirably lead to false alarms. As used herein, a false alarm is an identification of a matching key that does not actually match the target key. The result of a false alarm is that the memory die retrieving a record associated with the identified matching key will not actually include the attribute(s) identified in the target key. In some example configurations, the ECC module 124 may be configured to detect false alarms and filter out erroneous records that do not have the requested attributes, so that the host device does not receive the erroneous records.

Merely storing keys in strings may lead to false alarms because a word line voltage at the high level VH may cause memory cells storing either a logic 0 value or a logic 1 value to conduct. This, in turn, may cause strings storing non-matching keys to conduct. To illustrate with respect to FIG. 9, suppose the target key has a bit pattern of 1101001 as in the previous example. However, suppose that the memory cell of the jth string Sj coupled to the fifth word line WL(5) is in the erased state, i.e., storing a logic 1 value. That memory cell would still conduct in response to the word line voltage on the fifth word line WL(5) at the high level, causing the jth sense circuit 620(*j*) to erroneously indicate that the jth string Sj is storing a matching key.

To guard against false alarms and limit the over-identification of matching keys, in other CAM storage schemes, the strings store inverse keys in addition to the keys. Each inverse key that is stored is associated with one of the keys. An inverse key associated with a key is a binary value that has a bit pattern that is an inverse of the bit pattern of the key with which it is associated. A first bit pattern and a second bit pattern are inverses of each other where each of the corresponding bits of the first and second bit patterns have inverse or opposite bit values. Further, a bit in the first bit pattern and a bit in the second bit pattern correspond to each other where they have the same bit position within their respective first and second bit patterns. So, for example, a bit pattern 1101001 has an inverse bit pattern 0010110.

Figure 10:
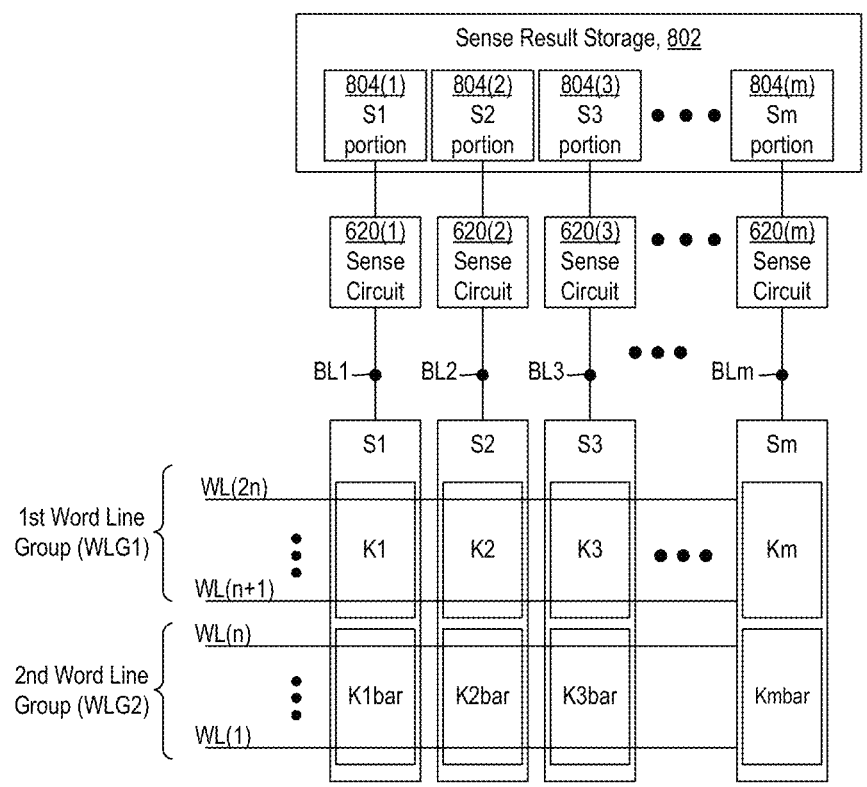
FIG. 10 is a block diagram of at least a portion of a block that includes a plurality of strings storing a plurality of keys and associated inverse keys according to a second type of CAM storage scheme.

FIG. 10 shows a block diagram of at least a portion of a block, illustrating an example configuration of a plurality of strings S storing a plurality of keys K and corresponding inverse keys Kb according to the second type of CAM storage scheme. In the example configuration, each ith string Si stores an ith key Ki and an ith inverse key Kibar associated with the ith key Ki. Various ways of storing an ith key Ki and an ith inverse key Kbari in an ith string Si may be possible. In other example configurations, the ith key Ki and the ith inverse key Kbari are stored in different strings. In particular example configurations, such as those for 3D NAND, the ith key Ki and the ith inverse key Kbari are stored in different strings that are part of a same collection or set of stings coupled to a same or common bit line.

Additionally, as shown in FIG. 10, the word lines are arranged or organized into a plurality of word lines groups, including a first word line group WLG1 and a second word line group WLG2. The first word line group WLG1 includes those word lines coupled to memory cells storing the keys K, and the second word line group WLG2 includes those word lines coupled to memory cells storing the inverse keys Kbar.

Also, in the example configuration in FIG. 10, each of the keys K and the inverse keys Kbar has a key length n. In accordance with an SLC storage scheme, each ith string Si includes an n-number of memory cells that store an ith key Ki, and an n-number of memory cells that store an associated ith inverse key Kibar. Further, in accordance with an SLC storage scheme, in the configuration shown in FIG. 10, the second word line group WLG2 includes a first n-number of word lines WL(1) to WL(n) coupled to memory cells that store the inverse keys Kbar, and the first word line group WLG1 includes a second n-number of word lines WL(n+1) to WL(2n) coupled to memory cells that store the keys K.

Additionally, in the example configuration shown in FIG. 10, each ith string contiguously stores an ith key Ki and contiguously stores the associated ith inverse key Kibar. Other ways of storing the keys K and the inverse keys Kbar are possible. For example, the ith string Si interleaves the bits of the ith key Ki and the ith inverse key Kbari, such as over a 2n-number of word lines, rather than contiguously.

When performing a CAM read operation on strings S storing keys K and inverse strings Kbar according to the second type of CAM storage scheme, such as shown in FIG. 10, the read controller 702 may identify or determine the bit pattern of the target key and the bit pattern of the inverse target key. In response, the read controller 702 may bias the word lines according to a word line bias setting that corresponds to the bit patterns of the target key and the inverse target key. When biasing the word lines according to the word line bias setting, the read controller 702 biases the first word line group WLG1 coupled to memory cells storing the keys K at voltage levels, such as high and low voltage levels VH, VL, that correspond to the bit pattern of the target key, and biases the second word line group WLG2 coupled to memory cells storing the inverse keys Kbar at voltage levels that correspond to the bit pattern of the inverse target key.

With the word lines biased according to the word line bias setting, the plurality of sense circuits 620 may perform a sense operation to determine which of the bit lines conduct, and store sense results, such as in the form of bits each having either a logic 1 value or a logic 0 value, based on the determination in their respective string portions 804, as previously described with respect to FIGS. 8 and 9. By configuring the strings S to store both the keys K and the inverse keys Kbar, those bit lines BL coupled to strings storing matching keys will conduct while minimizing the number of false alarms.

Ideally, the memory cells store data values error free—i.e., each memory cell stores the data value it is supposed to. However, in actual implementations, some memory cells store data erroneously—i.e., the data value that the memory cell is storing is different from the one it is supposed to be storing. Memory cells may store data erroneously for any of various reasons, such as due to program disturbs, read disturbs, or structural or material defects, including grown defects that develop after manufacture, as non-limiting examples. While the number of memory cells erroneously storing data is typically low, on average equal to an expected bit error rate such as on the order about $10^{-4}$ or $10^{-5}$, errors still exist.

For CAM storage schemes and corresponding CAM read operations, memory cells storing incorrect data values may cause nondetections (also called missed detections). A nondetection is a failure to detect a matching key during a CAM read operation. The result of a nondetection is that the memory system 100 fails to provide a record to the host device that has the attributes identified in the target key. From a performance perspective, a nondetection is worse than a false alarm because the memory system 100 may not be equipped with a mechanism to safeguard against nondetections. In contrast, for false alarms, the memory system 100 may safeguard against sending non-matching records to the host device through its error correction processes that it performs before sending records to the host device.

Figure 11:
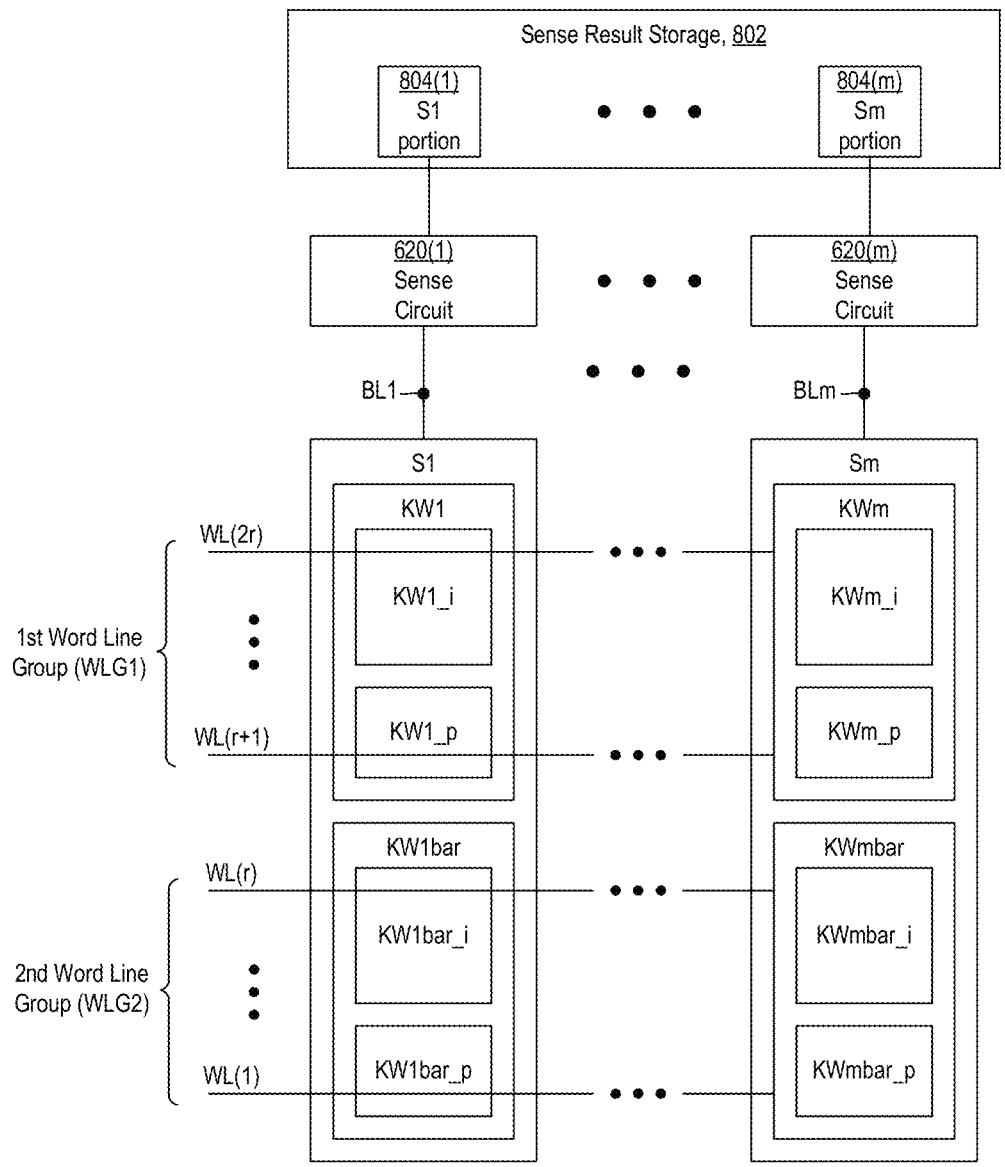
FIG. 11 is a block diagram of at least a portion of a block that includes a plurality of strings storing a plurality of keywords and associated inverse keywords according to a third type of CAM storage scheme.

FIG. 11 shows a block diagram of at least a portion of a block, illustrating an example configuration of a plurality of strings S storing a plurality of keywords KW and corresponding inverse keywords KWbar according to a third type of CAM storage scheme. Note that keywords KW1 to KWm in FIG. 11 are all the same type of key, and in each NAND string a value for said key is provided for a different record. A keyword is a type of key that includes an additional set of bits called parity bits. A keyword includes two parts or components, including information bits and parity bits. Information bits of a keyword form a key K that identifies one or more attributes, and that is part of a key-record pair with an associated record, in accordance with CAM storage schemes and as previously described with reference to FIGS. 8-10. Parity bits of a keyword are extra or additional bits, in addition to the information bits of a keyword, that can be used to detect and/or correct bit errors in the information bits. In addition or alternatively, for CAM read operations, parity bits allow a string storing a keyword with one or more bit errors to be detected as storing a matching key, while reducing or minimizing the likelihood that the detection is a false alarm, as described in further detail below.

As shown in FIG. 11, for some embodiments of the third CAM storage scheme, the program circuit 600 programs the keywords KW and the inverse keywords KWbar into the strings such that each ith string Si stores an ith keyword KWi and an associated ith inverse keyword KWibar. For other embodiments, the ith keyword KWi and the associated ith inverse keyword KWibar are stored in different strings. In particular example configurations, such as those for 3D NAND, the ith keyword KWi and the ith inverse key KWibar are stored in different strings that are part of a same collection or set of stings coupled to a same or common bit line.

Similar to keys, a keyword KW has an associated bit pattern in the form a binary value that includes an r-number of binary digits, each having a logic 1 value or a logic 0 value. Similar to inverse keys Kbar, an inverse keyword KWbar has an inverse bit pattern that is the inverse of the bit pattern of its associated keyword KW. FIG. 11 shows each ith string Si storing an ith keyword KWi and an associated ith inverse keyword KWibar.

In addition, similar to the second type of CAM storage scheme, the word lines coupled to memory cells storing the keywords KW and the inverse keywords KWbar in accordance with the third type of CAM storage scheme may be arranged or organized into a plurality of word lines groups WLG, including a first word line group WLG1 and a second word line group WLG2. Word lines that are part of the first word line group WLG1 are coupled to memory cells storing keywords KW, and word lines that are part of the second word line group WLG2 are coupled to memory cells storing inverse keywords KWbar.

In the example configuration shown in FIG. 11, the first word line group WLG1 and the second word line group WLG2 are non-overlapping, in that the word lines of the first word line group WLG1 are all different from the word lines of the second word line group WLG2. In other example configurations, the first word line group WLG1 and the second word line group WLG2 are overlapping, in that at least one of the word lines of the first word line group WLG1 is the same as at least one of the word lines of the second word line group WLG2. Overlapping word line group situations may occur for configurations where a keyword KW and the associated inverse keyword KWbar are stored in different strings, such as different strings coupled to the same bit line in 3D NAND.

In the example configuration shown in FIG. 11, each keyword KW and each inverse keyword KWbar has an associated keyword length r. In accordance with an SLC storage scheme, within each ith string Si, a first r-number of memory cells stores an ith keyword KWi, and a second r-number of memory cells stores an associated ith inverse keyword KWibar. In addition, in accordance with an SLC storages scheme, the second word line group WLG2 includes a first r-number of word lines WL(1) to WL(r) coupled to memory cells storing the inverse keywords KWbar, and the first word line group WLG1 includes a second r-number of word lines WL(r+1) to WL(2r) coupled to memory cells storing the keywords KW. Other storage configurations are possible, including those where the strings S store keywords KW and inverse keywords KWbar according to MLC storage schemes.

Additionally, FIG. 11 shows each ith keyword KWi including an ith set of information bits KWi_i and an associated ith set of parity bits KWi_p, and each ith inverse keyword KWibar including an ith set of inverse information bits KWibar_i and an associated ith set of inverse parity bits KWibar_p. Accordingly, the example configuration in FIG. 11, each ith string Si is configured to store an ith keyword KWi and an associated ith inverse keyword KWibar, where each ith keyword KWi includes an ith set of information bits KWi_i and an associated ith set of parity bits KWi_p, and each ith inverse keyword KWibar includes an ith set of information bits KWibar_i and an associated ith set of parity bits KWibar_p.

Figure 12:
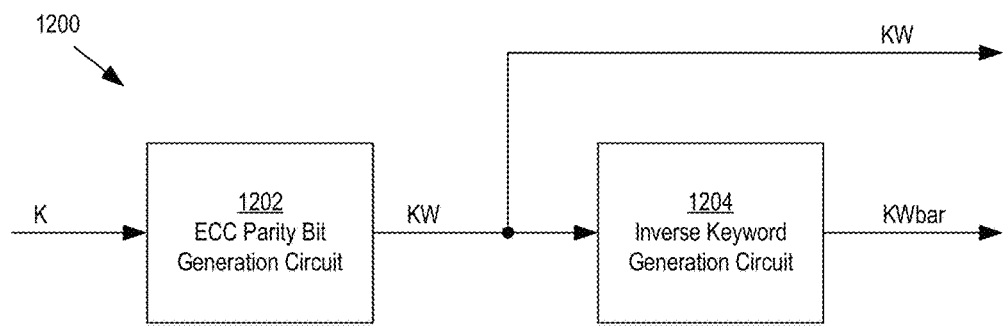
FIG. 12 is a block diagram of an example keyword generation circuit.

FIG. 12 shows a block diagram of an example keyword generation circuit (or circuit system) 1200 configured to generate keywords KW and inverse keywords KWbar. In various embodiments, the circuit components or modules of the circuit 1200 may be located or configured in any of various locations and/or on any of various dies or substrates within the memory system 100. For example, in various embodiments, all of the circuit components of the keyword generation circuit 1200 may be configured as part of the controller 102, all of the circuit components may be configured on the memory dies 104 (such as part of the program circuit 600 and/or the program controller 622 of FIG. 6), the circuit components may be configured on different memory dies 104 from one another, all of the circuit components may be configured on a single memory die 104, some of the circuit components may be configured on the controller 102 while other circuit components are configured on one or more of the memory dies 104, or combinations thereof. In addition or alternatively, in various embodiments, the memory system 100 may include multiple keyword generation circuits. For example, each memory die 104 may include its own keyword generation circuit. In addition or alternatively, in various embodiments, the keyword generation circuit 1200 may be referred to as a controller, whether considered alone or in combination with components of the program circuit 600, and irrespective of whether its components are configured as part of the controller 102, as part of the memory dies 104, or combinations thereof. Various configurations or combinations of configurations of a keyword generation circuit are possible.

In the example configuration in FIG. 12, the circuit components or modules of the keyword generation circuit 1200 includes an error correction code (ECC) parity bit generation circuit 1202 and an inverse keyword generation circuit 1204. As components or modules of the controller 102 and/or one or more of the memory dies 104, each of the ECC parity bit generation circuit 1202 and the inverse keyword generation circuit 1204 may have any of the various hardware and/or combination of hardware and firmware (or hardware and software) configurations that the controller 102 and/or the memory dies 104 can have in order to carry out their respective functions. For some example configurations, the ECC parity bit generation circuit 1202 and the inverse keyword generation circuit 1204 may include separate, discrete sets of circuitry, such as separate, discrete sets of logic circuits or other types of hardware circuits. For other example configurations, the ECC parity bit generation circuit 1202 and the inverse keyword generation circuit 1204 may include the same hardware circuitry, such as the same processor for example, but execute different firmware, such as different sets of computer code or instructions, in order carry out their respective functions, operations, or actions. Various configurations or combinations of configurations are possible for the ECC parity bit generation circuit 1202 and the inverse keyword generation circuit 1204.

The ECC parity bit generation circuit 1202 is configured to generate parity bits for keys K. In particular, the ECC parity bit generation circuit 1202 is configured to generate a set of parity bits for each key K that it receives and/or identifies. The ECC parity bit generation circuit 1202 may be configured to generate a set of parity bits for a particular key K with a bit pattern that corresponds to and/or that is dependent on the bit pattern of the particular key K. The ECC parity bit generation circuit 1202 may be configured with any of various parity bit generation, or encoding, schemes in order to generate a set of parity bits for a given key K, such as Hamming or Bose-Chaudhuri-Hocquenghem (BCH) as non-limiting examples.

In addition, the ECC parity bit generation circuit 1202 may be configured to generate a q-number of parity bits for a given p-number of bits of a key K. For at least some example configurations, the number of parity bits q may depend on a bit error amount or number associated with storage of a keyword or an inverse keyword. In particular embodiments, the bit error amount or number is a maximum t-number of bit errors up to which a portion of a string storing a keyword or an inverse keyword can have and the string can still be detected as storing a matching keyword, without the detection being a false alarm. A matching keyword is keyword that includes a matching key that matches a target key.

In general, a number of bit errors with which a set of memory cells is storing a data set is the number of bits of the data set that are stored in the set of memory cells with incorrect bit values. For example, a set of memory cells that is supposed to store a data bit with a logic 1 value, but is instead storing it with a logic 0 value, is storing that data bit with one bit error.

To detect a string storing a matching keyword, where that string stores a keyword or an inverse keyword with up to a t-number of bit errors, without the detection being a false alarm, every combination of two different keywords may have a distance d greater than or equal to two times the t-number of bit errors plus one, or mathematically, d≥2*t+1. Different keywords are keywords that have different bit patterns.

In general, a distance d between two data sets X1, X2 (such as keys, keywords, or any other type of data having bit patterns) is a number of bits between the bit patterns that have the same bit position but different logic values. Mathematically, a distance d for two data sets X1, X2 is determined by the following formula:

$$d = \sum_{x=1}^{r} XOR(X1, X2),$$

where x is an index indicating a bit position of the bit patterns of the data sets X1, X2, and r is a bit length of each of the data sets X1, X2. By generating a q-number of parity bits such that any two different keywords KWa, KWb has an associated distance d of at least 2*t+1, then if any t-number of bits of each of the different keywords KWa, KWb are flipped (i.e., the logic values of those bits are changed from logic 0 to logic 1, or from logic 1 to logic 0), the distance between those two keywords KWa, KWb is still at least 1. As a result, a string storing a matching keyword can be detected even if the string is storing the keyword or the inverse keyword with up to a t-number of bit errors, without the detection being a false alarm. For at least some example configurations, for a given key K, the ECC parity bit generation circuit 1202 may be configured to generate a number of parity bits based on $\log_2(n)$ (e.g., by rounding up or taking the ceiling of $\log_2(n)$), where n is the number of information bits of the key K, in order to create a distance d of at least 2*t+1, although other numbers of parity bits may be generated to achieve a distance d of at least 2*t+1 for various of configurations.

In addition to generating the parity bits, the ECC parity bit generation circuit 1202 may be configured to form or create the keywords KW by combining the keys K and the parity bits associated with the keys K. For a given keyword KW that includes a key K and an associated set of parity bits, the bits of the key K are interchangeably referred to as the key bits or the information bits of the keyword KW. A keyword KW that is formed has a bit length r—i.e., the number of bits r of a given keyword KW is the sum of the p-number of information bits and the q-number of parity bits of the keyword KW.

The inverse keyword generation circuit 1204 is configured to generate an inverse keyword KWbar in response to receipt of a given keyword KW. As previously described, an inverse keyword KWbar has an inverse bit pattern that is the inverse of the bit pattern of an associated keyword KW. Accordingly, in the example configuration of FIG. 12, the inverse keyword generation circuit 1204 is configured to receive a keyword KW with an associated bit pattern, and in response to receipt, generate an associated inverse keyword KWbar having a bit pattern that is the inverse of the bit pattern of the associated keyword KW.

Other configurations of the keyword generation circuit 1200 may be possible. For example, in other configurations, the keyword generation circuit 1200 includes an inverse key generation circuit, instead of an inverse keyword generation circuit, that generates inverse keys Kbar in response to receipt of keys K. The inverse key generation circuit provides the keys K and the inverse keys Kbar to a parity bit generation circuit, which generates parity bits for each of the keys K and the inverse keys Kbar. In either configuration, the keyword generation circuit 1200 generates keywords KW and associated inverse keyword KWbar for associated keys K.

Upon generating keywords KW and associated inverse keywords KWbar, the keyword generation circuit 1200 may output or provide the keywords KW and the inverse keywords KWbar to the program circuit 600 (FIG. 6). In response, the program circuit 600 may program the keywords KW and the inverse keywords KWbar into a plurality of strings S in accordance with the third type of CAM storage scheme.

When programming the keywords KW and the inverse keywords KWb into the memory cell structures 142 according to the third CAM storage scheme, the program controller 622 may utilize any of various encoding, ordering, or formatting schemes that indicate or determine which bits of each keyword KWi and associated inverse keyword KWibar are stored in which memory cells, as previously described for the first CAM storage scheme with reference to FIGS. 8 and 9. Accordingly, upon receipt of an ith keyword KWi and an ith inverse keyword KWibar, the program controller 622 may identify their respective bit patterns, and based on the bit values of those bit patterns and the scheme it is using, determine how to program (or encode) the ith keyword KWi and the ith inverse keyword KWibar into the string Si, including how to bias the word lines coupled to the string Si, and which threshold voltage levels each of the memory cells of the string Si should be at in order to program the ith keyword KWi and the ith inverse keyword KWibar into the string Si. Also, as described in further detail below, in some example configurations, the program circuit 600 may program an ith keyword KWi and an ith inverse keyword KWibar contiguously within the string Si, such that bits from the ith keyword KWi and from the ith inverse keyword KWibar are not interleaved among adjacent memory cells of the string Si. In other example configurations, the program circuit 600 may program the ith keyword KWi and the ith inverse keyword KWibar by interleaving them along the adjacent memory cells of a string Si. Various ways of programming the keywords KW and the inverse keywords KWbar into the strings depending on the scheme being used are possible. As the program circuit 600 receives keywords KW and inverse keywords KWbar for storage, it programs (or encodes) the strings coupled to columns by identifying their bit patterns and performing programming operations according to the bit values of their bit patterns and the scheme it is using.

Referring back to FIG. 11, to perform a CAM read operation for the third type of CAM storage scheme, the read controller 702 is configured to identify a bit pattern of a target keyword corresponding to a target key and an inverse bit pattern of an associated inverse target keyword. In some example configurations, the keyword generation circuit 1200 generates the target keyword and the associated inverse target keyword in response to receipt of the target key, and the read controller 702 determines the bit patterns of the target keyword and the inverse target keyword in response to the generation of the target keyword and the inverse target keyword. Additionally, in various embodiments, in order to detect which of the plurality of strings S are storing a matching keyword KW (and thus a matching key), the read circuit 700 may be configured to operate in at least one of a plurality of CAM read modes. In the following, five CAM read modes are described.

In a first CAM read mode of the plurality of read modes, the read controller 702 is configured to bias the word lines according to a word line bias setting that corresponds to the bit patterns of the target keyword and the inverse target keyword, such that the read controller 702 biases the first group of word lines WLG1 coupled to memory cells storing the keywords KW at voltage levels, such as high and low voltage levels VH, VL, corresponding to the bit pattern of the target keyword, and biases the second group of word lines WLG2 coupled to memory cells storing the inverse keywords KWbar at voltage levels corresponding to the inverse target keyword. For some example configurations, the word line bias setting that corresponds to the bit patterns of the target keyword and the inverse target keyword may be separated into two word line bias settings, including a target word line bias setting that corresponds to the bit patterns of the target keyword, and an inverse target word line bias setting that corresponds to the bit patterns of the inverse target keyword.

With the word lines biased according the bias setting corresponding to the bit patterns of the target keyword and the inverse target keyword, the plurality of sense circuits 620 may perform a sense operation to determine which of the bit lines conduct, and store sense results, such as in the form of bits each having either a logic 1 value or a logic 0 value, based on the determination in their respective string portions 804, as previously described with respect to FIGS. 8-10. Accordingly, when operating in the first CAM read mode, the read circuit 700, including the plurality of sense circuits 620, is configured to perform a single sense operation to identify which of the plurality of strings S are storing matching keywords, and in turn matching keys. By configuring the strings S to store both the keywords KW and the inverse keywords KWbar, those bit lines BL coupled to strings storing matching keywords, and in turn matching keys, will conduct while minimizing the number of false alarms. However, by performing only a single sense operation, the read controller 702 may be prone to nondetections since the read controller 702 will not test for bit lines BL that do not conduct due to being coupled to a string storing a keyword with at least one bit error.

In a second CAM read mode of the plurality of CAM read modes, the read controller 702 is configured to increase the low voltage level at which it biases word lines from an initial low voltage level $VL^I$ to an increased low voltage level VL'. In some example configurations, the initial low voltage level $VL^I$ is the low voltage level at which the read controller 702 biases the word lines WL in the first CAM read mode. In addition or alternatively, the initial low voltage level $VL^I$ is the read pulse level VrA associated with memory state A (or the program state for SLC storage schemes). The increased low voltage level VL' is a word line voltage level that is higher than the initial low voltage level $VL^I$. In particular example configurations, the increased low voltage level VL' is lower than the high voltage level VH. In at least some example configurations, the read controller 702 may control the control gate line voltage generation circuit 612 to increase the selected word line voltage $V_{WLS}$ from the initial low voltage level $VL^I$ to the increased low voltage level VL', and the row decoder circuit 614 supplies the selected word line voltage $V_{WLS}$ at the increased low voltage level VL' to the word lines biased at the low voltage VL according to the word line bias setting that corresponds to the bit patterns of the target keyword and the inverse target keyword.

With the word lines biased at the high voltage level VH and the increased low voltage level VL' according to the word line bias setting corresponding to the target keyword and the inverse target keyword, the plurality of sense circuits 620 may perform a sense operation to determine which of the bit lines conduct, and store sense results, such as in the form of bits each having either a logic 1 value or a logic 0 value, based on the determination in their respective string portions 804.

For some example configurations, the read controller 702 may be configured to perform a CAM read operation in the second CAM read mode over a plurality of iterations, with the read controller 702 incrementally increasing the level of the low voltage during each next iteration. For example, during a first iteration, the read controller 702 biases the word lines at the high voltage level VH and a first increased low voltage level VL' according to the word line bias setting corresponding to the target and inverse target keywords, and during a second iteration, the read controller 702 biases the word lines WL at the high voltage level VH and a second increased low voltage level VL" according to the bias setting corresponding to the target and inverse target keywords, where the second increased low voltage level VL" is higher than the first increased low voltage level VL'. In various embodiments, the read controller 702 may perform any number of iterations in the second CAM read mode, increasing the level of the low voltage VL during each next iteration from the prior iteration. In this way, the read controller 702 continuously increases the low voltage level as it progresses through the plurality of iterations.

Additionally, for some example embodiments of the second CAM read mode, the read controller 702 is configured to increase or increment the low voltage level VL by a predetermined amount Δ for each iteration. For example, the read controller 702 may set the first increased low voltage level VL' to $VL^I+\Delta$ during a first iteration, the second increased low voltage level VL" to $VL^I+2\Delta$ during a second iteration, and so on.

During each iteration, with the word lines biased at the high voltage level VH and one of a plurality of increased low voltage levels according to the word line bias setting corresponding to the target and inverse target keywords, the plurality of sense circuits 620 may perform a sense operation to determine which of the bit lines conduct, and store sense results, such as in the form of bits each having either a logic 1 value or a logic 0 value, based on the determination in their respective string portions 804.

Accordingly, when performing a CAM read operation over a plurality of iterations in the second CAM read mode, the plurality of sense circuits 620 perform a plurality of sense operations, with the number of sense operations equal to the number of iterations. During and/or at the end of each iteration, the read controller 702 may analyze the sense result storage 802 and determine which of the strings S are storing matching keys. In this context, when performing a CAM read operation over a plurality of iterations in the second CAM read mode, the read controller 702 iterates through a plurality of sense operations, increasing the low voltage level during each sense operation through which it iterates.

When performing a CAM read operation in the second CAM read mode, the read controller 702 may identify strings storing matching keys for those strings S that include memory cells in or close to the erased state, but having threshold voltages above, such as slightly above, the initial low voltage level $VL^I$, such as slightly above the read pulse level VrA associated with memory state A (e.g., the program state in SCL storage schemes). Accordingly, by performing one or more iterations in the second CAM read mode, the read controller 702 may detect matching keys that it otherwise would not have if only performing in the first CAM read mode.

In a third CAM read mode of the plurality of CAM read modes, the read circuit 700 may perform a CAM read operation by performing sets of sense operations, with each set performed for a particular portion of a collection of memory cells storing a keyword or an inverse keyword, and/or for a particular word line group coupled to the particular portion of memory cells. During a set of sense operations for a particular portion and/or word line group, the read controller 702 biases the word line group according to a plurality of associated word line bias settings. For example, the sense circuits 620 perform a first set of sense operations for a first word line group coupled to memory cells storing the keywords and a second set of sense operations for a second word line group coupled to memory cells storing the inverse keywords. During the first set of sense operations, the read controller 702 biases the first word line group according to a first set of word line bias settings. During the second set of sense operations, the read controller 702 biases the second word line group according to a second set of word line bias settings. The sense circuits 620 determines sense results for the first and second sets of sense operations, and the read controller 702 determines if the keyword matches a target keyword based on these sense results.

For at least some example configurations, when operating in the third CAM read mode, the read circuit 700 performs the sets of sense operations over a plurality of iterations. During each iteration, the read controller 702 increases a different one, or a different combination, of the plurality of word line voltages applied to a plurality of word lines. In particular example configurations, during each iteration, the read controller 702 changes a different one, or a different combination, of the plurality of word line voltages at the low voltage level VL to the high voltage level VH, and the plurality of sense circuits 620 perform a sense operation to determine a plurality of sense results in response to the word line voltage changes.

In further detail, when operating in the third CAM read mode, for each set of sense operations for each of the word line groups, the read controller 702 biases a given word line group with a plurality of word line voltages according to a plurality of modified word line bias settings. A modified word line bias setting is a word line bias setting that differs or is modified from an initial word line bias setting (also referred to as a default word line bias setting) that corresponds to bit patterns of a target keyword and an associated inverse target keyword. For some example configurations, the initial or default word line bias setting is the word line bias setting according to which the read controller 702 biases the word lines in the first CAM read mode. Additionally, a modified word line bias setting differs or is modified from the initial bias setting in that it maps at least one word line of the plurality of word lines to a different voltage level than the voltage level to which the at least one word line is/are mapped in the initial word line bias setting. Each of the plurality of modified word line bias settings maps a different word line, or a different combination of word lines, to the different voltage level.

In particular example configurations, the word lines that are mapped to a different voltage level in the modified word line bias settings include those word lines that are mapped to the low voltage level VL in the initial word line bias setting. For such configurations, the initial word line bias setting maps a first set of one or more word lines of the plurality of word lines to the low voltage level VL and a second set of one or more word lines of the plurality of word lines to the high voltage level VH corresponding to the bit patterns of a target key and an inverse target key. Each modified word line bias setting maps at least one of the word lines of the first set to the high voltage level VH instead of the low voltage level VL. Additionally, among the plurality of modified word line bias settings, each modified word line bias setting maps a different word line, or a different combination of word lines, of the first set to the high voltage level VH.

Additionally, the number of word lines that a given modified word line bias setting maps to a different voltage level is dependent on a number of bit errors, such as a maximum number of bit errors, associated with storage of the keyword or an inverse keyword in a string. In particular embodiments, the bit error number is equal to a maximum t-number of bit errors up to which a string storing a keyword or an inverse keyword can have and still be detected as storing a matching keyword, without the detection being a false alarm. For example, if the number t is one, then a given modified word line bias setting maps one word line of the first set to the high voltage level VH. Under such configurations where the number t is one, each modified word line bias setting, from among the plurality of modified word line bias settings, maps a different one of the word lines of the first set to the high voltage level VH. As another example, if the number t is two, then a given modified word line bias setting maps two word lines of the first set to the high voltage level VH. Under such configurations where the number t is two, each modified word line bias setting maps a different combination of two word lines to the high voltage level compared to the other modified word line bias settings.

In addition, each modified word line bias setting is for, corresponds to, or is specific to a particular one of the word line groups. For example, under the third type of CAM storage scheme, each modified word line bias setting corresponds to or is for the first word line group WLG1 of word lines coupled to memory cells storing the keywords, or corresponds to or is for the second word line group WLG2 of word lines coupled to memory cells storing the inverse keywords. For a given modified word line bias setting, which word line(s) of the first set that is/are mapped to the high voltage level VH depends on which word line group to which the given modified word line bias setting corresponds. If the given modified word line bias setting corresponds to the first word line group WLG1, then the word line(s) of the first set that is/are mapped to the high voltage level VH in the given modified word line bias setting is/are part of the first word line group WLG1. If the given modified word line bias setting corresponds to the second word line group WLG2, then the word line(s) of the first set that is/are mapped to the high voltage level VH in the given modified word line bias setting is/are part of the second word line group WLG2.

In this context, the voltage levels indicated by a modified word line bias setting for a particular word line group are modified relative to the voltage levels indicated by the target word line bias setting or the inverse word line bias setting that are also mapped to the word lines of the particular word line group. Accordingly, modified word line groups for the first word line group WLG1 have voltage levels modified relative to the voltage levels indicated in the target word line bias setting that are also for the first word line group WLG1. Similarly, modified word line groups for the second word line group WLG2 have voltage levels modified relative to the voltage levels indicated in the inverse target word line bias setting that are also for the second word line group WLG2.

Additionally, for a given CAM read operation performed according to the third type of CAM storage scheme in the third CAM read mode, an x1-number of modified word line bias settings corresponds to the first word line group WLG1, and an x2-number of modified word line bias settings corresponds to the second word line group WLG2. The x1-number of modified word line bias settings corresponding to the first word line group WLG1 is dependent on an s1-number of word lines coupled to memory cells storing keywords that are biased at the low voltage level VL according to the initial word line bias setting, and the t-number of word lines that a given modified word line bias setting maps to the high voltage level VH instead of the low voltage level VL. Specifically, $$x1 = \binom{s1}{t}.$$

In addition, the x2-number of modified bias settings corresponding to the second word line group WLG2 is dependent on an s2-number of word lines coupled to memory cells storing inverse keywords that are biased at the low voltage level VL according to the initial word line bias setting, and the t-number of word lines that a given modified word line bias setting maps to the high voltage level VH instead of the low voltage level VL. Specifically, $$x2 = \binom{s2}{t}.$$

Accordingly, a total number of modified word line bias settings that the read controller 702 uses to perform a CAM read operation according to the third type of CAM storage scheme in the third CAM read mode is equal to $$x1 + x2 = \binom{s1}{t} + \binom{s2}{t}.$$

In addition, two or more modified word line bias settings that correspond to the same word line group (e.g., the same first word line group or the same second word line group) map different word lines, or different combinations of word lines, to the high voltage level VH, but those word lines that are mapped are part of the same word line group. Additionally, for a given modified word line bias setting, those word lines that are not part of the word line group to which the given modified word line bias setting corresponds are mapped to the high voltage level VH, irrespective of whether they are mapped to the high voltage level VH or the low voltage level VL according to the initial word line bias setting.

When performing a CAM read operation in the third CAM read mode for the third type of CAM storages scheme over a plurality of iterations, the read controller 702 biases the plurality of word lines according to a different modified word line bias setting during each iteration. Accordingly, during each iteration, the read controller 702 biases the word lines according to a modified word line bias setting that it has not previously used. After the read controller 702 biases the word lines according to each of the modified bias settings, the read controller 702 may determine not to perform any further iterations.

Effectively, when biasing the word lines according to a given modified word line bias setting during a given iteration, the read controller 702 may bias a given word line, or a given combination of word lines, at the high voltage level VH that it would otherwise bias at the low voltage level VL when biasing the word lines according to the initial word line bias setting. When transitioning to a next iteration, the read controller 702 may switch the level at which it is biasing the given word line or combination of word lines from the high voltage level VH to the low voltage level VL, and may further switch the level at which it is biasing a different word line, or a different combination of word lines, from the low voltage level VL to the high voltage level VH, according to a different modified word line bias setting. The read controller 702 proceeds in this manner as it cycles or transitions through each of the iterations, switching a bias of one or a combination of word lines from the high voltage level VH to the low voltage level VL, while switching another bias of a different or combination of word lines from the low voltage level VL to the high voltage level VH for a next iteration.

For at least some embodiments, the read controller 702 may determine a sequence or an order of the plurality of modified word line bias settings according to which to bias the word lines over the plurality of iterations, such that each modified word line bias setting corresponds to a respective one of the iterations as determined by the sequence or order. Accordingly, for a given iteration, the read controller 702 may bias the word lines according to a modified word line bias setting that corresponds to the given iterations, and for a next iteration, the read controller 702 may bias the word lines according to another modified word line bias setting that corresponds to the next iteration. In doing so, each word line, or each possible combination of t word lines, that is biased at the low voltage level VL according to the initial word line bias setting, is biased at the high voltage level VH during one of the iterations in the third CAM read mode.

Additionally, during each iteration, with the word lines biased at the high and low voltage levels VH, VL according to one of the modified word line bias settings, the plurality of sense circuits 620 may perform a sense operation to determine which of the bit lines conduct. Accordingly, over the course of a CAM read operation, the number of iterations, and in turn the number of sense operations that the plurality of sense circuits 620 performs, is equal to a total number of modified word line bias settings, which is dependent on an s1-number of word lines coupled to memory cells storing keywords that are biased at the low voltage level VL according to the initial word line bias setting, an s2-number of word lines coupled to memory cells storing inverse keywords that are biased at the low voltage level VL according to the initial word line bias setting, and the t-number of word lines that a given modified word line bias setting maps to the high voltage level VH instead of the low voltage level VL according to the initial bias setting, specifically the sum of a first binomial coefficient $$\binom{s1}{t}$$

and a second binomial coefficient $$\binom{s2}{t}.$$

Effectively, the first binomial coeffecient is the number of a first set of sense operations that the sense circuits 620 perform for the first word line group WLG1, and the second binomial coefficient is the number of a second set of sense operations that the sense circuits 620 perform for the second word line group WLG2.

Also, during each iteration, the plurality of sense circuits 620 store sense results, such as in the form of bits each having either a logic 1 value or a logic 0 value, based on their determinations of which bit lines conducted in their respective string portions 804. To identify whether a string S is storing a matching key, the string portions 804 may include or be coupled to additional logic circuitry that performs logic operations on sense results to identify whether an associated string, storing a keyword and an inverse keyword with up to a t-number of bit errors, is storing a matching keyword.

Figure 13:
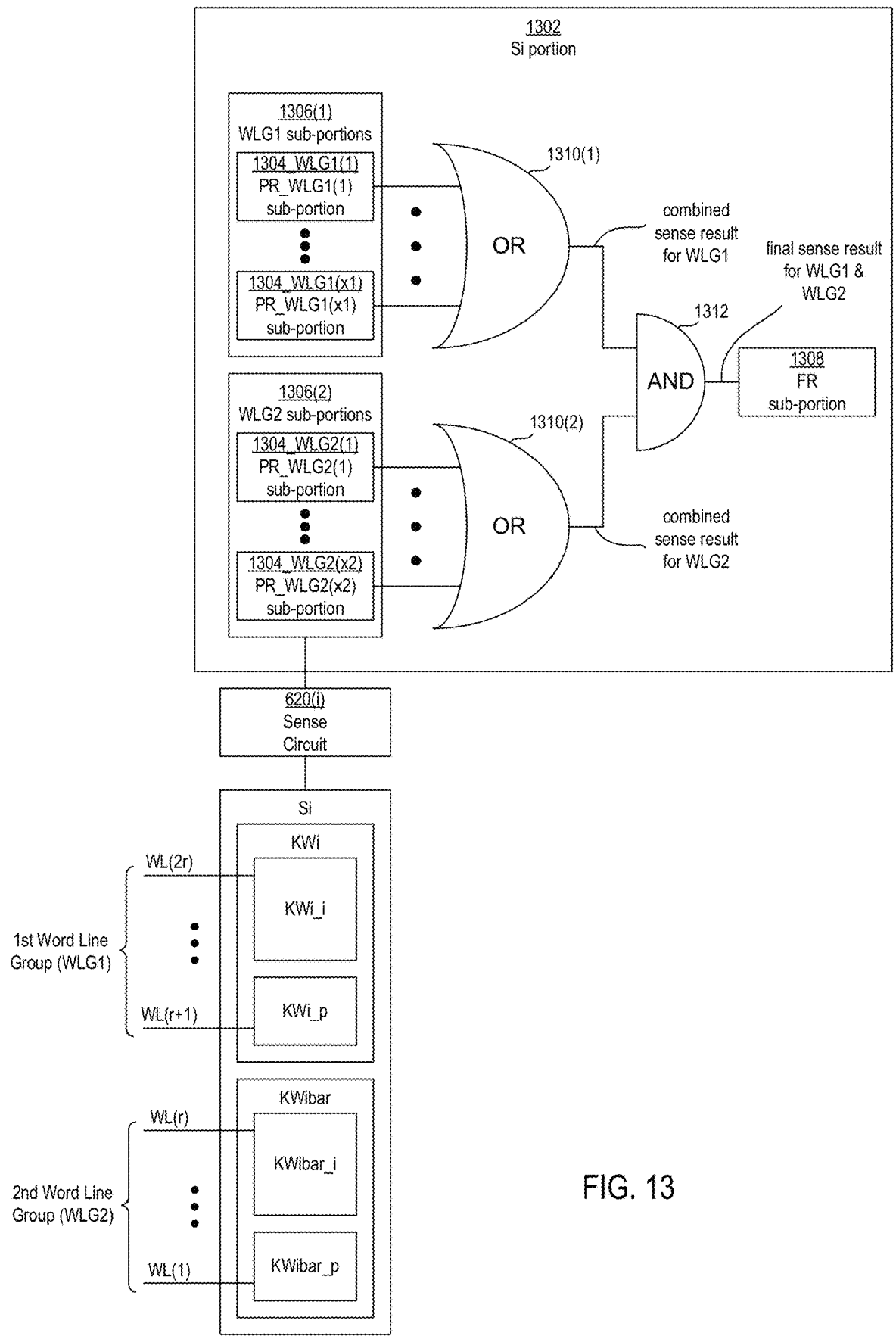
FIG. 13 is a block diagram of an example configuration of a string portion of a sense result storage of FIG. 8 that is configured to store preliminary sense results and determine a final sense result for a string of the block of FIG. 11 that is storing keywords according to the third type of CAM storage scheme.

FIG. 13 shows a block diagram of an example ith string (Si) portion 1302, which may be representative of an example configuration for an ith string portion 804(*i*) used to perform CAM read operations in the third CAM read mode for the third type of CAM storages scheme. FIG. 13 shows the ith string portion 1302 coupled to an associated ith sense circuit 620(*i*) and an associated ith string Si, with the ith string Si storing an ith keyword KWi that includes a set of information bits KWi_i and a set of parity bits KWi_p, and an associated ith inverse keyword KWibar that includes a set of information bits KWibar_i and a set of parity bits KWibar_p. The sense circuit 620(*i*) and the string Si in FIG. 13 may be representative of any of the m-number of sense circuits 620 coupled to the m-number of strings S, as illustrated in FIG. 8. In implementation, each of the m-number of string portions 804(1) to 804(*m*) may have the configuration of the ith string portion 1302 shown in FIG. 13.

Further, in the example configuration in FIG. 13, the string portion 1302 may include a plurality of preliminary result (PR) sub-portions 1304. Each PR sub-portion 1304 may be configured to store a sense result of a sense operation, such as in the form of a single bit having a logic 1 value or a logic 0 value. Additionally, the plurality of PR sub-portions 1304 may be arranged or organized into a plurality of word line group (WLG) sub-portions 1306, each associated with, or corresponding to, one of the plurality of word line groups WLG1, WLG2. For example, a first set of PR sub-portions 1304_WLG1 are arranged or organized into a first word line group (WLG1) of sub-portions 1306(1), and corresponds to the first word line group WLG1 coupled to memory cells storing keywords KW, and a second set of PR sub-portions 1304_WLG2 are arranged or organized into a second word line group (WLG2) of sub-portions 1306(2), and corresponds to the second word line group WLG2 coupled to memory cells storing inverse keywords (KWbar).

Additionally, the number of PR sub-portions 1304 of a given word line group of sub-portions corresponding to a given word line group may be equal to the number of modified word line bias settings that corresponds to the given word line group. As shown in FIG. 13, the first word line group of sub-portions 1306(1) includes an x1-number of PR sub-portions 1304_WLG1(1) to 1304_WLG1(*x*1), equal to an x1-number of modified word line bias settings that corresponds to the first word line group WLG1. Similarly, the second word line group of sub-portions 1306(2) includes an x2-number of PR sub-portions 1304_WLG2(1) to 1304_WLG2(*x*2), equal to an x2-number of modified word line bias settings that corresponds to the second word line group WLG2. Accordingly, each PR sub-portion 1304 is associated with a respective or a different one of the plurality of modified word line bias settings.

To perform a CAM read operation according to the third type of CAM storage scheme in the third CAM read mode, during each iteration, the plurality of sense circuits 620 perform a sense operation with the word lines biased according to a respective one of the modified word line bias settings. In response to performing the sense operation, the sense circuits 620 each store a sense result in a PR sub-portion 1304 that is associated with the respective one of the modified word line bias settings. For example, with respect to FIG. 13, suppose the read controller 702 performs an iteration with the word lines biased according to a first modified word line bias setting corresponding to the first word line group WLG1. In response to the sense operation performed during that iteration, the ith sense circuit 620 stores a sense result, such as a bit having a logic 0 value or a logic 1 value, in the PR sub-portion 1304_WLG1(1) associated with the first modified word line bias setting corresponding to the first word line group WLG1.

The sense results stored in the PR sub-portions 1304 may be referred to as preliminary or initial sense results that the read circuit 700 combines by performing logic operations, such as AND and OR logic operations, in order to generate final sense results that indicate or identify which of the strings are storing a matching keyword, where each string stores a keyword or an inverse keyword with up to a t-number of bit errors. For at least some example configurations, each of the string portions 804 may store their final results in an associated final result (FR) sub-portion. FIG. 13 shows the string portion 1302 associated with the ith string Si including an associated final result (FR) sub-portion 1308 configured to store a final sense result that indicates whether the ith string Si is storing a matching keyword.

In further detail, the read circuit 700 is configured to perform an OR operation on the preliminary sense results generated from sense operations that correspond to, and/or are performed, for the same word line group. The sense circuits 620 perform sense operations for the same word line group where the sense operations are performed while word lines are biased according to modified word line bias settings that correspond to the same word line group. To elaborate further, during a CAM read operation, the read controller 702 performs an x-number of iterations, each with the word lines biased according to a respective one of the modified word line bias settings that correspond to the same word line group, and the plurality of sense circuits 620 perform an x-number of sense operations over the x-number of iterations, and store an x-number of preliminary sense results in the PR sub-portions 1304 associated with that same word line group.

So for example, with respect to FIG. 13, the read circuit 700 performs an x1-number of iterations, each with the word lines biased according to a respective one of the x1-number of modified word line bias settings that correspond to the first word line group WLG1, and the ith sense circuit 620(*i*) performs an x1-number of a first set of sense operations for the first word line group WLG1 over the x1-number of iterations, and determines an x1-number of preliminary sense results, storing them in the PR sub-portions 1304_WLG1(1) to 1304_WLG1(*x*1). Upon generating the preliminary sense results for sense operations performed for the same word line group, the read circuit 700 performs an OR logic operation on those preliminary sense results to generate a combined sense result for the first word line group.

Similarly, the read circuit 700 performs an x2-number of iterations, each with the word lines biased according to a respective one of the x2-number of modified word line bias settings that correspond to the second word line group WLG2, and the ith sense circuit 620(*i*) performs an x2-number of a second set of sense operations for the second word line group WLG2 over the x2-number of iterations, and determines an x2-number of preliminary sense results, storing them in the PR sub-portions 1304_WLG2(1) to 1304_WLG2(*x*2). Upon generating the preliminary sense results for sense operations performed for the same word line group, the read circuit 700 performs an OR logic operation on those preliminary sense results to generate a combined sense result for the second word line group WLG2.

The read circuit 700 may include OR logic circuitry configured to perform the OR logic operations. In the example configuration shown in FIG. 13, the ith string portion 1302 is shown as including, or coupled to, OR logic circuitry in the form a plurality of OR logic circuits 1310 to perform the OR logic operations, including a first OR logic circuit 1310(1) and a second OR logic circuit 1310(2). The first OR logic circuit 1310(1) is configured to perform an OR logic operation on the x1-number of preliminary sense results generated from the x1-number of sense operations performed for the first word line group WLG1, and in response, generate a first combined sense result for the first word line group WLG1. Similarly, the second OR logic circuit 1310(2) is configured to perform an OR logic operation on the x2-number of preliminary sense results generated from the x2-number of sense operations performed for the second word line group WLG2, and in response, generate a second combined sense result for the second word line group WLG2.

To generate a final sense result for the CAM read operation for a given ith string Si, the read circuit 700 may further be configured to perform an AND logic operation on the combined sense results for the word line groups WLG. The result or outcome of the AND logic operation is the final sense result.

In the example configuration shown in FIG. 13, the ith string portion 1302 is shown as including, or coupled to, an AND logic circuit 1312 that is configured to perform an AND logic operation on the combined sense result for the first word line group WLG1 and the combined sense result for the second word line group WLG2, and generate a final sense result for the first and second word line groups WLG1, WLG2 in response to the AND logic operation. The final result (FR) sub-portion 1308 may be configured to store the final sense result generated by the AND logic circuit 1312, such as a bit having a logic 1 value or a logic 0 value, to indicate whether the ith string Si is storing a matching keyword.

After performing all of the iterations, the read controller 702 may analyze the final sense results in the sense result storage 802 to determine which of the bit lines and/or strings conducted during the sense operation, such as by determining which of the string portions 804 are storing a logic 1 value and which are storing a logic 0 value. In response to the analysis, the read controller 702 may determine which strings are storing matching keywords, and either send column addresses of those strings back to the controller 102, or based on the column address of those strings, retrieve records associated with those matching keywords without having to first communicate with the controller 102. The memory dies 104 may send the retrieved records to the controller 102, which in turn may send the retrieved records to the host device that sent the target key.

During a given iteration of a CAM read operation, when biasing the word lines according to a modified word line bias setting corresponding to a given word line group, the read controller 702 biases a corresponding t-number of word lines that are part of the given word line group at the high voltage level VH that would otherwise be biased at the low voltage level VL if biased according to the initial word line bias setting, as previously described. Consequently, in the event that memory cells of the ith string Si that are coupled to the corresponding t-number of word lines are storing data with up to a t-number of bit errors (e.g., storing data having a logic 0 value instead of a logic 1 value), those memory cells will still be able to conduct since their control gates are biased at the high voltage level VH instead of the low voltage level VL. Also, according to the given modified word line bias setting, the read controller 702 biases word lines that are not part of the given word line group at the high voltage level VH so that memory cells of the ith string Si that are coupled to those word lines will be able to conduct, thereby not affecting or influencing the outcome of the sense operation performed during the given iteration. As a result, if the ith string Si is storing a matching keyword, but is storing that matching keyword or the inverse matching keyword with up to a t-number of bit errors, the ith string Si (and the ith bit line BLi) will conduct at least once over the x1-number of sense operations performed for the first word line group WLG1, and will conduct at least once over the x2-number of sense operations performed for the second word line group WLG2, causing the OR logic circuits 1310 to each output their respective combined sense results at a logic 1 value, and in turn causing the AND logic circuit 1312 to output the final sense result at a logic 1 value to indicate that the ith string Si is storing a matching keyword. Alternatively, if the ith string Si is not storing a matching keyword, the ith string Si (and the ith bit line Bli) will not conduct at least once over the x1-number of sense operations performed for the first word line group WLG1, and/or will not conduct at least once over the x2-number of sense operations performed for the second word line group WLG2, causing at least one of the OR logic circuits 1310 to output a respective combined sense result at a logic 0 value, in turn causing the AND logic circuit 1312 to output the final sense result at a logic 0 value to indicate that the ith string is not storing a matching keyword.

In addition, the OR and AND logic circuits 1310, 1312 are merely examples, and any of various types of circuits, including hardware circuits or a combination of hardware and software circuits, may be used to carry out the OR and AND logic operations. Also, any of various types of logic circuits, or other types of circuits configured to perform any of various types of logic operations, in addition or alternatively to OR and AND operations, may be used to effectively combine preliminary sense results to determine a final sense result, such as logical inversion operations, NOR, NAND, XOR, XNOR, or the like.

In a fourth CAM read mode of the plurality of CAM read modes, the read circuit 700 may be configured to perform a hybrid or combination of the second and third CAM read modes. According to this hybrid or combination, the read circuit 700 performs a CAM read operation according to the third CAM read mode in cycles or loops. Within a given loop or cycle, the read circuit 700 performs the plurality of sets of sense operations for the word line groups over the plurality of iterations, as described. At the end of the given loop, the read controller 702 may check a number of final sense results to determine if a number of matching keywords has exceeded a threshold. If it has, then the read controller 702 may end the CAM read operation. If it has not, then the read controller 702 may enter a next loop or cycle. In that next loop, the read controller 702 may increase the level of the low voltage VL used for the modified word line bias settings, similar to the second CAM read mode. Accordingly, for the fourth CAM read mode, the read circuit 700 may perform a CAM read operation over a plurality of loops, where the read circuit 700 operates in the third CAM read mode for each loop, and where for each next loop, the read controller 702 increases or increments the level of the low voltage VL from the level in the prior loop.

Additionally, in various embodiments, the read circuit 700 may be configured to operate in a fifth CAM read mode for the third CAM storage scheme. In the fifth CAM read mode, the read circuit 700 is configured to perform a CAM read operation over a plurality of iterations. During each iteration, the read controller 702 biases the word lines according to a word line bias setting that corresponds to bit patterns of a target keyword and an inverse target keyword, such as in the first and second CAM read modes as previously described. For one of the iterations, the low voltage level at which the read controller 702 biases the first set of word lines is the read pulse level VrA associated with memory state A (or the program state for SLC storage schemes). For another iteration, the low voltage level at which the read controller 702 biases the first set of word lines is a first predetermined amount higher than, or above, the read pulse level VrA. For a third iteration, the low voltage level at which the read controller 702 biases the first set of word lines is a second predetermined amount lower than, or below, the read pulse level VrA. In various embodiments, the magnitudes of the first and second predetermined amounts may be the same as or different from each other.

Additionally, during each iteration, with the word lines biased according to the word line bias setting, the plurality of sense circuits 620 may perform a sense operation and, in response, store sense results for each string. Accordingly, after the plurality of iterations, the plurality of sense circuits 620 store a plurality of sense results for each string. For example, if the read circuit 700 performs three iterations, the plurality of sense circuits store three sense results for each string. After performing the plurality of iterations, the read controller 702 may perform a plurality of OR logic operations, with each OR logic operation performed on the sense results pertaining to a respective string. The read controller 702 may store the results of the OR logic operations as final sense results for the plurality of strings in the string portions 804. For each string, if the string (and associated bit line) conducts during at least one of the iterations, the read controller 702 may store the final result as a logic 1 value to indicate that the string is storing a matching keyword. Alternatively, if the string (and associated bit line) does not conduct during any of the iterations, the read controller 702 may store the final result as a logic 0 value to indicate that the string is not storing a matching keyword.

For some example embodiments, the plurality of low voltages may correspond to overlapping regions of expected or actual threshold voltage distribution curves. Although FIGS. 5A-5D show the threshold voltage distribution curves as non-overlapping, in actual implementation, the upper tail of one threshold voltage distribution curve may overlap with the lower tail of another threshold voltage distribution curve. Accordingly, when a word line is biased at a given read pulse level Vr during a sense operation, whether or not a bit line conducts may indicate a likelihood or probability, rather than 100% certainty, of a data value that a memory cell coupled to the word line is storing. For example, in SLC storage schemes, if a bit line conducts when a word line is biased at the read pulse level VrA, the conduction may indicate only a likelihood or a probability that a memory cell coupled to the word line is in the erased state, not an absolute certainty that the memory cell is in the erased state. If the word line is biased at a word line voltage level lower than the read pulse level VrA and the bit line still conducts, the higher the probability that the memory cell is in the erased state, and the lower the probability that the memory cell is in the program state. In addition, if the word line is biased at a word line voltage level higher than the read pulse level VrA and the bit line conducts, the lower the probability that the memory cell is in the erased state, and the higher the probability that the memory cell is in the program state. For such embodiments, a sense result generated when the word line is biased at the read pulse level VrA may be referred to as a hard bit value identifying a detected data value that the memory cell is storing, and a sense result generated when the word line is biased at a level higher or lower than the read pulse level VrA may be referred to as a soft bit value that indicates a likelihood that the detected data value is correct. In this context, for the fifth CAM read mode, the plurality of low voltage levels at which the read controller 702 biases the first set of word lines in the fifth CAM read mode corresponds to the voltage levels that the read controller 702 biases to word lines to determine hard and soft bit values.

As previously described with reference to FIG. 12, the ECC parity bit generation circuit 1202 may generate the q-number of parity bits for each key K such that a minimum distance d for any two different keywords stored in the plurality of strings S is $2*t+1$. As a result of doing so, the keywords are sufficiently different from one other such that when the read controller 702 changes word line voltages, or combinations of word line voltages, from the low voltage level VL to the high voltage level VH according to the modified word line bias settings as it progresses or moves through the iterations, those changes in voltage level do not cause strings that are not storing matching keys or inverse matching keys to conduct. In turn, those string sub-portions 804 for strings that are not storing matching keywords with up to a t-number of bit errors will not store final sense results with logic 1 values, minimizing the number of false alarms.

Additionally, in order to detect strings storing matching keywords, where those strings are storing keywords or inverse keywords with up to a t-number of bit errors, the q-number of parity bits generated for a p-number of information bits increases as t increases. Due to design constraints (e.g., the number of word lines of a block) or performance constraints (e.g., the number of sense operation to perform within a CAM read operation), it may be desirable to minimize the q-number of parity bits that the ECC parity bit generation circuit 1202 generates for each keyword. The minimum q-number of parity bits that can be generated are for configurations where t is 1. However, the larger the key length of a key (or the greater the number of information bits) of a keyword, the higher the likelihood that memory cells storing the keyword will be storing it with more than one bit error. Thus, generating a q-number number of parity bits for detecting strings storing relatively long matching keywords with no more than a single bit error may undesirably lead to nondetections. To keep t as a minimum (such as 1), a fourth type of CAM storages scheme separates keys into portions and stores keyword and inverse keyword portions, as described in further detail below.

Figure 14:
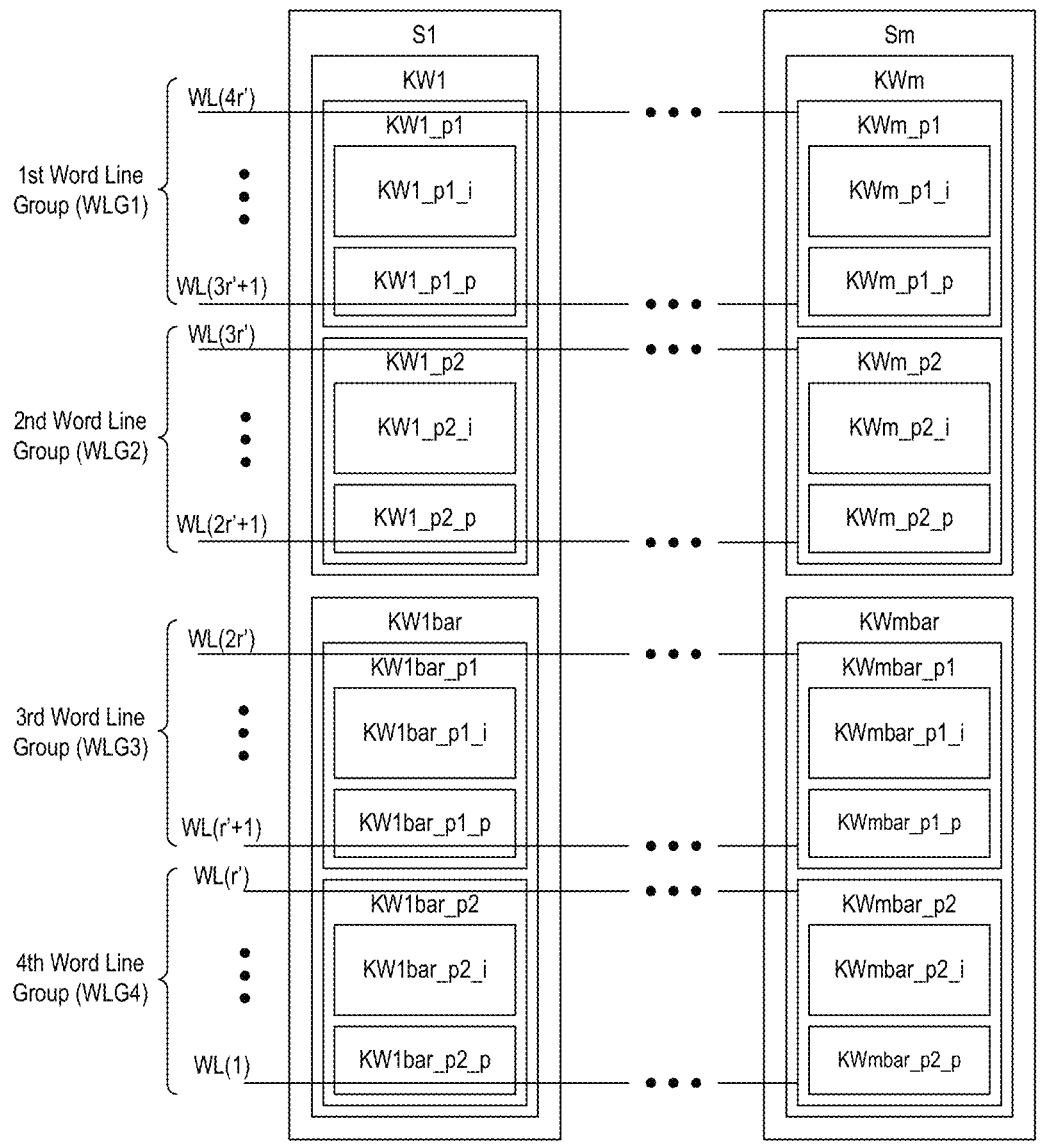
FIG. 14 is a block diagram of at least a portion of a block that includes a plurality of strings storing a plurality of keyword portions and corresponding inverse keyword portions according to a fourth type of CAM storage scheme.

FIG. 14 shows a block diagram of at least a portion of a block, illustrating an example configuration of a plurality of strings S storing a plurality of keyword portions KW_p and corresponding inverse keyword portions KWb_p according to a fourth type of CAM storage scheme. A keyword portion is a portion or a part of a keyword. Under the fourth type of CAM storage scheme, a jth keyword KWj stored in a jth string Sj includes a plurality of keyword portions KWj_p. Likewise, an inverse keyword portion is a portion or a part of an inverse keyword. Accordingly, a jth inverse keyword KWjbar includes a plurality of inverse keyword portions KWjbar_p. In addition, each kth keyword portion KWj_pk of a jth keyword KWj has an associated kth inverse keyword portion KWjbar_pk of an associated jth inverse keyword KWjbar. Specifically, the kth inverse keyword portion KWjbar_pk has an inverse bit pattern that is the inverse of the bit pattern of the associated kth keyword portion KWjbar_pk.

Further, each kth keyword portion KWj_pk of a jth keyword KWj includes a set of information bits KWj_pk_i and a set of parity bits KWj_pk_p. The information bits KWj_pk_i is a portion or a part of a kth key Kk stored in the memory dies 104. Similarly, each kth inverse keyword portion KWjbar_pk of a jth inverse keyword KWjbar includes a set of information bits KWjbar_pk_i and a set of parity bits KWjbar_pk_p. Essentially, a keyword portion (or an inverse keyword portion) is generated and/or formatted in the same or similar way as a keyword (or an inverse keyword) in that each includes a set of information bits and a set of parity bits that has a bit pattern of logic 1 and logic 0 values specific to the bit pattern of the set of information bits. However, the keyword portions and inverse keyword portions are smaller in length at least because they have fewer numbers of information bits relative to keywords and inverse keywords.

Figure 15:
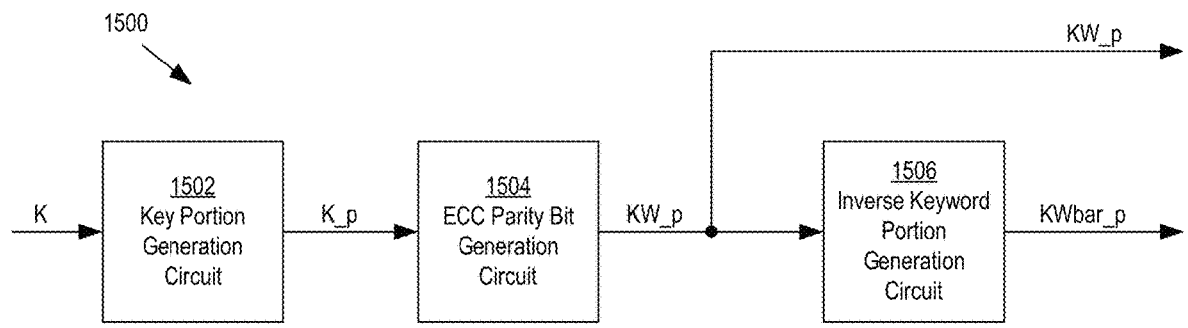
FIG. 15 is a block diagram of an example keyword portion generation circuit.

FIG. 15 shows a block diagram of an example keyword portion generation circuit (or circuit system) 1500 configured to generate keyword portions KW_p and inverse keyword portions KWbar_p. In various embodiments, the circuit components or modules of the circuit 1500 may be located or configured in any of various locations and/or on any of various dies or substrates within the memory system 100. For example, in various embodiments, all of the circuit components of the keyword portion generation circuit 1500 may be configured as part of the controller 102, all of the circuit components may be configured on the memory dies 104 (such as part of the program 600 and/or the program controller 622 of FIG. 6), the circuit components may be configured to different memory dies 104 from one another, all of the circuit components may be configured on a single memory die 104, some of the circuit components may be configured on the controller 102 while other circuit components are configured on one or more of the memory dies 104, or combinations thereof. In addition or alternatively, in various embodiments, the memory system 100 may include multiple keyword portion generation circuits. For example, each memory die 104 may include its own keyword generation circuit. In addition or alternatively, in various embodiments, the keyword generation circuit 1500 may be referred to as a controller, whether considered alone or in combination with components of the program circuit 600, and irrespective of whether its components are configured as part of the controller 102, as part of the memory dies 104, or combinations thereof. Various configurations or combinations of configurations of a keyword generation circuit are possible.

In the example configuration in FIG. 15, the keyword portion generation circuit 1500 includes a key portion generation circuit 1502, an error correction code (ECC) parity bit generation circuit 1504, and an inverse keyword portion generation circuit 1506. As components or modules of the controller 102 and/or one or more of the memory dies 104, each of the key portion generation circuit 1502, the ECC parity bit generation circuit 1504, and the inverse keyword portion generation circuit 1506 may have any of the various hardware and/or combination of hardware and firmware (or hardware and software) configurations that the controller 102 and/or the memory dies 104 can have in order to carry out their respective functions. For some example configurations, key portion generation circuit 1502, the parity bit generation circuit 1502, and the inverse keyword portion generation circuit 1506 may include separate, discrete sets of circuitry, such as separate, discrete sets of logic circuits or other types of hardware circuits. For other example configurations, the key portion generation circuit 1502, the ECC parity bit generation circuit 1504, and the inverse keyword portion generation circuit 1506 may include the same hardware circuitry, such as the same processor for example, but execute different firmware, such as different sets of computer code or instructions, in order carry out their respective functions, operations, or actions. Various configurations or combinations of configurations are possible for the key portion generation circuit 1502, the ECC parity bit generation circuit 1504, and the inverse keyword portion generation circuit 1506.

As shown in FIG. 15, the key portion generation circuit 1502 is configured to generate key portions K_p for keys K. A key portion is a portion or a part of a key that is part of a key-record pair and that identifies one or more attributes, in accordance with CAM storage schemes. The key portion generation circuit 1502 may be configured to receive a given key K to be stored in the memory dies 104 under the fourth type of CAM storage scheme, and in response, divide or separate the given key K into a plurality of key portions K_p, such as by separating or dividing a bit pattern of a given key into a predetermined number of bit groups, with each bit group being a key portion of the given key. To illustrate, suppose a given key has 9 bits, and the key portion generation circuit 1502 is configured to generate key portions of 3 bits. In response to the 9-bit given key, the key portion generation circuit 1502 generates three key portions for the given key, each having 3 bits.

The ECC parity bit generation circuit 1504 is configured to generate parity bits for the key portions K_p. In particular, the ECC parity bit generation circuit 1504 is configured to generate a specific set of parity bits for each key portion K_p that it receives or otherwise identifies. The ECC parity bit generation circuit 1504 may be configured the same as or similar to the ECC parity bit generation circuit 1202 of FIG. 12. In addition, the ECC parity bit generation circuit 1504 may generate a q-number of parity bits for each key portion such for any two different keyword portions, an associated distance d for the two different keyword portions is at least $2*t+1$, where t is the number of bit errors with which a set of memory cells of a string storing a keyword portion or an inverse keyword portion can have and the string can still be detected as storing a matching keyword. For at least some example configurations, for a given key portion K_p, the ECC parity bit generation circuit 1202 may be configured to generate a number of parity bits based on $\log_2(n)$ (e.g., by rounding up or taking the ceiling of $\log_2(n)$), where n is the number of information bits of the key K, in order to create a distance d of at least $2*t+1$, although other numbers of parity bits may be generated to achieve a distance d of at least $2*t+1$ for various of configurations. In addition to generating the parity bits, the ECC parity bit generation circuit 1504 may be configured to form the keyword portions KW_p, such as by combining the key portions K_p with respective sets of parity bits that it generates.

The inverse keyword portion generation circuit 1506 may be configured to generate inverse keyword portions KWbar_p based on the keyword portions KW_p that are formed by the ECC parity bit generation circuit 1504. The inverse keyword portion generation circuit 1506 generates the inverse keyword portions KWbar_p such that their bit patterns are inverse to the bit patterns of associated keyword portions KW_p.

Other configurations of the keyword portion generation circuit 1500 may be possible. For example, in other configurations, the keyword portion generation circuit 1500 includes an inverse key portion generation circuit, instead of an inverse keyword generation circuit, that generates inverse key portions Kbar_p in response to receipt of key portions K_p. The inverse key portion generation circuit provides the key portions K_p and the inverse key portions Kbar_p to a parity bit generation circuit, which generates parity bits for each of the key portions K_p and the inverse key portions Kbar_p. In either configuration, the keyword portion generation circuit 1500 generates keyword portions KW_p and associated inverse keyword portions KWbar_p for associated keys K.

Upon generating keyword portions KW_p and associated inverse keyword portions KWbar_p, the keyword portion generation circuit 1500 may output or provide the keyword portions KW_p and the inverse keyword portions KWbar_p to the program circuit 600 (FIG. 6). In response, the program circuit 600 may program the keyword portions KW_p and the inverse keyword portions KWbare_p into a plurality of strings S in accordance with the fourth type of CAM storage scheme.

When programming the keyword portions KW_p and the inverse keyword portions KWb_p into the memory cell structures 142 according to the fourth CAM storage scheme, the program controller 622 may utilize any of various encoding, ordering, or formatting schemes that indicate or determine which bits of each keyword portion KWi_p and associated inverse keyword portion KWibar_p are stored in which memory cells, as previously described for the first CAM storage scheme with reference to FIGS. 8 and 9. Accordingly, upon receipt of keyword portions an ith keyword KWi and inverse keyword portions of an ith inverse keyword KWibar, the program controller 622 may identify their respective bit patterns, and based on the bit values of those bit patterns and the scheme it is using, determine how to program (or encode) the keyword portions and inverse keyword portions of the ith keyword KWi and the ith inverse keyword KWibar into the string Si, including how to bias the word lines coupled to the string Si, and which threshold voltage levels each of the memory cells of the string Si should be at in order to program the ith keyword KWi and the ith inverse keyword KWibar into the string Si. Also, in some example configurations, the program circuit 600 may program the keyword portions of an ith keyword KWi and the inverse keyword portions of an ith inverse keyword KWibar contiguously within the string Si, such that bits from the bits from the various portions are not interleaved among adjacent memory cells of the string Si. In other example configurations, the program circuit 600 may program the various portions of the ith keyword KWi and the ith inverse keyword KWibar by interleaving them along the adjacent memory cells of a string Si. Various ways of programming the portions of the keywords KW and the inverse keywords KWbar into the strings depending on the scheme being used are possible. As the program circuit 600 receives portions of keywords KW and inverse keywords KWbar for storage, it programs (or encodes) the strings coupled to columns by identifying their bit patterns and performing programming operations according to the bit values of the bit pattern and the scheme it is using.

Referring back to FIG. 14, for some embodiments of the fourth type of CAM storage scheme, each ith string Si stores an ith keyword KWi and an associated ith inverse keyword KWibar. Each ith keyword KWi includes a plurality of keyword portions KWi_p, and the associated ith inverse keyword KWibar includes a plurality of inverse keyword portions KWibar_p. For other embodiments, the various keyword and inverse keyword portions KW_p, KWbar_p are stored in multiple strings, such that among the various keyword and keyword portions KW_p, KWbar_p, at least two of the portions are stored in different strings. In particular example configurations, such as those for 3D NAND, the different strings in which the keyword and inverse keyword portions KW_p, KWbar_p are part of a same collection or set of strings coupled to a same or common bit line.

Additionally, in the example configuration in FIG. 14, each ith keyword KWi includes two keyword portions KWi_p1 and KWi_p2, and each associated ith inverse keyword KWib includes two associated inverse keyword portions KWibar_p1 and KWibar_p2, although numbers of portions other than two (such as three or more) may be possible for other configurations.

In addition, similar to the third type of CAM storage scheme, under the fourth type of CAM storage scheme, word lines WL of a block storing keyword portions KW_p and inverse keyword portions KWbar_p are separated or organized into a plurality of word line groups WLG. For the fourth type of CAM storage scheme, each word line group includes word lines coupled to memory cells storing a particular keyword portion or a particular inverse keyword portion. Accordingly, the number of word line groups WLG is equal to the sum of the number of keyword portions KW_p and the number of inverse keyword portions KWbar_p that form part of a given keyword KW and an associated inverse keyword KWbar. For example, with respect to the configuration in FIG. 14, each ith keyword KWi and associated ith inverse keyword KWibar include two keyword portions KWi_p1, KWi_p2 and two inverse keyword portions KWbar_p1, KWbar_p2. Accordingly, the word lines coupled to memory cells storing the keywords KW and inverse keywords KWbar are divided or organized into four word line groups, including: a first word line group WLG1 of word lines coupled to memory cells storing first keyword portions KW_p1 of the keywords KW, a second word line group WLG2 of word lines coupled to memory cells storing second keyword portions KW_p2 of the keywords KW, a third word line group WLG3 of word lines coupled to memory cells storing first inverse keyword portions KWbar_p1 of the inverse keywords, and a fourth word line group WLG4 of word lines coupled to memory cells storing second inverse keyword portions KWbar_p2 of the inverse keywords KWb. Other numbers of word line groups are possible for other example configurations storing different numbers of keyword and inverse keyword portions.

In addition, similar to the third type of CAM storage scheme, FIG. 14 shows the four word line groups WLG1-WLG4 as non-overlapping, in that the word lines of the first word line group WLG1 are all different from the word lines of the second, third, and fourth word line groups WLG2-WLG4, and so forth. In other example configurations, at least two of the word line groups, in that at least one of the word lines of one of the word line groups is the same as at least one of the word lines of another of the word line groups. Overlapping word line group situations may occur for configurations store different keyword portions and/or inverse keyword portions in different strings, such as different strings coupled to the same bit line in 3D NAND.

To perform a CAM read operation according to the fourth type of CAM storage scheme, the read controller 702 is configured to identify bit patterns of target keyword portions corresponding to a target key and inverse bit patterns of associated inverse target keyword portions. How many bit patterns of portions of the target keyword and the inverse target keyword that the read controller 702 identifies corresponds to the numbers of portions of keywords and inverse keywords that the strings are storing. For example, with respect to the example configuration in FIG. 14, the read controller 702 identifies a bit pattern for a first target keyword portion, a bit pattern for a second target keyword portion, a bit pattern for a first inverse target keyword portion, and a bit pattern for the second inverse target keyword portion. In some example configurations, the keyword portion generation circuit 1500 generates the target keyword portions and the associated inverse target keyword portions in response to receipt of the target key, and the read controller 702 determines the bit patterns of the target keyword portions and the inverse target keyword portions in response to the generation of the target keyword portions and the inverse target keyword portions.

Additionally, in various embodiments, in order to detect which of the plurality of strings S are storing a matching keyword KW (and thus a matching key), the read circuit 700 may be configured to operate in at least one of a plurality of CAM read modes, including a first CAM read mode, a second CAM read mode, a third CAM read mode, a fourth CAM read mode, and/or a five CAM read mode, similar to the first through fifth CAM read modes described for the third type of CAM storage scheme.

To perform a CAM read operation in the first CAM read mode for the fourth type of CAM storage scheme, the read controller 702 is configured to bias the word lines according to a word line bias setting that corresponds to the bit patterns of the target key portions and the inverse target key portions. In doing so, with respect to the configuration in FIG. 14, the read controller 702 is configured to bias the first word line group WLG1 according at high and low voltage levels VH, VL that corresponds to the bit pattern of the first target keyword portion, bias the second word line group WLG2 according the high and low voltage levels VH, VL that corresponds to the bit pattern of the second target keyword portion, bias the third word line group WLG3 at high and low voltage levels VH, VL that corresponds to the bit pattern of the first inverse target keyword portion, and bias the fourth word line group WLG4 at the high and low voltage levels VH, VL that corresponds to the bit pattern of the second inverse target keyword portion.

With the word line groups WLG biased according to the word line bias setting corresponding to the target keyword and inverse target keyword portions, the plurality of sense circuits 620 may perform a sense operation to determine which of the bit lines conduct, and store sense results, such as in the form of bits each having either a logic 1 value or a logic 0 value, based on the determination in their respective string portions 804. Accordingly, when operating in the first CAM read mode, the read circuit 700, including the plurality of sense circuits 620, is configured to perform a single sense operation to identify which of the plurality of strings S are storing matching keywords, and in turn matching keys.

The read circuit 700 is also configured to operate in a similar manner when operating in the second CAM read mode for the fourth type of CAM storage scheme, as it does when operating in the second CAM read mode for the third type of CAM storage scheme. That is, when operating in the second CAM read mode, the read controller 702 is configured to bias the word line groups WLG according to a word line bias setting that corresponds to the bit patterns of target keyword portions and inverse target keyword portions, but with one or more increased low voltage levels. The read controller 702 may perform a CAM read operation in the second CAM read mode for the fourth CAM storage scheme in a single iteration, or over a plurality of iterations. When performing a CAM read operation in the second CAM read mode over a plurality of iterations, the read controller 702 increases the low voltage level for each next iteration, as previously described.

Also, the read controller 702 is configured to operate in a similar manner when operating in the third CAM read mode for the fourth type of CAM storage scheme, as it does when operating in the third CAM read mode for the third type of CAM storage scheme. That is, in the third CAM read mode, the read circuit 700 may perform a CAM read operation by performing sets of sense operations, with each set performed for a particular portion of a collection of memory cells storing a keyword portion KW_p or an inverse keyword portion KWbar_p, and/or for a particular word line group coupled to the particular portion of memory cells. As with the third type of CAM storage scheme, during a set of sense operations for a particular portion and/or word line group, the read controller 702 biases the word line group according to a plurality of associated word line bias settings. The sense circuits 620 determines sense results for the sets of sense operations, and the read controller 702 determines if the keyword matches a target keyword based on these sense results.

In particular configurations, the read circuit 700 performs a CAM read operation in the third CAM read mode for the fourth CAM storage scheme over a plurality of iterations. During each iteration, the read controller 702 increases a different one, or a different combination, of the plurality of word line voltages applied to the word lines. In particular example configurations, during each iteration, the read controller 702 changes a different one, or a different combination, of the plurality of word line voltages at the low voltage level VL to the high voltage level VH, and the plurality of sense circuits 620 perform a sense operation to determine a plurality of sense results in response to the word line voltage changes.

Further, in the third CAM read mode performed for the fourth type of CAM storage scheme, for each set of sense operations for each of the word line groups, the read controller 702 biases a given word line group with a plurality of word line voltages according to a plurality of modified word line bias settings during the plurality of iterations. Each modified word line bias setting maps a word line, or a combination of word lines, to the high voltage level VH that is/are mapped to the low voltage level in an initial or default bias setting that corresponds to the bit patterns of the target keyword portions and/or the inverse target keyword portions. Additionally, the number of word lines that a given modified word line bias setting maps to the high voltage level VH instead of the low voltage level VL is equal to a t-number of bit errors with which a string storing a keyword portion or an inverse keyword portion can have and still be detected as storing a matching keyword, without the detection being a false alarm.

Also, each modified word line bias setting corresponds or is specific to one of the word line groups. In this context, the voltage levels indicated by a modified word line bias setting and that are mapped to the word lines of a particular word line group are modified relative to the voltage levels indicated by the target word line bias setting or the inverse word line bias setting that are also mapped to the word lines of the particular word line group. Accordingly, in the fourth CAM storage scheme shown in FIG. 14, modified word line bias settings for the first word line group WLG1 have voltage levels modified relative to the voltage levels indicated in the target word line bias setting that are also mapped to the word lines of the first word line group WLG1; modified word line bias settings for the second word line group WLG2 have voltage levels modified relative to the voltage levels indicated in the target word line bias setting that are also mapped to the word lines of the second word line group WLG2;

modified word line bias settings for the third word line group WLG3 have voltage levels modified relative to the voltage levels indicated in the inverse target word line bias setting that are also mapped to the word lines of the third word line group WLG3; and modified word line bias settings for the fourth word line group WLG4 have voltage levels modified relative to the voltage levels indicated in the target word line bias setting that are also mapped to the word lines of the fourth word line group WLG4.

Accordingly, for a given CAM read operation, each word line group WLG corresponds to an associated number of modified word line bias settings. That number depends on an associated s-number of word lines coupled to memory cells storing keyword or inverse keyword portions that are biased at the low voltage level VL according to the initial word line bias setting, and the t-number of word lines that a given modified word line bias setting maps to the high voltage level VH instead of the low voltage level VL according to the initial bias setting. Specifically, $$x = \binom{s}{t}.$$

The total number of modified word line bias settings that the read controller 702 uses to perform a CAM read operation in the third CAM read mode for the fourth CAM storage scheme is the sum of the x-number of modified word line bias settings corresponding to the different word line groups WLG.

To illustrate with respect to the example configuration in FIG. 14, one or more modified word line bias settings correspond to the first word line group WLG1, one or more modified word line bias settings correspond to the second word line group WLG2, one or more modified word line bias settings correspond to the third word line group WLG3, and one or more modified word line bias settings correspond go the fourth word line group WLG4. An x1-number of modified word line bias settings corresponds to the first word line group WLG1, and depends on an s1-number of word lines of the first word line group WLG1 biased at the low voltage level VL according to the initial word line bias setting, specifically $$x1 = \binom{s1}{t};$$

an x2-number of modified word line bias settings corresponds to the second word line group WLG2, and depends on an s2-number of word lines of the second word line group WLG2 biased at the low voltage level VL according to the initial word line bias setting, specifically $$x2 = \binom{s2}{t};$$

an x3-number of modified word line bias settings corresponds to the third word line group WLG3, and depends on an s3-number of word lines of the third word line group WLG3 biased at the low voltage level VL according to the initial word line bias setting, specifically $$x3 = \binom{s3}{t};$$

and an x4-number of modified word line bias settings corresponds to the fourth word line group WLG3, and depends on an s4-number of word lines of the fourth word line group WLG4 biased at the low voltage level VL according to the initial word line bias setting, specifically $$x4 = \binom{s4}{t}.$$

Accordingly, the total number of modified word line bias settings that the read controller 702 uses to perform a CAM read operation in the third CAM read mode according to the fourth type of CAM storages scheme is equal to $$x1 + x2 + x3 + x4 = \binom{s1}{t} + \binom{s2}{t} + \binom{s3}{t} + \binom{s4}{t}.$$

The read controller 702 may perform a CAM read operation in the third CAM read mode for the fourth type of CAM storage scheme similar to the way it does for the third type of CAM storage scheme. When performing a CAM read operation in the third CAM read mode over a plurality of iterations, the read controller 702 biases the plurality of word lines according to a different modified word line bias setting during each iteration. Accordingly, during each iteration, the read controller 702 biases the word lines according to a modified word line bias setting that it has not previously used. After the read controller 702 biases the word lines according to each of the modified bias settings, the read controller 702 may determine not to perform any further iterations. Additionally, during each iteration, with the word lines biased at the high and low voltage levels VH, VL according to one of the modified word line bias settings, the plurality of sense circuits 620 may perform a sense operation to determine which of the bit lines conduct. Accordingly, over the course of a CAM read operation, the number of iterations, and in turn the number of sense operations that the plurality of sense circuits 620 performs, is equal to a total number of modified word line bias settings.

Figure 16:
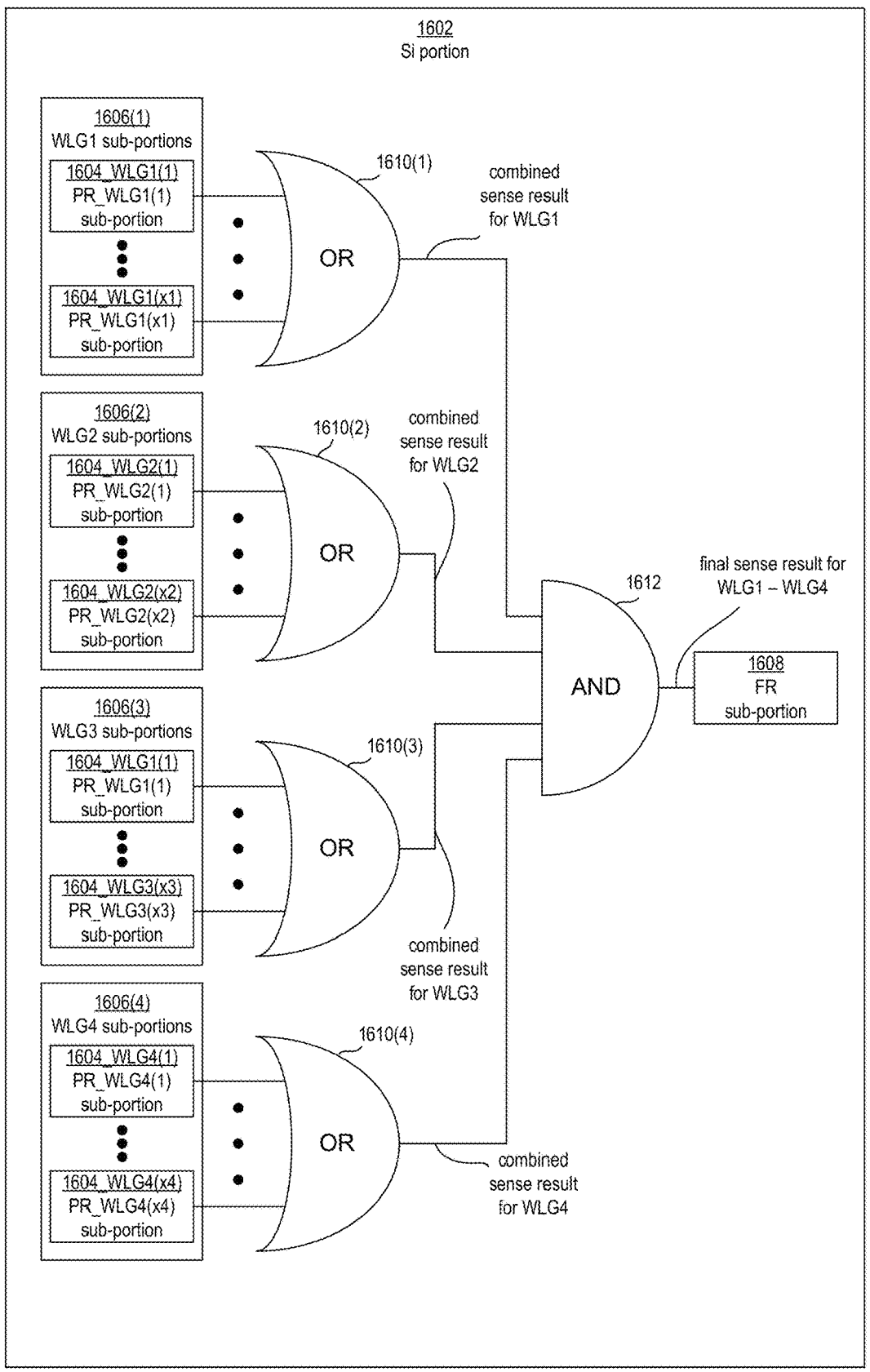
FIG. 16 is a block diagram of an example configuration of a string portion of the sense result storage of FIG. 8 that is configured to store preliminary sense results and determine a final sense result for a string of the block of FIG. 14 that is storing keyword portions according to the fourth type of CAM storage scheme.

FIG. 16 shows a block diagram of an example ith string (Si) portion 1602, which may be representative of an example configuration for an ith string portion 804(i) used to perform CAM read operations in the third CAM read mode for the fourth CAM storage scheme. Although not shown in FIG. 16, the ith string (Si) portion 1602 is coupled to an associated ith sense circuit 620(i) and an associated ith string Si, with the ith string Si storing an ith keyword KWi that includes first and second keyword portions KWi_p1, KWi_p2, and an associated ith inverse keyword KWibar that includes associated first and second inverse keyword portions KWibar_p1, KWibar_p2. In implementation, each of the m-number of string portions 804(1) to 804(m) may have the configuration of the ith string portion 1602 shown in FIG. 16.

The example configuration in FIG. 16 for the fourth CAM storage scheme is similar to the one shown in FIG. 13 for the third type of CAM storage scheme, except that there are more word line group sub-portions and OR logic circuits (and OR logic operations) to correspond to the increased number of word line groups that correspond to the keyword and inverse keyword portions, rather than to keywords and inverse keywords. Accordingly, as shown in FIG. 16 the ith string portion 1602 includes a plurality of preliminary result (PR) sub-portions 1604 organized or arranged into a plurality of word line group WLG sub-portions 1606. Each PR sub-portion 1604 is configured to store a sense result of a sense operation, such as in the form of a single bit having a logic 1 value or a logic 0 value. Also, each of the PR sub-portions 1604 are arranged into one of four word line group sub-portions 1606(1) to 1606(4) corresponding to the four word line groups WLG1 to WLG4 into which the word lines are organized in the example configuration in FIG. 14. For other configurations, the PR sub-portions 1604 may be arranged into other numbers of word line group sub-portions 1606, depending on the number of word line groups and, ultimately, the numbers of keyword and inverse keyword portions.

Further, as with the configuration in FIG. 13, the number of PR sub-portions 1604 of a given ith word line group of sub-portions 1606(*i*) that corresponding to an ith given word line group WLG(i) may be equal to the number of modified word line bias settings that corresponds to the given word line group WLG(i). As shown in FIG. 16, the first word line group of sub-portions 1606(1) includes an x1-number of PR sub-portions 1604_WLG1(1) to **1604_WLG1(*x*1), equal to an x1-number of modified word line bias settings that corresponds to the first word line group WLG1; the second word line group of sub-portions 1606(2) includes an x2-number of PR sub-portions 1604_WLG2(1) to 1604_WLG2(*x*2), equal to an x2-number of modified word line bias settings that corresponds to the second word line group WLG2; the third word line group of sub-portions 1606(3) includes an x3-number of PR sub-portions 1604_WLG1(1) to 1604_WLG1(*x*3), equal to an x3-number of modified word line bias settings that corresponds to the third word line group WLG3; and the fourth word line group of sub-portions 1606(4) includes an x4-number of PR sub-portions 1604_WLG2(1) to 1604_WLG2(*x*4), equal to an x4-number of modified word line bias settings that corresponds to the fourth word line group WLG4. Accordingly, each PR sub-portion 1604** is associated with a respective or different one of the plurality of modified word line bias settings.

Additionally, to perform a CAM read operation in the third CAM read mode for the fourth type of CAM storage scheme over a plurality of iterations, during each iteration, the plurality of sense circuits 620 performs a sense operation with the word lines biased according to a respective one of the modified word line bias settings. In response to performing the sense operation, the sense circuits 620 each store a preliminary sense result in a PR sub-portion 1604 that is associated with the respective one of the modified word line bias settings. Accordingly, the number of sense operations that the plurality of sense circuits 620 performs in a CAM read operation is equal to the total number of modified word line bias settings, and in turn the number of iterations performed in the CAM read operation. Mathematically, the number of sense operations and/or iterations is equal to:

$$\sum_{i=1}^{P} x_i = \sum_{i=1}^{P} \binom{s_i}{t}$$

where $x_i$ is the ith number of modified word line bias settings, sense operations, and/or iterations for a corresponding ith word line group WLGi, $s_i$ is the number of word lines of the ith word line group WLGi biased at the low voltage level VL according to the initial word line bias setting that corresponds to the target keyword and inverse target keyword portions, t is the number of bit errors up to which a set of memory cells of a string storing a keyword portion or an inverse keyword portion can have and the string can still be detected as storing a matching keyword, and P is the number of word line groups.

In addition, as with the configuration in FIG. 13, the read circuit 700 combines the preliminary sense results by performing logic operations, including AND and OR logic operations, in order to generate final sense results that indicate or identify which of the strings are storing a matching keyword. FIG. 16 shows the string portion 1302 including a final result (FR) sub-portion 1608 configured to store a final sense result that indicates whether the ith string Si is storing a matching keyword.

In addition, as with the configuration in FIG. 13, the read circuit 700 is configured to perform an OR operation on the preliminary sense results generated from sense operations performed for the same word line group to generate or determine an associated combined sense result for that word line group. Accordingly, with respect to FIG. 16, a first OR logic circuit 1610(1) is configured to perform an OR operation on the x1-number of preliminary sense results for the first word line group WLG1 to generate a first combined sense result for the first word line group WLG1; a second OR logic circuit 1610(2) is configured to perform an OR operation on the x2-number of preliminary sense results for the second word line group WLG2 to generate a second combined sense result for the second word line group WLG2; a third OR logic circuit 1610(3) is configured to perform an OR operation on the x3-number of preliminary sense results for the third word line group WLG3 to generate a third combined sense result for the third word line group WLG3; and a fourth OR logic circuit 1610(4) is configured to perform an OR operation on the x4-number of preliminary sense results for the fourth word line group WLG4 to generate a fourth combined sense result for the fourth word line group WLG4.

Additionally, like the configuration in FIG. 13, the ith string portion 1602 is shown as including an AND logic circuit 1612 that is configured to perform an AND logic operation on the combined sense results, and generate a final sense result in response to the AND logic operation. The final result (FR) sub-portion 1608 may be configured to store the final sense result generated by the AND logic circuit 1612, such as a bit having a logic 1 value or a logic 0 value, to indicate whether the ith string Si is storing a matching keyword.

During a given iteration of a CAM read operation, when biasing the word lines according to a modified word line bias setting corresponding to a given word line group, the read controller 702 biases a corresponding t-number of word lines that are part of the given word line group at the high voltage level VH that would otherwise be biased at the low voltage level VL if biased according to the initial word line bias setting, as previously described. Consequently, in the event that memory cells of the ith string Si that are coupled to the corresponding t-number of word lines are storing data with up to a t-number of bit errors (e.g., storing data having a logic 0 value instead of a logic 1 value), those memory cells will still be able to conduct since their control gates are biased at the high voltage level VH instead of the low voltage level VL. Also, according to the given modified word line bias setting, the read controller 702 biases word lines that are not part of the given word line group at the high voltage level VH so that memory cells of the ith string Si that are coupled to those word lines will be able to conduct, thereby not affecting or influencing the outcome of the sense operation performed during the given iteration. As a result, if the ith string Si is not storing a matching keyword, but is storing that matching keyword or the inverse matching keyword with up to a t-number of bit errors, the ith string Si (and the ith bit line BLi) will conduct at least once over the x1-number of sense operations performed for the first word line group WLG1, will conduct at least once over the x2-number of sense operations performed for the second word line group WLG2, will conduct at least once over the x3-number of sense operations performed for the third word line group WLG3, and will conduct at least once over the x4-number of sense operations performed for the fourth word line group WLG4, causing the OR logic circuits 1612 to each output their respective combined sense results at a logic 1 value, in turn causing the AND logic circuit 1612 to output the final sense result at a logic 1 value to indicate that the ith string is storing a matching keyword. Alternatively, if the ith string Si is not storing a matching keyword, the ith string Si (and the ith bit line BLi) will not conduct at least once over the x1-number of sense operations performed for the first word line group WLG1, will not conduct at least once over the x2-number of sense operations performed for the second word line group WLG2, will not conduct at least once over the x3-number of sense operations performed for the third word line group WLG3, and/or will not conduct at least once over the x4-number of sense operations performed for the fourth word line group WLG4, causing at least one of the OR logic circuits 1610 to output a respective combined sense result at a logic 0 value, in turn causing the AND logic circuit 1612 to output the final sense result at a logic 0 value to indicate that the ith string Si is not storing a matching keyword.

After performing all of the iterations, the read controller 702 may analyze the final sense results in the sense result storage 802 to determine which of the bit lines and/or strings conducted during the sense operation, such as by determining which of the string portions 804 are storing a logic 1 value and which are storing a logic 0 value. In response to the analysis, the read controller 702 may determine which strings are storing matching keywords, and either send column addresses of those strings back to the controller 102, or based on the column address of those strings, retrieve records associated with those matching keywords without having to first communicate with the controller 102. The memory dies 104 may send the retrieved records to the controller 102, which in turn may send the retrieved records to the host device that sent the target key.

Storing keyword and inverse keyword portions according to the fourth type of CAM storage scheme may be advantageous over storing keywords and inverse keywords according to the third type of CAM storage scheme in that doing so may allow for a reduced or minimized number of sense operations to be performed in a CAM read operation, in turn reducing or minimizing the number of iterations and the overall time duration of the CAM read operation. To elaborate, since the bit length of a keyword portion is smaller than the bit length of a keyword, the likelihood of a set of memory cells storing a keyword portion with a t-number of bit errors is lower than the likelihood of a set of memory cells storing a keyword with the t-number of bit errors. As such, the average number of bit errors per set of memory cells storing a keyword portion or inverse keyword portion is lower than the average number of bit errors per set of memory cells storing a keyword or inverse keyword. Further, as previously explained, the number of sense operations is dependent on the t-number of bit errors up to which a set of memory cells storing a keyword or a keyword portion can have, and correspondingly, the t-number of word lines of a given word line group that are mapped to the high voltage level VH instead of the low voltage level VL for a given modified word line bias setting. Mathematically, the number of sense operations is equal to $$\sum_{i=1}^{P} \binom{s_i}{t},$$

as previously described. In turn, the higher the number t, the more iterations, and the more sense operations that the plurality of sense circuits 620 perform, in a CAM read operation. Since the average number of bit errors per set of memory cells storing a keyword portion or inverse keyword portion is lower than the average number of bit errors per set of memory cells storing a keyword or inverse keyword, the number t can be lower for the fourth type of CAM storage scheme compared to the third type of CAM storage scheme, without increasing the likelihood of nondetections, thereby leading to fewer sense operations performed in a CAM read operation. In optimized fourth type of CAM storage schemes, the numbers of keyword and inverse keyword portions, and the q-number of parity bits generated for keyword and inverse keyword portions, are based on t=1. Correspondingly, the t-number of word lines of a word line group mapped to the high voltage level VH instead of the low voltage level VL in a modified word line bias setting is 1, thereby minimizing the number of sense operations performed in a CAM read operation in the third read mode.

In addition, in various embodiments, the read circuit 700 is configured to operate in a similar manner when operating in the fourth CAM read mode for the fourth type of CAM storage scheme, as it does when operating in the fourth CAM read mode for the third type of CAM storage scheme. As previously described, in the fourth CAM read mode, the read controller 702 perform a CAM read operation over a plurality of loops, where the read circuit 700 operates in the third CAM read mode for each loop, and where for each next loop, the read controller 702 increases or increments the level of the low voltage VL from the level in the prior loop. The read controller 702 may enter a next loop if it determines that a number of matching keywords in a present loop is below a threshold number.

Additionally, in various embodiments, the read circuit 700 is configured to operate in similar manner when operating in the fifth CAM read mode for the fourth type of CAM storage scheme, as it does when operating in the fifth CAM read mode for the third type of CAM storage scheme. In the fifth CAM read mode, the read circuit 700 is configured to perform a CAM read operation over a plurality of iterations. During each iteration, the read controller 702 biases the word lines according to a word line bias setting that corresponds to bit patterns of target keyword portions and inverse target keyword portions, such as in the first and second CAM read modes as previously described. For one of the iterations, the low voltage level at which the read controller 702 biases the first set of word lines is the read pulse level VrA associated with memory state A (or the program state for SLC storage schemes). For another iteration, the low voltage level at which the read controller 702 biases the first set of word lines is a first predetermined amount higher than, or above, the read pulse level VrA. For a third iteration, the low voltage level at which the read controller 702 biases the first set of word lines is a second predetermined amount lower than, or below, the read pulse level VrA. In various embodiments, the magnitudes of the first and second predetermined amounts may be the same as or different from each other.

Additionally, during each iteration, with the word lines biased according to the word line bias setting, the plurality of sense circuits 620 may perform a sense operation and, in response, store sense results for each string. Accordingly, after the plurality of iterations, the plurality of sense circuits 620 store a plurality of sense results for each string. After performing the plurality of iterations, the read controller 702 may perform a plurality of OR logic operations, with each OR logic operation performed on the sense results pertaining to a respective string. The read controller 702 may store the results of the OR logic operations as final sense results for the plurality of strings in the string portions 804. For each string, if the string (and associated bit line) conducts during at least one of the iterations, the read controller 702 may store the final result as a logic 1 value to indicate that the string is storing a matching keyword. Alternatively, if the string (and associated bit line) does not conduct during any of the iterations, the read controller 702 may store the final result as a logic 0 value to indicate that the string is not storing a matching keyword.

Figure 17:
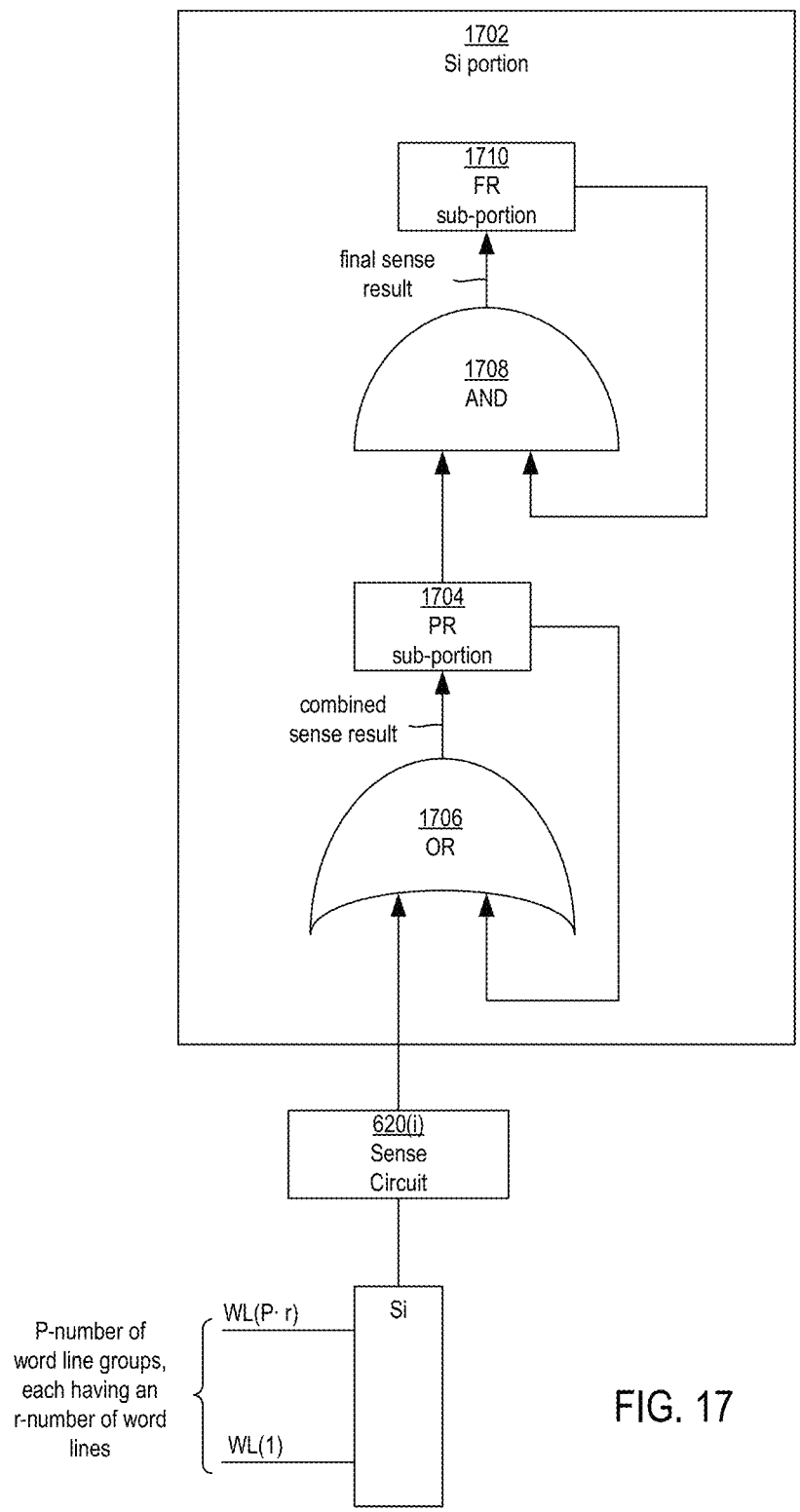
FIG. 17 is a block diagram of another example configuration of the string portion of the sense result storage of FIG. 8 that is configured to store preliminary sense results and determine a final sense result for a string storing keywords according to the third type of CAM storage scheme, or for a string storing keyword portions according to the fourth type of CAM storage scheme.

FIG. 17 shows a block diagram of another example ith string (Si) portion 1702, which may be representative of another example configuration for an ith string portion 804(*i*) used to perform CAM read operations in the third and/or fourth CAM read modes for either the third CAM storage scheme or the fourth CAM storage scheme. The ith string (Si) portion 1702 is coupled to an associated ith sense circuit 620(*i*) and an associated ith string Si. The ith string Si may be configured to store keywords and inverse keywords in accordance with the third CAM storage scheme, or store keyword portions and inverse keyword portions in accordance with the fourth CAM storage scheme. In implementation, each of the m-number of string portions 804(1) to 804(*m*) in FIG. 8 may have the configuration of the ith string portion 1702 shown in FIG. 17.

The ith string portion 1702 may be an alternative configuration to the configurations of the ith string portions 1302 and 1602 shown in FIGS. 13 and 16, respectively. In addition, the ith string portion 1702 may be flexible to operate with any number of word line groups and any numbers of sense operations. That is, the configuration in FIG. 17 may operate with two word line groups corresponding to a keyword KW and an inverse keyword KWbar, or with any number of word line groups corresponding to any number of keyword and inverse keyword portions KW_p, KWbar_p. As shown in FIG. 17, the string Si is coupled to a (P·r)-number of word lines organized into a P-number of word line groups, with each word line group including an r-number of word lines.

Additionally, the ith string portion 1702 generally includes fewer circuit components compared to the string portions 1302, 1602. That is, rather than include an xj-number of preliminary sense result (PR) storage sub-portions for each word line group, the ith string portion 1702 includes a single storage sub-portion 1704 that is configured to store a single preliminary sense result. Also, rather than include a P-number of OR logic circuits, the ith string portion 1702 includes a single OR logic circuit 1706. Similar to the other configurations, the OR logic circuit 1706 is configured to perform an OR logic operation to generate a combined sense result, and store the combined sense result in the PR sub-portion 1704.

In further detail, the OR logic circuit 1706 performs an OR logic operation on a sense result of a sense operation determined from the ith sense circuit 620(*i*) and the combined sense result stored in the PR sub-portion 1704. That is, the ith string portion 1702 uses a combined sense result from a last OR operation as feedback for performance of a current OR operation. Accordingly, for a current OR logic operation, the OR logic circuit 1706 uses as inputs a sense result of a current sense operation and a last combined sense result determined from a last OR logic operation.

In addition, similar to the string portions 1302, 1602, the ith string portion 1702 includes an AND logic circuit 1708 that is configured to perform an AND logic operation to generate a final sense result indicating whether the ith string Si is storing a matching keyword. The ith string portion 1702 further includes a final sense result (FR) sub-portion 1710 that is configured to store the final sense result determined by the AND logic circuit 1708.

To perform a CAM read operation in accordance with the string portion 1702, the read controller 702 cycles through a plurality of sets of sense operations. Each set of sense operations corresponds to one of the word line groups. The number of sense operations of a set is equal to the number of modified word line bias settings that corresponds to the word line bias group to which the set corresponds.

The AND logic circuit 1708 performs an AND logic operation to update the final sense result at the end of each set. That is, at the end of a given set, the AND logic circuit 1708 performs an AND logic operation on the logic value of the combined sense result determined at the end of the given set and the logic value of the final sense result determined at the end of the last set of sense operations. Accordingly, the ith string portion 1702 uses a final sense result from a last AND operation as feedback for performance of a current AND operation. Accordingly, for a current AND logic operation, the AND logic circuit 1708 uses as inputs a combined sense result determined at the end of a current set of sense operations, and a last final sense result determined from a last AND logic operation.

In further detail, to perform a CAM read operation, the read controller 702 may perform the sets of sense operations one at a time, transitioning to a next set after it has performed all of the sense operations of a current set. Within a given set corresponding to a given kth word line group WLGk, the read controller 702 and the ith sense circuit 620(*i*) cycle or iterate through an xk-number of sense operations equal to the xk-number of modified word line bias settings that corresponds to the given kth word line group WLGk. The read controller 702 biases the word lines according to a different one of the xk-number of modified bias settings during each sense operation performed in the given set. After the read controller 702 and the ith sense circuit 620(*i*) perform a last sense operation of the given set, the read controller 702 transitions to a next set that corresponds to another word line group.

Additionally, at the start of a CAM read operation, the read controller 702 may initialize the FR sub-portion 1710 to store a logic 1 bit to indicate that the ith string Si is storing a matching keyword. Then, while iterating through the sets of sense operations, if the ith bit line BLi conducts at least once for each of the sets, the FR sub-portion 1710 will maintain storing a logic 1 value as a result of the AND logic operations performed by the AND logic circuit 1708. Alternatively, if the ith bit line BLi does not conduct at least once for at least one of the sets, then the FR sub-portion 1710 will change to storing a logic 0 value by the end of the CAM read operation to indicate that the ith string Si is not storing a matching keyword.

Also, at the start of each set of sense operations, the read controller 702 initializes the PR sub-portion 1704 to store a logic 0 bit to indicate that the ith bit line BLi has not conducted at least once during performance of the set of sense operations. During a given set, if the ith bit line BLi does not conduct at least once, then the PR sub-portion 1704 will maintain storing a logic 0 bit by the end of the given set. Alternatively, if the ith bit line BLi conducts at least once during the given set, then the PR sub-portion 1704 will change to storing a logic 1 bit by the end of the given set. After the read controller 702 performs a last sense operation of the given set (i.e., at the end of the given set), the read controller 702 controls the AND logic circuit 1708 to perform an AND logic operation on a current logic value of the bit stored in the PR sub-portion 1704 and a current logic value of the bit stored in the FR sub-portion 1710 to update the value of the final sense result stored in the FR sub-portion 1710. During the given set, if the ith bit line BLi conducted at least once, then the PR sub-portion 1704 stores a logic 1 bit at the end of the given set, which the AND logic circuit 1708 will AND with the logic value of the final sense result determined at the end of a last set of sense operations. Since the read controller 702 initializes the FR sub-portion to a logic 1, the FR sub-portion 1710 will store a logic 1 value at the end of the last set of sense operations to indicate that the ith string Si is storing a matching keyword, as long as the ith bit line BLi conducts at least once during each of the sets of sense operations. Alternatively, if the ith bit line BLi does not conduct during any sense operation of at least one of the sets, then the PR sub-portion 1704 stores a logic 0 bit at the end of those sets, causing the FR sub-portion 1710 to store the final sense result as a logic 0 value at the end of the last set, which indicates that the ith string Si is not storing a matching keyword.

Additionally, in various embodiments of the third type of CAM storage scheme and/or the fourth type of CAM storage scheme, the read controller 702 is configured to perform some or all of the first, second, third, fourth, or fifth CAM read modes. In particular embodiments, the read controller 702 may begin by performing a CAM read operation in the first CAM read mode. At the end of the sense operation performed while operating in the first CAM read mode, the read controller 702 may determine whether the sense operation triggered a triggering event. If it did not, then the read controller 702 may end the CAM read operation by sending any matching keywords (or indicated addresses) to the controller 102, and/or retrieving records associated with the matching keywords and sending the records to the controller 102. However, if it did, then the read controller 702 may transition to one of the other second through fifth CAM read mode, and perform one or more iterations in the other CAM read mode to which it transitioned. In some example configurations, the read controller 702 may directly transition from the first CAM read mode to the third CAM read mode or the fourth CAM read mode. In other example configurations, the read controller 702 may transition first to the second CAM read mode and/or the fifth CAM read mode. Upon completing the second CAM read mode and/or the fifth CAM read mode, the read controller 702 may determine whether another triggering event occurred. If it did not, then the read controller 702 may end the CAM read operation. If it did, then the read controller 702 may transition to the third CAM read mode or the fourth CAM read mode and iterate through a plurality of sense operations in the third CAM read mode or the fourth CAM read mode.

For at least some example configurations, the triggering event is a predetermined number of matching keys. After performing a sense operation in the first CAM read mode, the sense controller 702 may determine a number of matching keys (e.g., by determining a number of strings storing matching keywords and/or by determining how many string portions 804 are storing a logic 1 value). The number of matching keys being below the predetermined number is a triggering event that triggers the read controller 702 to transition to another CAM read mode. In this context, the second through fifth CAM read modes function as enhanced detection modes that are available to the read controller 702 in order to minimize the number of nondetections.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
a controller configured to:
generate a keyword for a key to be stored in a memory array according to a content addressable memory (CAM) storage scheme, the keyword comprising a plurality of information bits of the key and a plurality of parity bits determined from the plurality of information bits;
generate an inverse keyword based on the keyword;
program the keyword and the inverse keyword according to the CAM storage scheme; and
program a plurality of keywords into the memory array, wherein any two different keywords of the plurality of keywords has a minimum distance of 2*t+1, wherein t is a maximum number of bit errors with which the memory array stores each of the two different keywords.

2. A circuit comprising:
a controller configured to:
generate a keyword for a key to be stored in a memory array according to a content addressable memory (CAM) storage scheme, the keyword comprising a plurality of information bits of the key and a plurality of parity bits determined from the plurality of information bits;
generate an inverse keyword based on the keyword;
program the keyword and the inverse keyword according to the CAM storage scheme;
bias a plurality of word lines coupled to the memory array according to a plurality of modified word line bias settings, each modified from an initial word line bias setting that corresponds to a target keyword or an inverse target keyword and based on a bit error number associated with storage of the keyword; and
determine that the keyword matches the target keyword in response to the bias;
a sense circuit configured to determine a plurality of sense results of a plurality of sense operations for a set of memory cells coupled to the plurality of word lines during the bias of the plurality of word lines according to the plurality of modified bias settings; and OR logic circuitry configured to perform an OR logic operation generate a combined sense result based on the plurality of sense results, wherein the controller is configured to determine that the keyword matches a target keyword based on the combined sense result;

wherein the plurality of word lines comprises a first plurality of word lines, the plurality of modified bias settings comprises a first plurality of modified bias settings, the plurality of sense results comprises a first plurality of sense results, the plurality of sense operations for the set of memory cells comprises a first plurality of sense operations for a first set of memory cells storing at least a portion of the keyword, the OR logic operation comprises a first OR logic operation, and the combined sense result comprises a first combined sense result, wherein the sense circuit is further configured to determine a second plurality of sense results of a second plurality of sense operations for a second set of memory cells storing at least a portion of the inverse keyword, wherein the OR logic circuitry is configured to perform a second OR logic operation to generate a second combined sense result based on the second plurality of sense results, wherein the circuit further comprises AND logic circuitry configured to perform an AND logic operation on the first combined sense result and the second combined sense result to generate a final sense result, and wherein the controller is configured to determine that the keyword matches the target keyword further based on the final sense result.

3. The circuit of claim 2, wherein the controller is configured to bias a word line of the plurality of word lines at a low voltage level according to the initial word line bias setting, and is configured to bias the word line at the high voltage level according to a modified word line bias setting.

4. A circuit comprising:
a controller configured to:
generate a keyword for a key to be stored in a memory array according to a content addressable memory (CAM) storage scheme, the keyword comprising a plurality of information bits of the key and a plurality of parity bits determined from the plurality of information bits;
generate an inverse keyword based on the keyword;
program the keyword and the inverse keyword according to the CAM storage scheme, wherein the keyword comprises a plurality of keyword portions, and wherein the controller, in order to generate the plurality of keyword portions, is configured to:
divide the key into a plurality of key portions; and
generate a respective set of parity bits for each of the key portions; and
program a plurality of keywords into the memory array, wherein each of the plurality of keywords comprises an associated plurality of keyword portions,
wherein any two different keyword portions has a minimum distance of 2*t+1, wherein t is a maximum number of bit errors with which the memory array stores each of the two different keyword portions.

5. The circuit of claim 4, wherein the controller, in order to generate the inverse keyword, is configured to generate a respective inverse keyword portion for each of the keyword portions.

* * * * *